United States Patent
Miida

(10) Patent No.: US 6,944,062 B2
(45) Date of Patent: Sep. 13, 2005

(54) TRANSISTOR AND SEMICONDUCTOR MEMORY USING THE SAME

(75) Inventor: Takashi Miida, Kanagawa (JP)

(73) Assignee: Innotech Corporation, Kanagawa (JP)

(*) Notice: Subject to any disclaimer, the term of this patent is extended or adjusted under 35 U.S.C. 154(b) by 0 days.

(21) Appl. No.: 10/831,333

(22) Filed: Apr. 26, 2004

(65) Prior Publication Data

US 2004/0196685 A1 Oct. 7, 2004

Related U.S. Application Data

(63) Continuation of application No. PCT/JP02/12105, filed on Nov. 20, 2002.

(30) Foreign Application Priority Data

Nov. 22, 2001 (JP) ........................................ 2001-358308
Jun. 11, 2002 (JP) ........................................ 2002-169749
Nov. 6, 2002 (JP) ........................................ 2002-322905

(51) Int. Cl.[7] ............................................. G11C 16/04
(52) U.S. Cl. .............................. 365/185.29; 365/185.3; 257/321; 438/257
(58) Field of Search ......................... 365/185.29, 185.3, 365/185.33; 257/321, 316, 324; 438/257

(56) References Cited

U.S. PATENT DOCUMENTS

| | | | |
|---|---|---|---|
| 5,379,255 A | 1/1995 | Shah | |
| 5,508,544 A | 4/1996 | Shah | |
| 6,238,976 B1 * | 5/2001 | Noble et al. | 438/259 |
| 6,335,554 B1 | 1/2002 | Yoshikawa | |
| 6,534,816 B1 * | 3/2003 | Caywood | 257/314 |
| 6,538,925 B2 | 3/2003 | Miida | |
| 6,861,315 B1 | 3/2005 | Chen et al. | |
| 2002/0014666 A1 | 2/2002 | Ohmi et al. | |
| 2003/0080356 A1 | 5/2003 | Miida | |
| 2003/0095441 A1 | 5/2003 | Miida | |

FOREIGN PATENT DOCUMENTS

| | | |
|---|---|---|
| JP | 2000-82752 A | 3/2000 |
| JP | 3283872 B1 | 3/2001 |
| JP | 2001-160555 A | 6/2001 |
| JP | 3249811 B1 | 11/2001 |
| JP | 3249812 B1 | 11/2001 |
| WO | WO 03/044869 A1 | 5/2003 |

OTHER PUBLICATIONS

Paper No. 29p–YC4, the 48th Joint Meeting of Engineering of Applied Physics of Japan. p88.

* cited by examiner

Primary Examiner—Anh Phung
Assistant Examiner—Toan Le
(74) Attorney, Agent, or Firm—Birch, Stewart, Kolasch & Birch, LLP

(57) ABSTRACT

A transistor includes p-type semiconductor (12) including a projection (13a) having a pair of side walls (13b, 13b) facing each other, a gate insulation layer (15c), a pair of n-type source/drain regions (BL1, BL2), tunnel insulation layers (15a), a pair of floating gates (FG1, FG2), inter-polycrystalline insulation layers, and a control gate (CG). The root portion of the projection (13A), which virtually connects the source/drain regions (BL1, BL2) with a straight line, is higher in the concentration of the p-type impurity than the other portion. A delete voltage for deleting charges stored in the floating gate (FG) is applied between the control gate (CG) and the source/drain region (BL1, BL2), so that a delete current flows toward the control gate (CG) or the source/drain region (BL1, BL2), the charges stored being deleted.

21 Claims, 40 Drawing Sheets

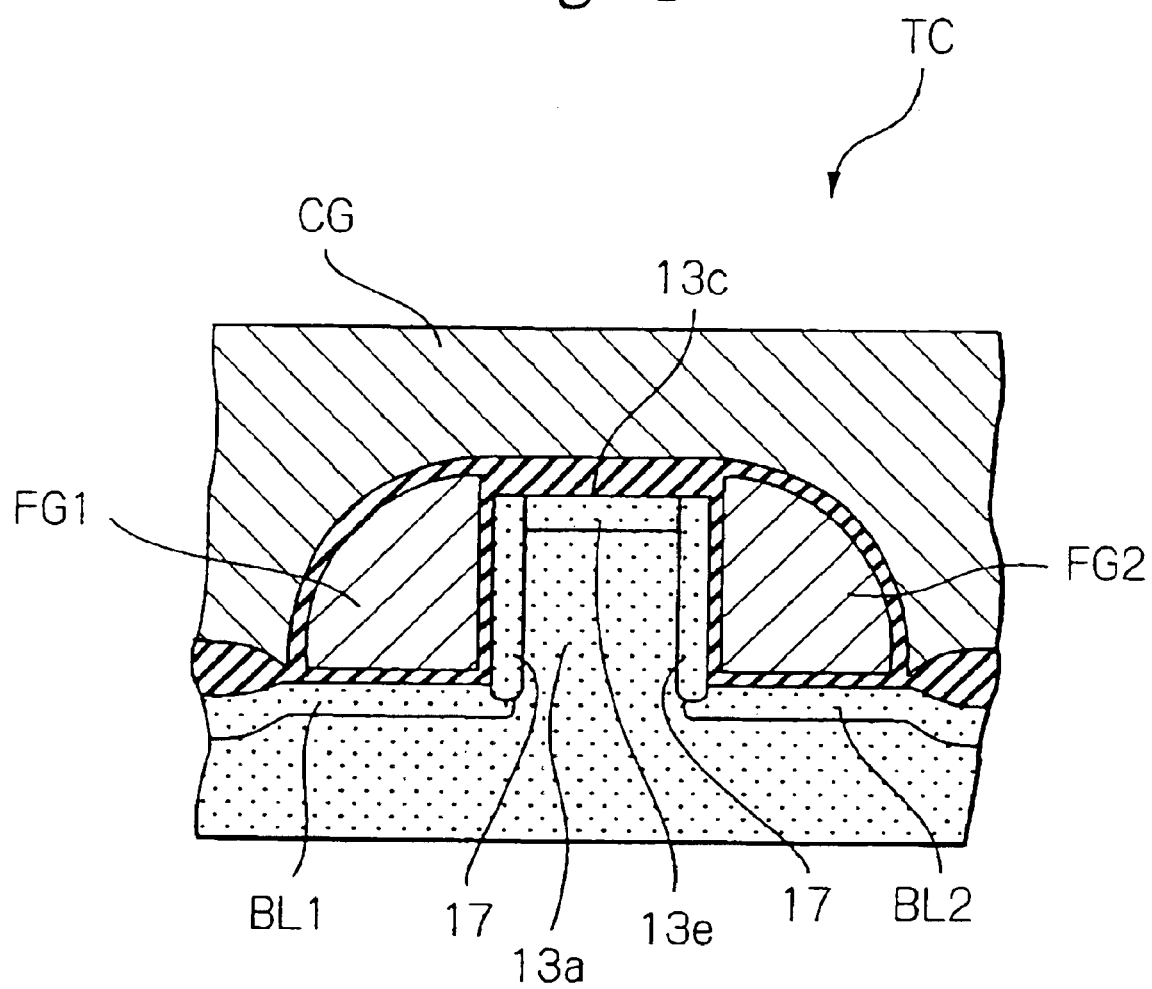

TRANSISTOR AND SEMICONDUCTOR MEMORY USING THE SAME

This is a Continuation application of PCT/JP02/12105 filed Nov. 20, 2002.

FIELD OF THE ART

The present invention relates to a multiple-bit transistor, a semiconductor memory using the same, and a method of driving a multiple-bit transistor. More particularly, the present invention relates to a technology useful for implementing a multiple-bit semiconductor memory.

BACKGROUND ART

Today, nonvolatile memories including EEPROMs (Electrically Erasable Programmable Read Only Memories) are extensively used for, e.g., portable telephones. An EEPROM usually allows only one bit of information to be written to each storage cell transistor. However, to promote size reduction of the device, there should preferably be implemented the multiple-bit configuration of a cell transistor that allows two or more bits of information to be written to the cell transistor.

FIG. 26 of the drawings is a section showing a prior art cell transistor with a multiple-bit configuration. This multiple-bit configuration is taught in U.S. Pat. No. 6,011,725 specifically.

As shown in FIG. 26, the cell transistor, generally 1, has a so-called MONOS (Metal Oxide Nitride Oxide Semiconductor) structure made up of a control gate (metal) 7, a silicon oxide layer (oxide) 6, a silicon nitride layer (nitride) 5, a silicon oxide layer (oxide) 4, and a p-type silicon substrate (semiconductor) 2.

In the cell transistor 1, n-type source/drain regions 3 and 8 each selectively become a source or a drain at various stages of a write-in or a read-out sequence. Stated another way, it is indefinite which of the source/drain regions 3 and 8 functions as a source region or a drain region. In the following description, one of the source/drain regions 3 and 8 that discharges an electric carrier, which may be electrons in this specific case, and the other region will be referred to as a source and a drain region, respectively.

FIG. 27A demonstrates how data is written to the storage cell transistor 1. As shown, the source region 8 is grounded while suitable positive voltages $V_{D1}$ and $V_{G1}$ are applied to the drain region 3 and control gate 7, respectively.

In the above condition, an electric field is established between the source region 8 and the drain region 3 and accelerates electrons, so that hot electrons are generated in the vicinity of the drain region 3. The hot electrons thus generated are injected into the silicon nitride layer 5 over the energy barrier of the silicon oxide layer 4 due to collision thereof against phonons and the positive potential of the control gate electrode 7. Because the silicon nitride layer 5 is not conductive, the hot electrons injected into the silicon nitride layer 5 localize in the vicinity of the drain region 3 (referred to as a right bit 208 hereinafter). This condition is representative of a stored-bit state "(1, 0)".

FIG. 27B shows a condition wherein the source voltage and drain voltage of FIG. 27A are replaced with each other. As shown, the hot electrons injected into the silicon nitride layer 5 localize in the vicinity of the drain region 8 (referred to as a left bit 206 hereinafter). This sets up a storage state (0 1).

FIGS. 28 A through 28 D show four different logical states available with the cell transistor 1 . In a "(1, 1)" state (see FIG. 28 A), electrons are not stored in either one of the right and left bit positions. In a "(0, 0)" state (see FIG. 28D), electrons are stored in both of the right and left bit positions. In this manner, the cell transistor 1 allows two-bit data to be stored therein. However, this data writing sequence is undesirable because the hot electrons cannot be injected into the silicon nitride layer 5 unless the voltage $V_{G1}$ applied to the control gate 7 is high.

More specifically, for the injection of hot electrons, it is necessary to tunnel hot electrons from the conduction band of the silicon substrate 2 to the conduction band of the silicon oxide layer 4. An energy difference between the above two conduction bands is about 3.2 eV.

However, the hot electrons lose energy on colliding against phonons present in the silicon substrate 2 and cannot be tunneled between the two conduction bands mentioned above even if a voltage of 3.2 V is applied to the control gate 7. In practice, therefore, the voltage $V_{G1}$ applied to the control gate 7 must be as high as 12 V to 13 V.

While the above high voltage is expected to be applied to the control gate 7 from a highly voltage-resistant transistor included in a decoder circuit (not shown), such a transistor cannot be miniaturized because miniaturization would cause punch-through to occur between the source and the drain of the transistor. It is therefore impossible with the prior art structure described above to reduce the chip size of the entire EEPROM including the decoder circuit.

On the other hand, to read out the data from the cell transistor 1, the voltages applied to the source region 8 and drain region 3 are replaced with each other to measure a drain current while each drain current measured is compared with a reference current value.

In the state "(0, 0)" (see FIG. 28d), electrons localize at both of the right and left bit positions, so that the potential of the silicon nitride layer 5 is lowest among the four states. Consequently, the threshold voltage of the cell transistor 1 becomes highest and causes substantially no drain current to flow. The value of the drain current remains the same even when the voltages applied to the source/drain regions 3 and 8 are replaced, and is almost zero. As a result, the two drain currents measured both are determined to be smaller than the reference current.

In the state "(1, 1)" (see FIG. 28A), electrons are absent at both of the right and left bit positions, so that the potential of the silicon nitride layer 5 is highest among the four states. Consequently, the threshold voltage of the cell transistor 1 becomes lowest among the four states, causing the greatest drain current to flow. The value of the drain current remains the same even when the voltages applied to the source/drain regions 3 and 8 are replaced, and is greatest among the four states. More specifically, the two drain currents measured both are determined to be greater than the reference current.

On the other hand, in the states "(1, 0)" and "(0, 1)" (see FIGS. 28B and 28C, respectively), electrons localize at only one of the right and left bit positions, making the cell transistor 1 asymmetrical in the right-and-left direction. Therefore, the drain currents measured are different from each other when the voltages applied to the source/drain regions 3 and 8 are replaced. It is therefore possible to distinguish the states "(1, 0)" and "(0, 1)" by determining which of the two drain currents is greater (or smaller) than the reference current.

The data reading sequence described above has a drawback that a current window is smaller when the state "(1, 0)" or the state "(0, 1)" is sensed. The current window refers to a difference between the two drain currents measured by replacing the voltages applied to the source/drain regions 3 and 8 in the event of sensing the states (1, 0) and (0, 1).

The current window definitely opens when electrons distinctly localize at the right (or the left) end of the silicon nitride layer 5, i.e., when the cell transistor 1 is clearly asymmetrical.

Asymmetry, however, does not clearly appear in the cell transistor 1 because electrons are distributed in the silicon nitride layer 5 over some breadth. Particularly, when a gate length L (see FIG. 27A) is reduced for reducing the cell size, it is not clear at which of the right and left bit positions electrons localize, further reducing the asymmetry of the cell transistor 1 and therefore the current window. Such a small current window reduces the margins of the drain and reference currents and thereby aggravates incorrect identification of written data.

Another problem with the conventional transistor 1 is that resistance to inter-band tunneling is low, as will be described hereinafter with reference to FIG. 29. FIG. 29 shows a condition wherein the cell transistor 1 is not selected. As shown, to make the cell transistor 1 unselected, a ground potential lower than the potential assigned to read-out is applied to the control gate 7. On the other hand, the positive potential $V_{D1}$ is applied to the drain of a cell transistor selected. Because the positive potential $V_{D1}$ is common to all of the cells in the direction of column of the memory device, it is applied to the drain region 3 of the cell transistor 1 as well.

In the condition shown in FIG. 29, a potential difference $\Delta V$ between the silicon nitride layer 5 and the drain region 3 is greater than in the case of read-out because the potential of the control gate 7 is lowered. Particularly, when electrons localize in the silicon nitride layer 5, the potential difference $\Delta V$ further increases because the electrons lower the potential of the silicon nitride layer 5. If the potential difference $\Delta V$ is great, then a tunnel current flows between the drain region 3 and the silicon nitride layer 5 and causes the silicon oxide layer 4 to deteriorate.

Moreover, a great potential difference $\Delta V$ produces a strong electric field at the edge of the drain region 3, so that breakdown is apt to occur at the PN junction of the drain region 3 and silicon substrate 2. The breakdown causes hot holes and electrons to appear in pairs, as shown in an enlarged view in a circle. The hot holes are attracted toward the lower potential side (silicon nitride layer 5 side) and therefore passed through the silicon oxide layer 4, deteriorating the layer 4. The low resistance to inter-band tunneling mentioned earlier refers to the circumstances described above.

The present invention is made to solve the problem described above, and it is an object of the present invention to provide a multiple-bit transistor operable with a lower write voltage and a wider current window than the conventional multiple-bit transistor, a semiconductor memory using the same and capable of deleting a charge stored in a floating gate, and a method of driving a multiple-bit transistor.

An EEPROM or similar nonvolatile memory has still another problem left unsolved, as will be described hereinafter. An EEPROM is extensively used for, e.g., a portable telephone. Generally, what is most important to a memory is a low cost for a single bit and therefore a simple memory cell structure.

On the other hand, a matter of primary concern with a memory of the kind described is increasing writing speed. For example, a system that allows the user of a portable telephone to download pieces of music at a convenience store or similar retail store is attracting attention. In such a case, it is desirable for the user to be able to download music data corresponding to a single CD (Compact Disk) within several seconds.

Reducing a write current is considered to be one of possible implementations for increasing writing speed. More specifically, a decrease in write current allows data to be written to a plurality bits of storage cells in parallel for thereby increasing writing speed.

A technology for reducing a write current is disclosed in, e.g., T. Kobayashi et al. "A Giga-Scale Assist-Gate (AG)-AND-Type Flash Memory Cell with 20-MB/s Programming Throughput for Content-Downloading Applications", International ELECTRON DEVICES Meeting (IEDM) 2001, Washington, D.C., December 2–5, pp. 0.2.2.1–0.2.2.4. The memory cell taught in this document includes a floating gate positioned above the channel region of a MOS semiconductor and a control gate positioned above the floating gate. Part of the floating gate above the channel region is replaced with an auxiliary gate. The auxiliary gate serves to control the storage (writing) of a charge in the floating gate for thereby reducing a write current.

However, the technology taught in the above document is not practicable without resorting to the auxiliary gate, resulting in a sophisticated memory cell structure.

It is another object of the present invention to provide a transistor capable of solving the problem described above by increasing writing speed with a simple structure.

DISCLOSURE OF THE INVENTION

In order to achieve the above objects, in accordance with the present invention, a transistor includes a one-conductivity type semiconductor substrate formed with a projection having a pair of side walls facing each other, a first insulation layer formed on the top of the projection, a pair of counter-conductivity type source/drain regions formed on the surface of the semiconductor substrate at opposite sides of the projection, second insulation layers each covering one of the side walls and one of the source/drain regions, a pair of floating gates respectively formed on the two side walls and facing the side walls and source/drain regions via respective second insulation layers, third insulation layers each being formed on one of the floating gates, and a control gate facing the floating gates via the third insulation layers and facing the top of the projection via the first insulation layer. The second insulation layers and third insulation layers each are configured to have larger capacitance than the first insulation layer. A delete voltage for deleting charges stored in the floating gates is applied between the control gate and source/drain regions to thereby cause a delete current to flow toward the control gate or the source/drain regions, the charges stored being deleted.

Also, in accordance with the present invention, a transistor includes a one-conductivity type semiconductor substrate formed with a projection having a pair of side walls facing each other, a first insulation layer formed on the top of the projection, a pair of counter-conductivity type source/drain regions formed on the surface of the semiconductor substrate at opposite sides of the projection, second insulation layers each covering one of the side walls and one of the source/drain regions, a pair of floating gates respectively formed on the two side walls and facing the side walls and source/drain regions via respective second insulation layers, third insulation layers each being formed on one of the floating gates, and a control gate facing the floating gates via the third insulation layers and facing the top of the projection via the first insulation layer. The control gate, facing the top of the projection, controls the ON/OFF state of a channel region that faces the control gate. A delete voltage for overdeleting charges stored in the floating gates is applied between the control gate and the source/drain regions to thereby overdelete the charges such that the charges decrease substantially to less than or equal to zero.

Further, in accordance with the present invention, a transistor includes a pair of source/drain regions of counter-conductivity type formed in the surface layer of a semiconductor substrate of one conductivity type, a floating gate and a control gate. The floating gate is capable of storing data by storing charges therein and faces only part of a channel region that intervenes between the two source/drain regions. A delete voltage for deleting the charges stored in the floating gate is applied between the control gate and the source/drain regions to thereby effect overdeletion such that the charges decrease to substantially less than or equal to zero.

The present invention pays attention to the fact that when a transistor has a floating gate positioned only in part of a channel region between two opposite conductivity regions, overdeletion can be effected and improves writing efficiency. Deleting means applies a delete voltage to at least the control gate to thereby overdelete charges stored in the floating gate. When usual writing is executed thereafter, a small write current suffices because of the improved writing efficiency.

Overdeletion refers to a condition wherein electrons stored in the floating gate are drawn out to such a degree that the number of electrons remaining in the floating gate is less than or equal to zero. In this condition, the threshold voltage of a memory cell is about 0 V or below. The number of electrons less than zero means that positive charges (holes) are stored in the floating gate.

Why overdeletion improves writing efficiency is that it raises the voltage of the floating gate and thereby increases a potential difference between the floating gate and the channel region.

After overdeletion, a writing operation or a reading operation may be executed with the floating gates.

The delete voltage should preferably be continuously applied to the control gate for a preselected period of time, thereby to effect the overdeletion.

The charges stored in the floating gates may be deleted by a Fowler-Nordheim current and may be overdeleted until the value of the Fowler-Nordheim current decreases below a preselected value.

Preferably a charge injecting operation is effected for injecting charges into at least one of the floating gates to be deleted that does not store data.

Charge injection is effected in consideration of the following. When overdeletion is repeated without charge injection with a floating gate in a logical "1" state, i.e., storing no data (non-written floating gate hereinafter), charges (e.g. electrons) are repeatedly, forcibly drawn out of the non-written floating gate. As a result, the non-written floating gate remaining stable in the overdeleted or saturation condition is brought to an electron depletion condition over the saturation condition (referred to as an excessive deletion condition), so that the threshold voltage, for example, is apt to vary.

When overdeletion is effected a number of times, charge injection preceding overdeletion obviates an occurrence that only the removal of charges is repeated with the non-written floating gate storing no data, compared to the case wherein charge injection is not effected.

To write data in the floating gates, a second write voltage close to minimum one of writable write voltage values may be used.

In accordance with the present invention, the writing efficiency is superior to one available with conventional technologies because of overdeletion and becomes maximum when the minimum one of writable write voltage values is used. Therefore, by writing data with the minimum voltage value, it is possible to minimize the write current and therefore to write data in a number of memory cells at the same time. Consequently, the present invention increases effective writing speed.

A plurality of transistors each having any one of the configurations described above may be arranged in a plurality of arrays in each of the direction of column and the direction of row, constituting a semiconductor memory.

Preferably, the transistors adjoining each other in the direction of column share the source/drain regions while the cell transistors adjoining each other in the direction of row share the control gate and share the source/drain regions between the cell transistors.

Moreover, in accordance with the present invention, a method is provide for driving a transistor including a one-conductivity type semiconductor substrate formed with a projection having a pair of side walls facing each other, a first insulation layer formed on the top of the projection, a pair of counter-conductivity type source/drain regions formed on the surface of the semiconductor substrate at opposite sides of the projection, second insulation layers each covering one of the side walls and one of the source/drain regions, a pair of floating gates respectively formed on the side walls and facing the side walls and source/drain regions via respective second insulation layers, third insulation layers each being formed on one of the floating gates, and a control gate facing the floating gates via the third insulation layers and facing the top of the projection via the first insulation layer. The second insulation layers and third insulation layers each are configured to have larger capacitance than the first insulation layer. The method includes the step of applying a delete voltage for deleting charges stored in the floating gates between the control gate and the source/drain regions to thereby cause a delete current to flow toward the control gate or the source/drain regions, the charges stored being deleted.

BRIEF DESCRIPTION OF THE DRAWINGS

FIG. 5 is a section showing the cell transistor provided with a high-resistance region on the top of a projection in the cell transistor included in the semiconductor memory embodying the present invention;

BEST MODE OF PRACTICING THE INVENTION

A preferred embodiment of the present invention will be described with reference to the accompanying drawings hereinafter.

(Device Structure)

Figure 1:
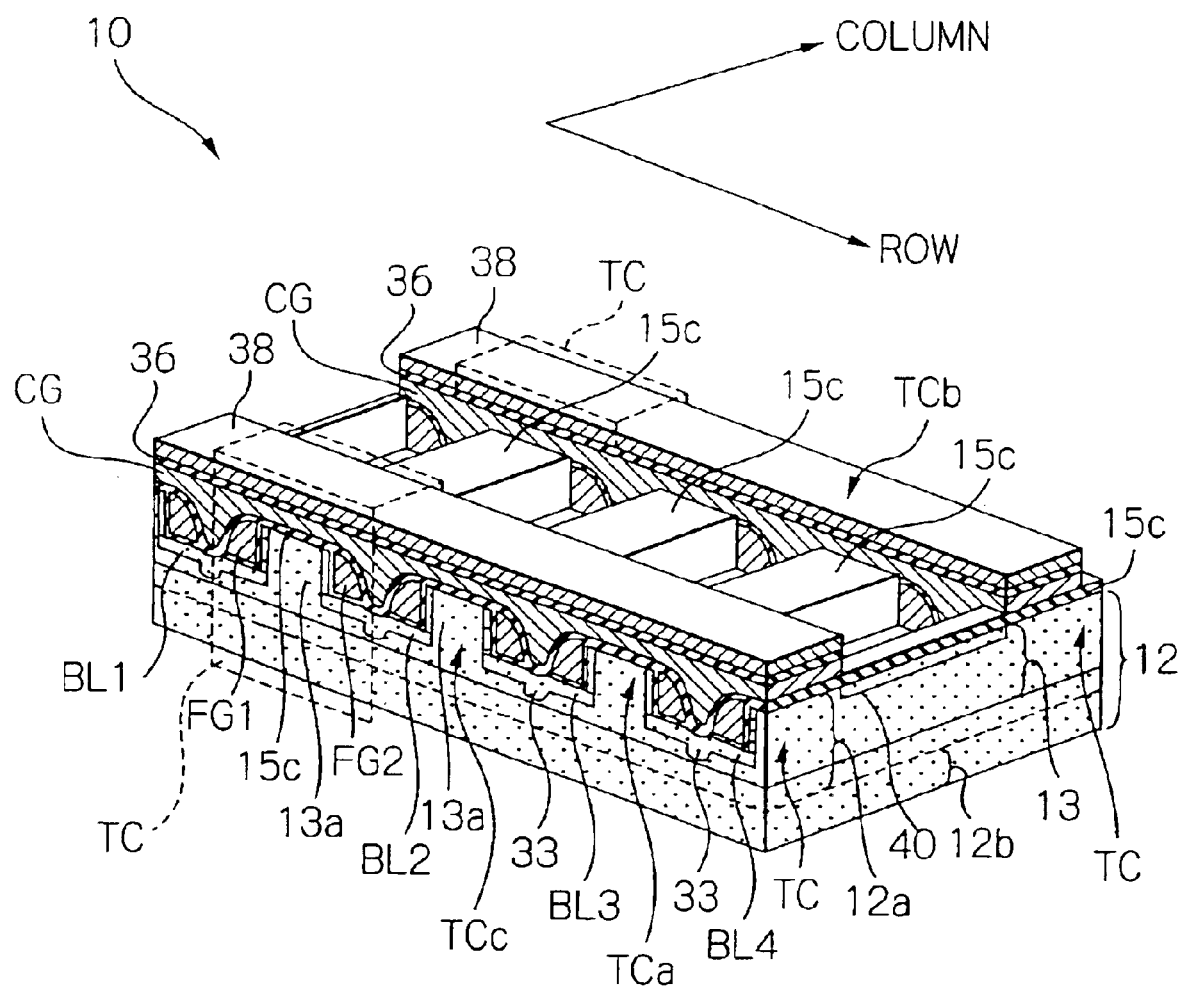
FIG. 1 is a fragmentary perspective view of a semiconductor memory embodying the present invention.

FIG. 1 is a partly taken away section of a semiconductor memory embodying the present invention. As shown, the semiconductor memory, generally 10, is formed on a p-type silicon substrate 12, which is a one-conductivity type semiconductor substrate. The p-type silicon substrate 12 is made up of a $p^+$ substrate 12$b$ and a p-type epitaxial layer 12$a$ formed on one major surface of the $p^+$ substrate 12$b$. A p-type well 13 is formed in the p-type epitaxial layer 12$a$.

A plurality of projections or ridges 13$a$, which are unique to the present invention, protrude from the major surface of the p-type silicon substrate 12. Bit lines BL1 through BL4 are formed on the surface of the p-type well 13 at both sides of the projections 13$a$. More specifically, ions of an n-type impurity, opposite in conductivity type to the p-type well 13, are implanted in the surface of the p-type well 13 at positions expected to form the bit lines BL1 through BL4. The bit lines BL1 through BL4 are arranged side by side in the direction of row of a memory cell array while extending in the direction of column each, although hidden by the other structural members and not clearly visible in the figure.

Floating gates FG1 and FG2 and a control gate CG are formed of polycrystalline silicon. More specifically, a plurality of control gates CG are arranged in the direction of column while extending in the direction of row each. The control gates CG respectively play the role of word lines WL1, WL2 and so forth.

Tungsten silicon (WSi) layers 36 each serve to lower the resistance of particular one of the control gates CG while cap layers 38 each protect the control gate CG. The cap layers 38 are formed of silicon oxide.

Figure 2:
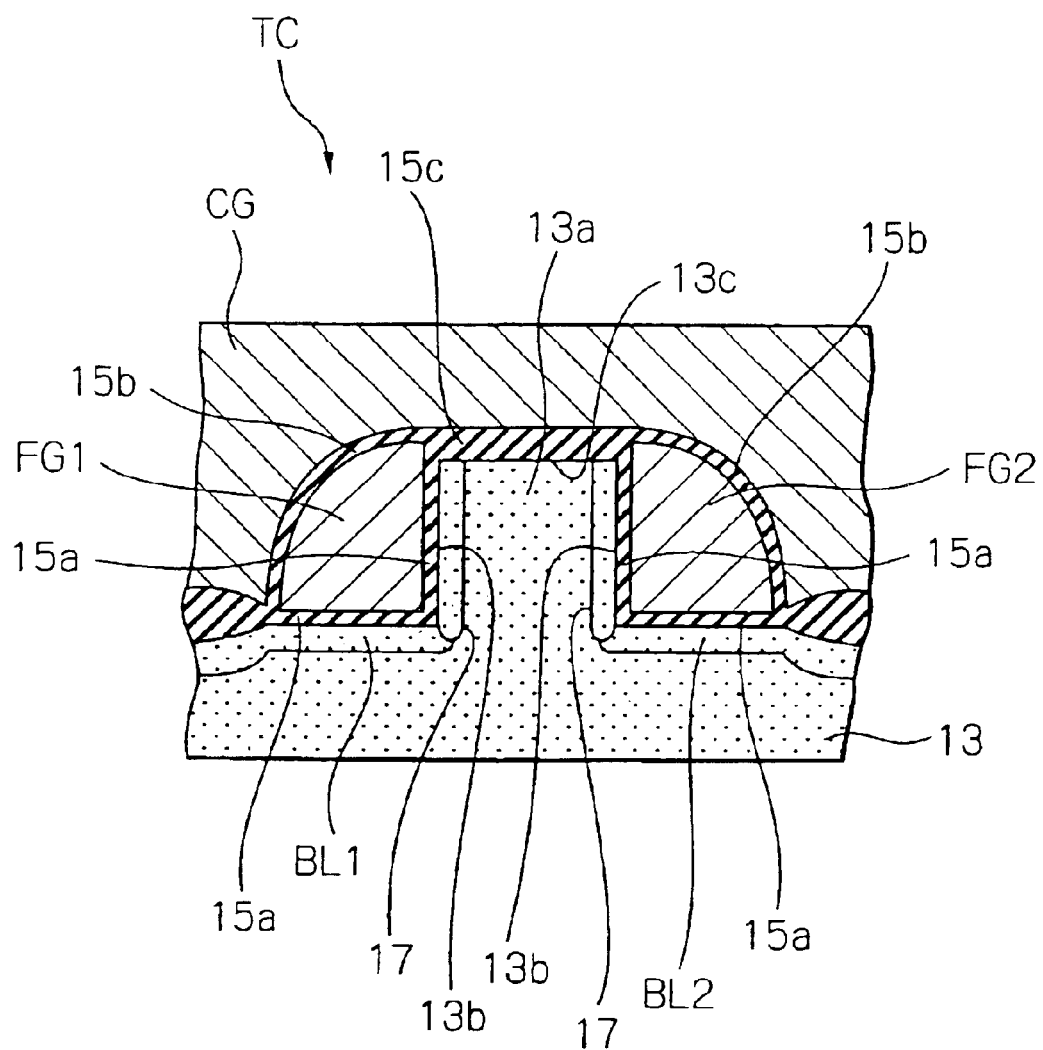
FIG. 2 is an enlarged section showing one of cell transistors included in the semiconductor memory embodying the present invention.

FIG. 2 is an enlarged view showing a cell transistor TC characterizing the present invention. As shown, the cell transistor TC includes the previously mentioned projection 13$a$ and a gate insulation layer or first insulation layer 15$c$ formed on the top 13$c$ of the projection 13$a$. The projection 13$a$ has a pair of side walls 13$b$ opposite to each other on which are formed counter-conductivity type, N type, regions 17 opposite in conductivity type to the projection 13$a$. The impurity concentration of the n-type regions 17 is selected to fall between $\frac{1}{100}$ and $\frac{1}{10,000}$, preferably about $\frac{1}{1,000}$, as high as that of the bit lines BL1 and BL2.

Tunnel insulation layers or second insulation layers 15$a$ respectively cover one of the side walls 13$a$ and bit line BL1 and the other side wall 13$b$ and bit line BL2. The bit lines BL1 and BL2 bifunction as source/drain regions, as will be described specifically later. In this sense, the bit lines BL1 and BL2 will be sometimes referred to as source/drain regions.

The floating gates FG1 and FG2 respectively are formed on the pair of side walls of said projection 13$a$, and face the source/drain regions BL1 and BL2 and the opposite side walls 13$b$ of the projection 13$a$ via the tunnel insulation layers 15$a$ adjoining them. Inter-polycrystalline insulation layers or third insulation layers 15$b$ each are formed on one of the floating gates FG1 and FG2.

The tunnel insulation layers 15$a$, inter-polycrystalline insulation layers 15$b$ and gate insulation layer 15$c$ all are formed of silicon oxide. The control gate CG faces the floating gates FG1 and FG2 via the inter-polycrystalline insulation layers 15$b$ and faces the top 13$c$ of the projection 13$a$ via the gate insulation layer 15$c$. If desired, part of the control gate CG facing the floating gates FG1 and FG2 via the inter-polycrystalline insulation layers 15b and the other part of the same facing the top 13c via the gate insulation layer 15c may be formed and controlled electrically independently of each other.

In the structure described above, a channel region is formed on the surface layers of the opposite side walls 13b and top 13c of the projection 13a in a tridimensional configuration. This is contrastive to a conventional channel region that was formed in a single plane. Therefore, the cell transistor TC achieves a longer channel length while occupying a minimum of area and can therefore reduce the size of a memory device.

The p-type impurity of the projection 13a has a concentration adjusted such that the cell transistor TC normally remains in its non-conductive or OFF state. More specifically, assume a condition wherein a preselected voltage is applied to the source/drain region BL1 (BL2). Then the concentration of the p-type impurity is adjusted such that when a potential difference between the so biased source/drain region BL1 (BL2) and the control gate CG is lower than a threshold voltage, the channel region established in the vicinity of the top of the ridge 13a in response to the control gate CG via the gate insulation layer 15c goes to its non-conductive state to resultantly render the cell transistor TC non-conductive, or when the potential difference is equal to or higher than the threshold voltage, the transistor TC goes conductive. It is to be noted that the preselected voltage applied to the source/drain region BL1 (BL2) refers to a voltage $V_{DD}$ necessary for write-in, read-out and other various operations, as will be described in detail later.

Figure 3:
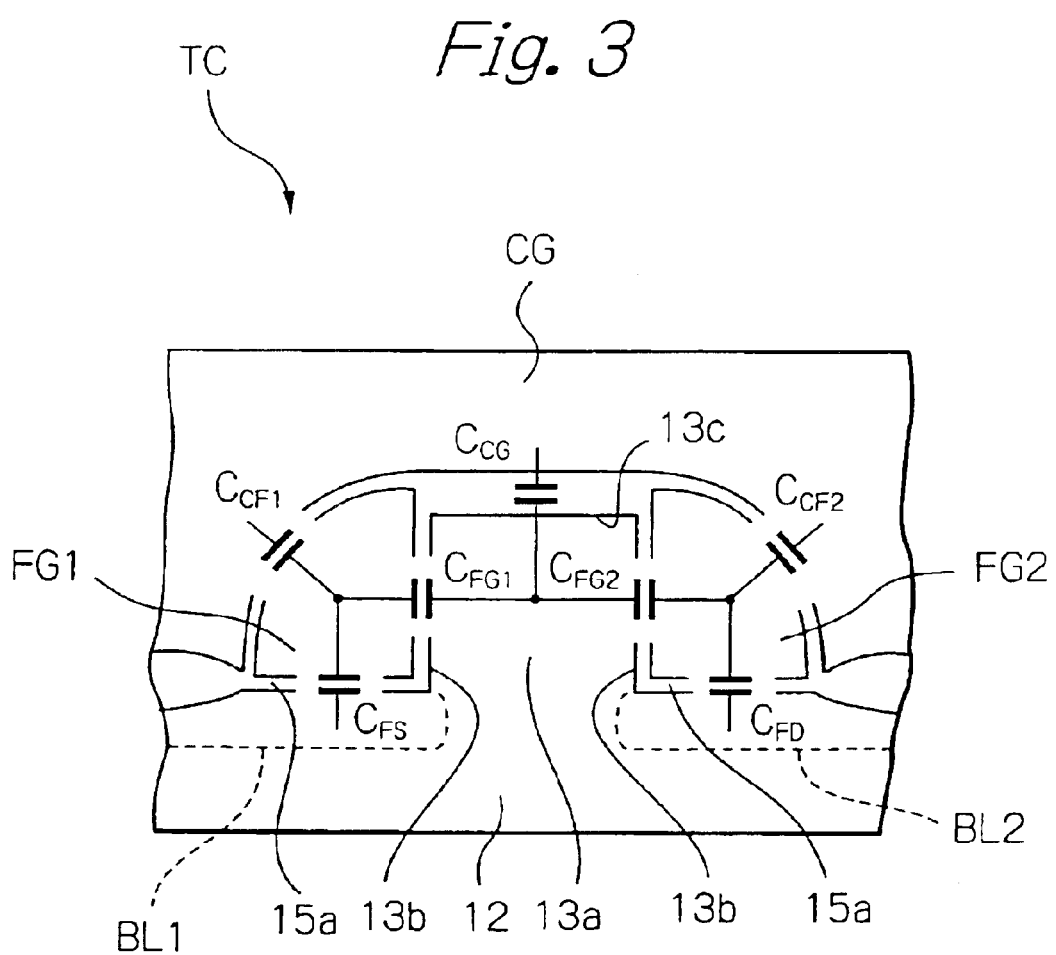
FIG. 3 shows an equivalent circuit representative of the cell transistor included in the semiconductor memory embodying the present invention.

FIG. 3 shows an equivalent circuit representative of the cell transistor TC and including various capacitance associated therewith. The capacitance means the following:

$C_{CG}$ ... capacitor between the control gate CG and the top 13c facing each other $C_{CF1}$ ($C_{CF2}$) ... capacitor between the control gate CG and the floating gate FG1 (FG2) facing each other, $C_{FG1}$ ($C_{FG2}$) ... capacitor between the floating gate FG1 (FG2) and the side wall 13b of the projection 13a facing each other $C_{FS}$ ($C_{FD}$) ... capacitor between the floating gate FG1 (FG2) and the source/drain region BL1 (BL2) facing each other Referring again to FIG. 1, a plurality of cell transistors TC are arranged side by side in both of the directions of column and row. The cell transistors TC adjoining each other in the direction column (e.g. cell transistors $TC_a$ and $TC_b$) share the source/drain regions BL3 and BL4, but are electrically isolated from each other by an isolation region 40. On the other hand, cell transistors adjoining each other in the direction of row (e.g. $TC_c$ and $TC_a$) share the control gate CG and share the source/drain region BL3 between them.

(2) Driving Method

A method of driving the individual cell transistor TC will be described hereinafter.

I) Writing Operation

Figure 4:
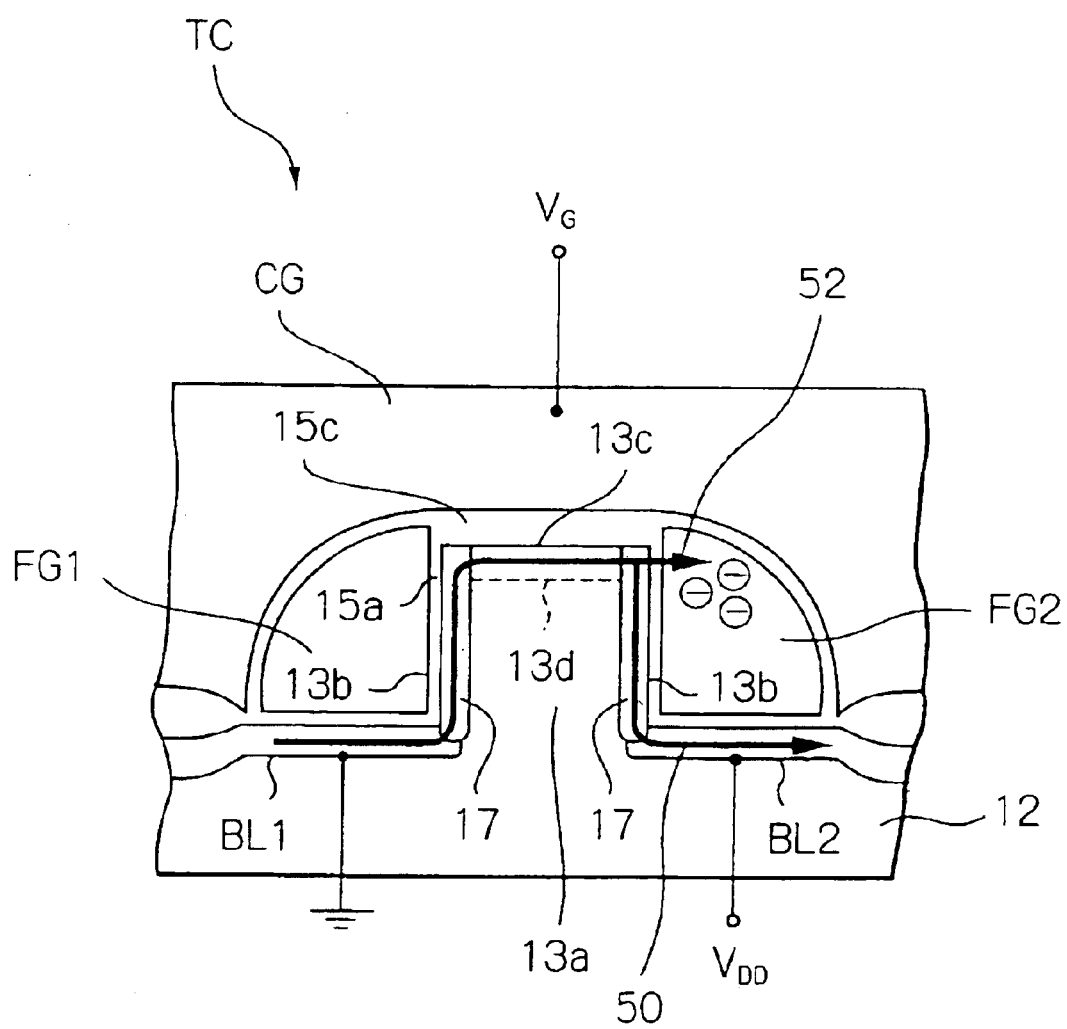
FIG. 4 is a section demonstrating a write mode for writing data in the cell transistor included in the semiconductor memory embodying the present invention.

First, reference will be made to FIG. 4 for describing how data is written to the cell transistor TC. FIG. 4 is a section demonstrating the writing of data in the cell transistor TC. In the illustrative embodiment, electrons can be selectively injected into either one of the floating gates FG1 and FG2, which are positioned at both sides of the projection 13a, as stated earlier.

As shown in FIG. 4, to inject electrons into the right floating gate FG2 by way of example, a gate voltage $V_G$ (e.g. 2.2 V) is applied to the control gate CG while a voltage $V_{DD}$ (e.g. 6 V) is applied to the source/drain region BL2 into which electrons should be injected. At the same time, the substrate 12 and the other source/drain region BL1 are grounded. Consequently, a potential difference for write-in (6 V in the illustrative embodiment) is applied between the source/drain regions BL1 and BL2.

In the condition shown in FIG. 4, the positive potential applied to the control gate CG causes an inversion layer 13d to be formed on the surface of the top 13c of the projection 13c. As a result, the n-type regions 17 are electrically interconnected by the inversion layer 13d. Because the n-type regions 17 each are contiguous with one of the source/drain regions BL1 and BL2 of the same conductivity type (e.g. n-type), the n-type source/drain regions BL1 and BL2 themselves are electrically interconnected.

Consequently, a carrier (electrons in the illustrative embodiment) flows through a path indicated by arrows. Paying attention to electrons flowing along the top 13c, among others, the floating gate FG2 is positioned just at the right-hand side in the direction of the flow in the figure. Those electrons can therefore be injected straightforward into the floating gate FG2 without being steered as in the conventional structure. This allows the gate voltage (write voltage) $V_G$ for attracting the electrons toward the floating gate FG2 to be made lower than the conventional gate voltage. In addition, the potential of the floating gate FG2 is raised by the drain voltage via the gate insulation layer 15a having larger capacity, so that the gate voltage (write voltage) $V_G$ for attracting the electrons toward the floating gate FG2 can be further lowered.

Moreover, the n-type regions 17 formed on the side walls 13b of the projection 13a serve to lower the resistance of the side walls 13b for thereby obstructing voltage drop across the side walls 13b. Consequently, a high voltage slightly lower than a voltage (e.g. 6 V) applied between the source/drain regions BL1 and BL2 is applied to the opposite ends of the top 13c, causing the top 13c to forcibly accelerate the electrons. As a result, the electrons are efficiently injected into the floating gate FG2. In this manner, the n-type regions 17 also serve to lower the write voltage $V_G$.

The above advantage is achievable even when channel resistance at the top 13c is increased. The channel resistance can be increased if the thickness of the gate insulation layer 15c is increased to reduce capacitance between the control gate CG and the channel region. In the illustrative embodiment, as shown in FIG. 4, the gate insulation layer 15c is made thicker than the tunnel insulation layers 15a for such a purpose.

FIG. 5 shows another specific structure for increasing the channel resistance at the top 13c. As shown, a high-resistance region 13e, which is a one-conductivity type impurity region, is formed on the top 13c of the projection 13a. To form the high-resistance region 13e, ions of a p-type impurity are implanted in the top 13c to a higher concentration than that of the projection 13a When the channel resistance at the top 13c is increased, as shown in FIG. 4 or 5, voltage drop at the top 13c increases with the result that a high voltage slightly lower than the voltage between the source/drain regions BL1 and BL2 is applied to the opposite ends of the top 13c. Consequently, there can be lowered the write voltage $V_G$ for the same reason as stated above.

As stated above, the write voltage $V_G$ can be lowered i) if the n-type regions are formed on the side walls 13b, ii) if the capacitance of the tunnel insulation layer is increased so as to raise the floating gate in potential with the drain voltage, (iii) if the thickness of the gate insulation layer 15c is increased or (iv) if the high-resistance region 13e is formed on the top 13c. These different schemes i) through iv) may be suitably combined, if desired, to attain the intended advantages described above. In any case, the write voltage $V_G$ should only be about 2.2 V, which is far lower than the conventional write voltage (12 V to 13 V)

While in FIG. 4 electrons are injected into the right floating gate FG2, electrons can be injected into the left floating gate FG1 only if the voltages applied to the source/drain regions BL1 and BL2 are replaced with each other. The illustrative embodiment therefore implements four different states shown in FIGS. 6A through 6D.

Figure 6A:
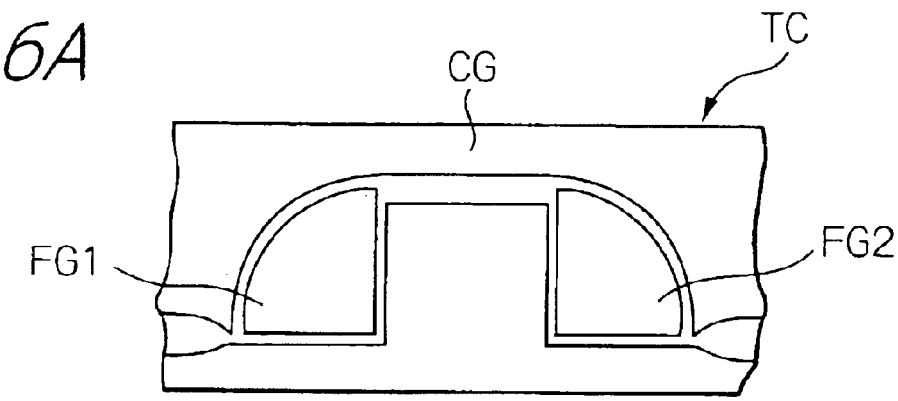
FIGS. 6A through 6D are sections showing four different states achievable with the cell transistor included in the semiconductor memory embodying the present invention.
Figure 6B:
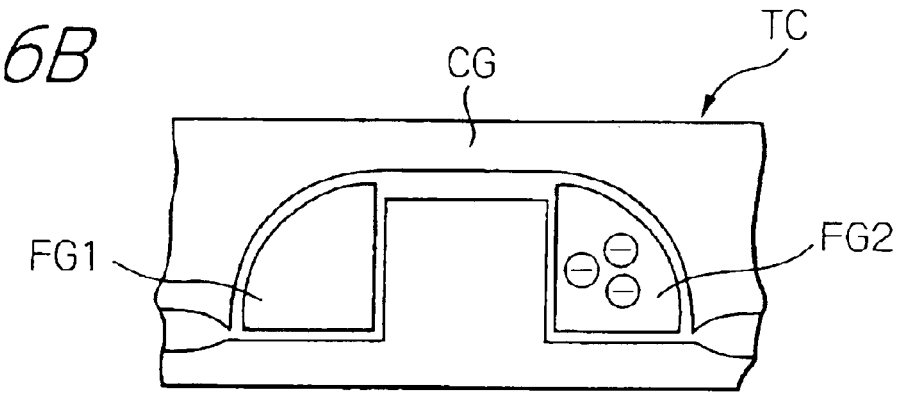
Figure 6C:
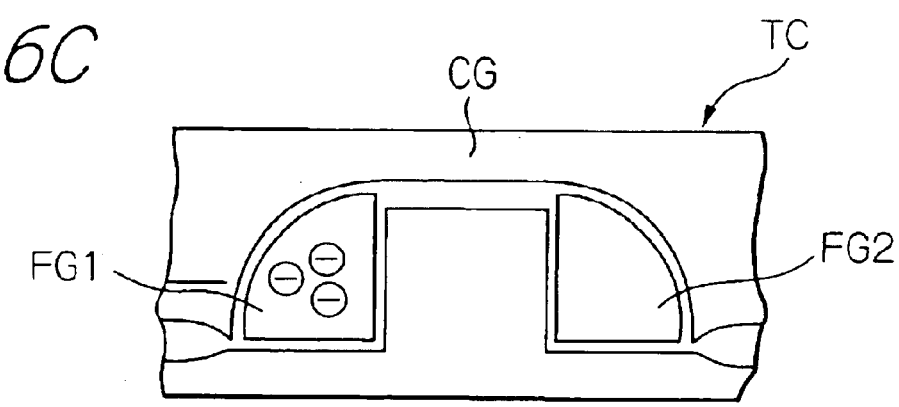
Figure 6D:
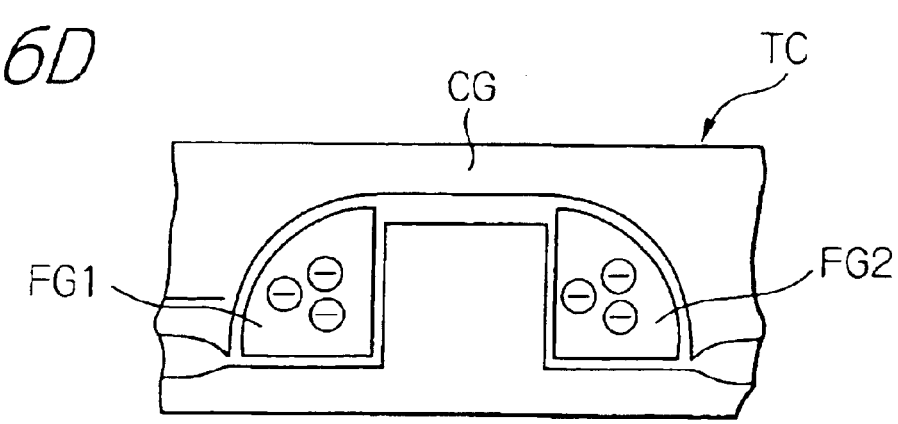

FIG. 6A shows a stored-bit state "(1, 1)" in which electrons are not injected into either one of the floating gates FG1 and FG2. FIGS. 6B and 6C respectively show storage stages "(1, 0)" and "(0, 1)" in each of which electrons are injected into either one of the floating gates FG1 and FG2. FIG. 6D shows a state "(0, 0)" in which electrons are injected into both of the floating gates FG1 and FG2; for example, electrons may be injected into the right floating gate FG2 and then injected into the left floating gate FG1. In this manner, the illustrative embodiment allows two-bit data "(1, 1)" through "(0, 0)" to be selectively written to a single cell transistor TC.

The illustrative embodiment includes two floating gates FG1 and FG2 and allows electrons to exist in the gates FG1 and FG2 separately from each other, as stated above. Therefore, even when the cell size is reduced, it is definitely distinguishable which of the floating gates FG1 and FG2 electrons includes significant electrons, compared to the prior art structure.

II) Reading Operation

Figure 7A:
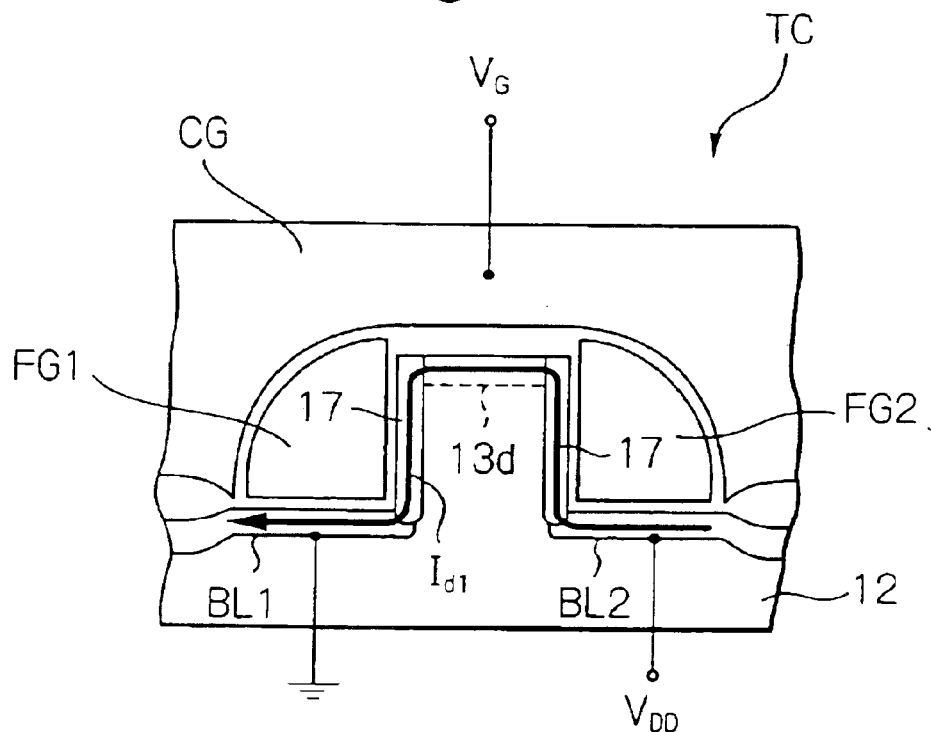
FIGS. 7A and 7B are sections demonstrating a read mode for reading data out of the cell transistor included in the semiconductor memory embodying the present invention.
Figure 7B:
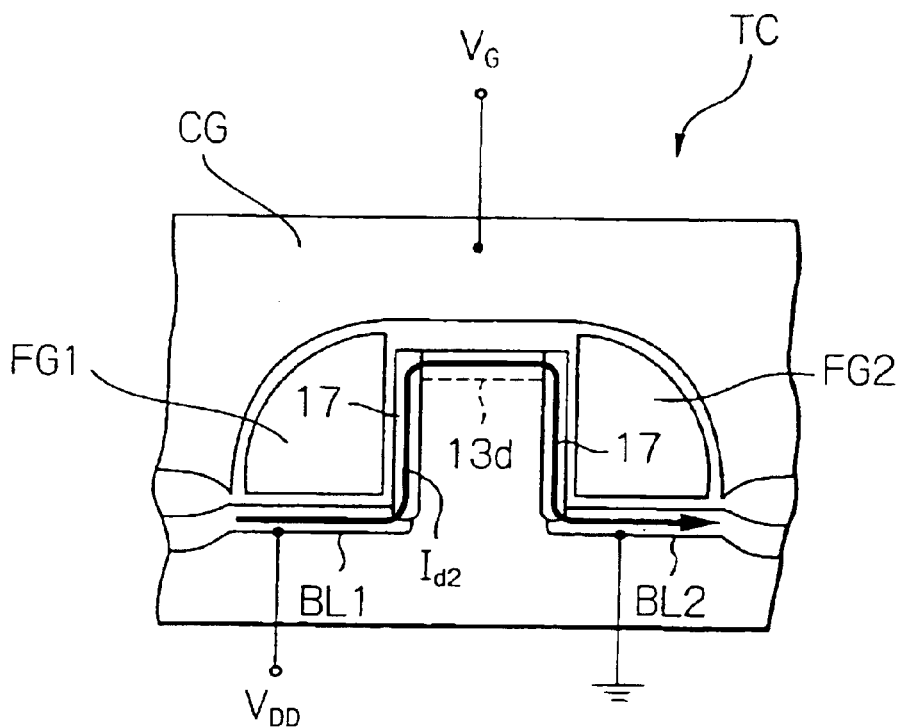

Reference will be made to FIGS. 7A and 7B for describing a reading operation. First, as shown in FIG. 7A, the read voltage $V_G$ (e.g., 2.2V) is applied to the control gate CG. Subsequently, the voltage $V_{DD}$ (e.g. 1.6V) is applied to one source/drain region BL2 while the other source/drain region BL1 and substrate 12 are connected to ground. As a result, a potential difference (1.6 V in the illustrative embodiment) for read-out is applied between the source/drain regions BL1 and BL2.

In the resulting potential distribution, the potential of the control gate CG is positive with the result that the inversion layer 13d is formed on the top 13c of the projection 13. Consequently, a drain current $I_{d1}$ flows in a direction indicated by an arrow in FIG. 7A.

Subsequently, as shown in FIG. 7B, the voltages applied to the source/drain regions BL1 and BL2 are replaced with each other with the read voltage $V_G$ (2.2 V) being maintained the same. As a result, the potential difference between the source/drain regions BL1 and BL2 is inverted, causing a second drain current $I_{d2}$ to flow in a direction indicated by an arrow in FIG. 7B.

In the illustrative embodiments, the two kinds of drain currents $I_{d1}$ and $I_{d2}$ are measured due to the replacement of the voltages applied to the source/drain regions BL1 and BL2. The values of the drain current $I_{d1}$ and $I_{d2}$ are different in accordance with the state, as will be described specifically later. It is therefore possible to compare the current sets ($I_{d1}$, $I_{d2}$) with the states one-to-one to determine which of the states the cell is. Drain currents to flow in the different states "(1, 1)" through "(0, 0)" will be described in detail hereinafter.

(i) State "(1, 0)"

Figure 8A:
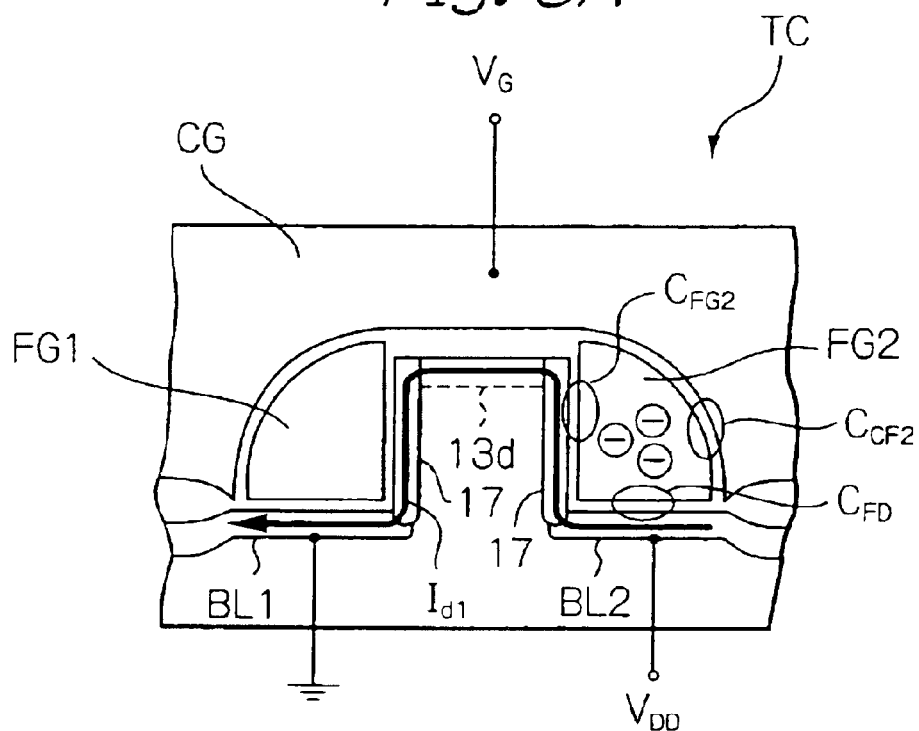
FIGS. 8A and 8B are sections showing how a state "(0, 1)" is sensed out of the cell transistor included in the semiconductor memory embodying the present invention.
Figure 8B:
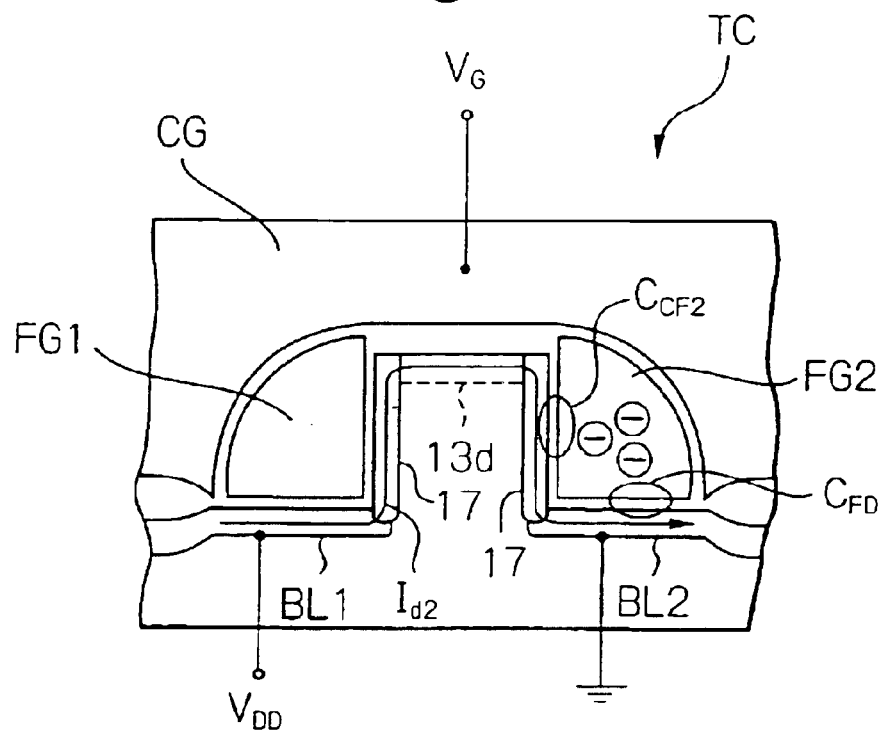

FIGS. 8A and 8B are sections demonstrating how the state (1, 0) is sensed. As shown in FIG. 8A, voltages are applied to the structural members of the cell transistor TC in the same manner as in FIG. 7A, causing the drain current $I_{d1}$ to flow. In this condition, although the potential of the right flowing gate FG2 is lowered due to electron injection, it is raised by the capacities $C_{CF2}$ and $C_{FD}$ toward the positive potential of the control gate CG (2.2 V) and that of the source/drain BL2 (1.6 V).

Consequently, the potential drop of the floating gate FG2 is limited, so that channel resistance around the gate FG2 is not so high. The drain current $I_{d1}$ therefore has a relatively great value.

Particularly, the n-type region 17 contacting the source/drain region BL2 has a potential substantially equal to the potential of the source/drain region BL2. The potential of the floating gate FG2 is therefore raised toward the source/drain BL side by the capacity $C_{FG2}$ as well, further lowering channel resistance around the gate FG2. As a result, the value of the drain current $I_{d1}$ further increases.

Subsequently, as shown in FIG. 8B, the voltages applied to the source/drain regions BL1 and BL2 are replaced with each other to cause the drain current $I_{d2}$ to flow. In this case, the potential of the right floating gate FG2 is lowered due to electron injection. Further, because the right source/drain region BL2 is connected to ground, the potential of the floating gate FG2 is lowered toward the ground by the capacitance $C_{FD}$ between the gate FG2 and the region BL2. Consequently, the potential of the floating gate FG2 is lower in FIG. 8B than in FIG. 8A and causes channel resistance around the gate FG2 to increase. The drain current $I_{d2}$ is therefore smaller than the previous drain current $I_{d1}$.

Particularly, the n-type region 17 causes the potential of the right floating gate FG2 to be lowered toward the ground by the capacitance $C_{FG2}$ as well, so that the value of the drain current $I_{d2}$ is further reduced. As stated above, the state (1, 0) can be identified on the basis of ($I_{d1}$, $I_{d2}$)=(large, small). To identify greater one of the drain currents $I_{d1}$ and $I_{d2}$, a sense amplifier, not shown, compares each of them with a reference current.

In the illustrative embodiment, the values of the drain currents $I_{d1}$ and $I_{d2}$ can be increased or decreased on the basis of the capacitance $C_{CF2}$, $C_{FD}$ and $C_{FG2}$, as desired. This allows the difference ($I_{d1-Id2}$) to be increased to a desired value. Stated another way, the illustrative embodiment allows the current window represented by the above difference to be broadened, as desired. A wide current window increases the margins of the drain currents $I_{d1}$ and $I_{d2}$ and reference current, thereby reducing the probability of incorrect identification of written data.

(ii) State "(0, 1)"

To sense the state (0, 1) from the cell transistor TC, electrons are injected into the left floating gate FG1 opposite to the right floating gate FG2. Therefore, the drain currents $I_{d1}$ and $I_{d2}$ are estimated in the same manner as in the above description, so that there holds ($I_{d1}$, $I_{d2}$)=(small, large).

(iii) State "(1, 1)"

As for the state (1, 1) to be sensed from the cell transistor TC, electrons are not injected into either one of the floating gates FG1 and FG2. In this case, the drain currents $I_{d1}$ and $I_{d2}$ both are great because the potential of the floating gate FG1 or that of the floating gate FG2 is not lowered by electrons. This condition is symmetrical in the right-and-left direction, i.e., the drain currents $I_{d1}$ and $I_{d2}$ are not different from each other. Thus, there holds ($I_{d1}$, $I_{d2}$)=(large, large).

(iv) State "(0, 0)

Further, as for the state (0, 0), symmetry is set up in the right-and-left direction because electrons are injected into both of the floating gates FG1 and FG2. Therefore, ($I_{d1}$, $I_{d2}$)=(small, small) holds, meaning that the drain currents $I_{d1}$ and $I_{d2}$ are not different from each other.

Another specific reading method available with the illustrative embodiment will be described hereinafter. In the illustrative embodiment, the drain current Id, after all, varies in accordance with whether or not a charge is stored in the floating gate facing the source/drain region to which the read voltage is not applied (ground side). Therefore, when the drain voltage is applied to one of the source/drain regions, only the resulting drain current may be sensed to determine whether or not a charge is stored in the floating gate to which the voltage is not applied.

III) Deleting Operation

Figure 9:
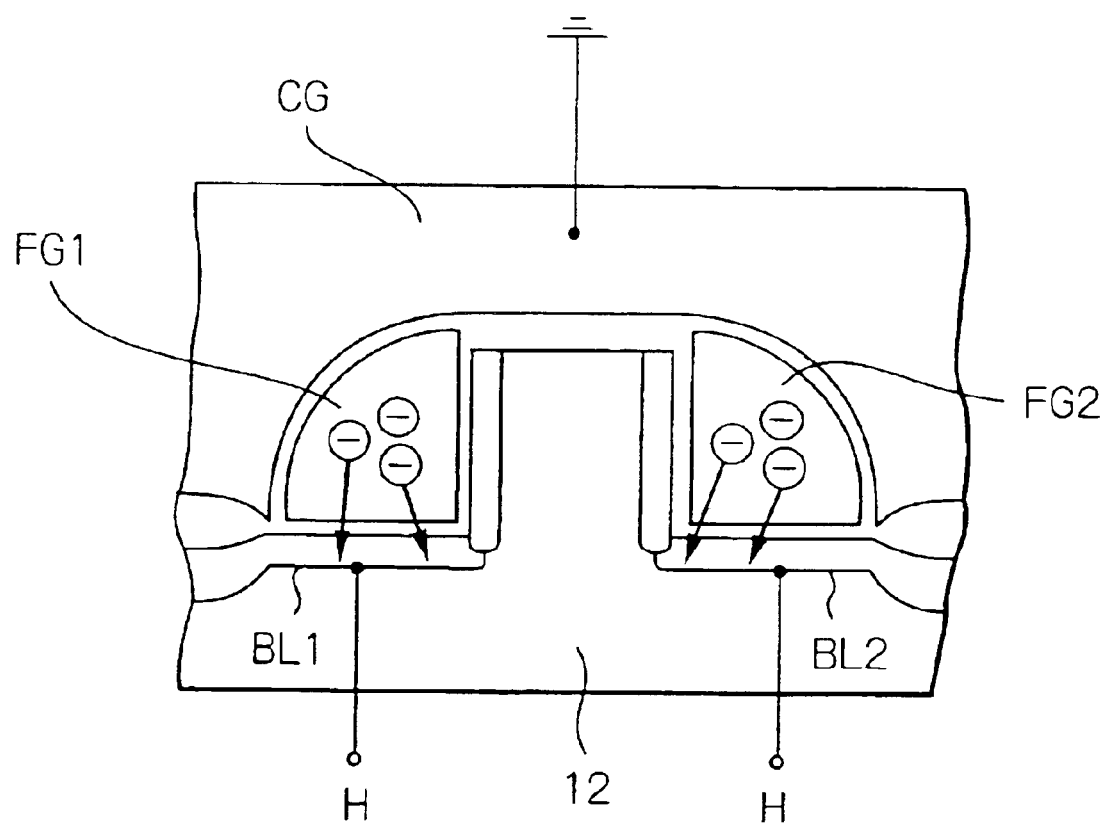
FIG. 9 is a section demonstrating a specific method of deleting electrons injected into floating gates.

Specific methods of deleting electrons injected in the floating gates FG1 and FG2 available with the illustrative embodiment will be described hereinafter. FIG. 9 shows a specific method that with draws electrons from the floating gates FG1 and FG2 into the source/drain regions BL1 and BL2, respectively. This method is practicable by connecting the control gate CG to ground and applying a high potential "H" (e.g. 12 V) to each of the source/drain regions BL1 and BL2. It is to be noted that the potential difference between the control gate CG and the source/drain region BL1 or BL2 can be set up relatively between the control gate CG and the source drain regions BL1 and BL2. For example, −6 V and 6 V may be applied to the control gate CG and source/drain regions BL1 and BL2, respectively.

Figure 10:
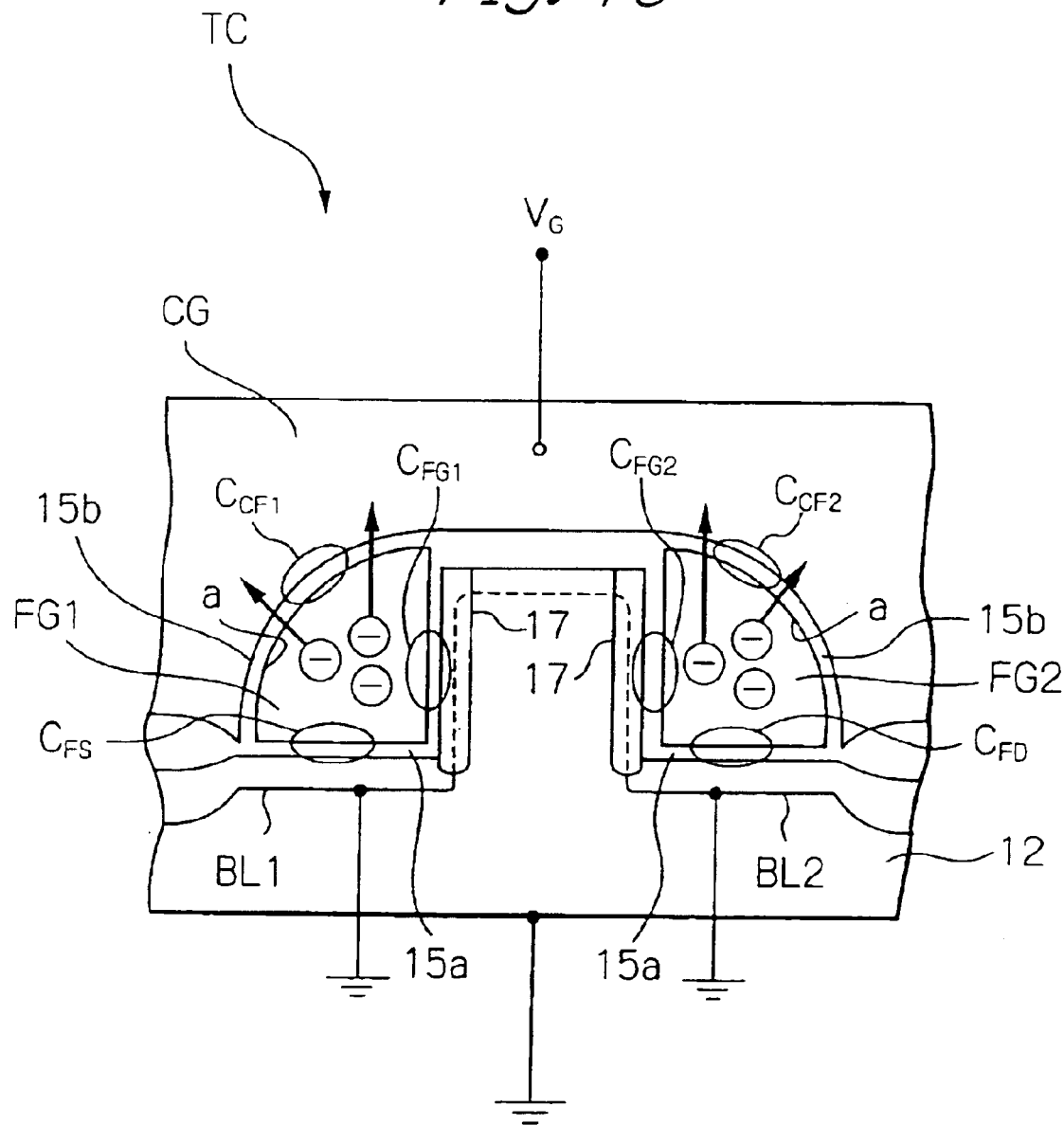
FIG. 10 is a section demonstrating another specific method of deleting electrons implanted in the floating gates in the cell transistor included in the semiconductor memory embodying the present invention.

FIG. 10 shows another specific method that applies a high potential $V_G$ (e.g. 12 V) to the control gate CG and connects the substrate 12 and source/drain regions BL1 and BL2 to ground. In this potential distribution, electrons are withdrawn from the floating gate FG1 (FG2) into the control gate CG via the inter-polycrystalline insulation layer 15b because the potential of the control gate CG is higher than the potential of the gates FG1 (FG2). In this regard also, 6 V and −6 V may be applied to the control gate CG and source/drain regions BL1 or BL2, respectively, so as to set up the potential difference of 12 V between them.

Further, in the voltage distribution shown in FIG. 10, an electron layer is formed because the potential of the control gate CG is higher than that of the projection 13a. The electron layer increases the capacitance $C_{FG1}$ ($C_{FG2}$) that, in turn, raises the potential of the floating gate FG1 (FG2) to the potential of the side wall 13b of the projection 13.

Consequently, the potential of the floating gate FG1 (FG2) is attracted by the potential of the side wall 13b and therefore further lowered. The resulting potential difference between the floating gate FG1 (FG2) and the side wall 13b is small enough to prevent the tunnel insulation layer 15a between them from being destroyed by a tunnel current.

Moreover, the potential difference between the floating gate FG1 (FG2) and the control gate CG increases relatively because the potential of the floating gate FG1 (FG2) is attracted toward the potential of the source/drain region BL1 (BL2) or that of the side wall 13b. As a result, a strong electric field is established between the floating gate FG1 (FG2) and the control gate CG and efficiently withdraws the stored electrons into the control gate CG.

IV) Operation in Unselected Condition

The operations i) through iii) described above have concentrated on a condition wherein the cell transistor 1 is selected. In practice, however, the cell transistor 1 is sometimes not selected.

Even when the cell transistor 1 is not selected, the drive voltage $V_{DD}$ is applied to the bit line BL1 (see FIG. 3) in order to select another cell transistor TC. In this case, the potential of the floating gate FG1 of the unselected cell transistor TC is pulled toward the potential of the bit line BL1 due to a great capacitance $C_{FS}$ between the gate FG1 and the bit line BL1. As a result, the potential difference between the floating gate FG1 and the source/drain region BL1 decreases, so that the tunnel insulation layer 15a between the gate FG1 and the region BL1 is prevented from being exposed to the strong electric field. Consequently, a tunnel current that would deteriorate the tunnel insulation layer 15a is successfully prevented from flowing through the layer 15a.

Furthermore, the small potential difference stated above is successful to obviate hot holes that would otherwise appear at the PN junction of the source/drain region BL1 and the substrate 12 due to a strong electric field and would deteriorate the tunnel insulation layer 15a. In this manner, the illustrative embodiment improves resistance to inter-band tunneling.

It is noteworthy that the capacitance $C_{FS}$ ($C_{FD}$) between the floating gate FG1 (FG2) and the source/drain region BL1 (BL1) plays an important role in achieving the advantages described in relation to the operations i) through iv). In the illustrative embodiment, the floating gate FG1 (FG2) is positioned above the source/drain region BL1 (BL2) in order to reduce the distance between the floating gates FG1 and FG2, thereby reducing the device size and increasing the capacities $C_{FD}$ and $C_{FS}$, which makes it easy to obtain the advantages mentioned above.

Figure 25:
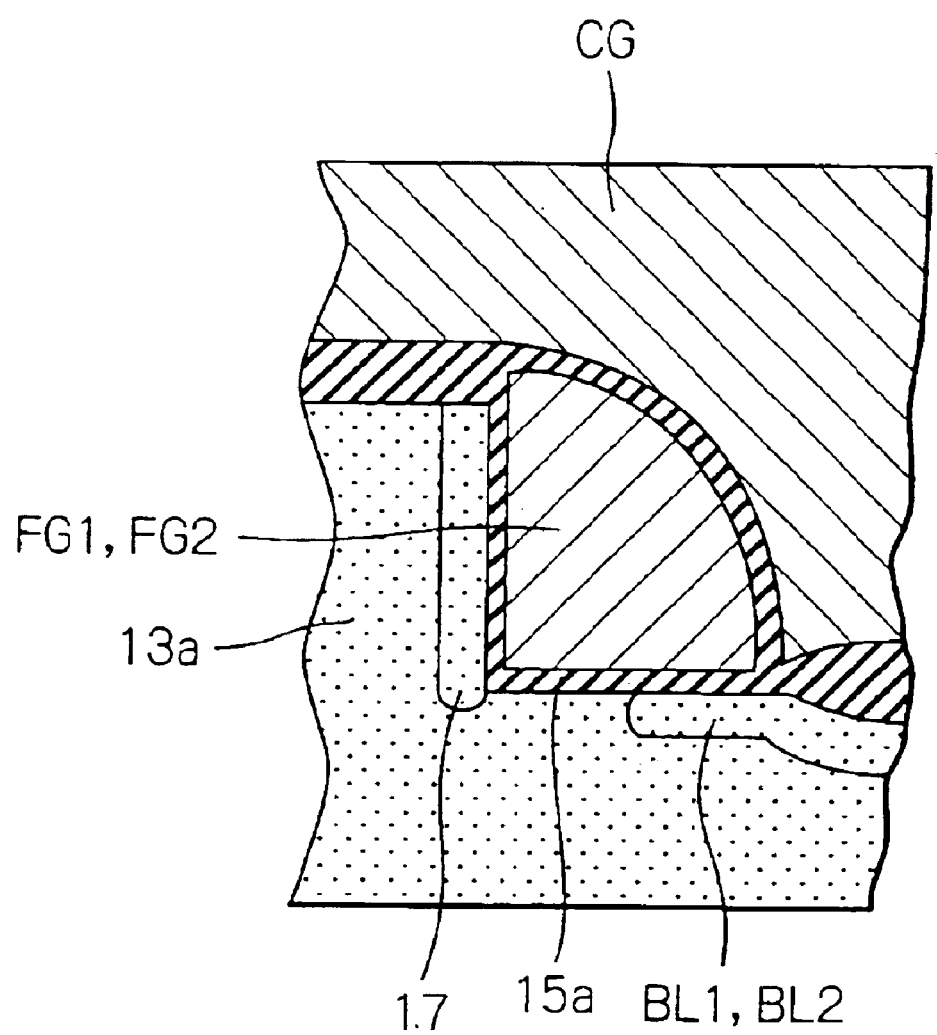
FIG. 25 is a section showing another specific configuration of a source/drain region available with the illustrative embodiment, the source/drain region being apart from a projection.
Figure 26:
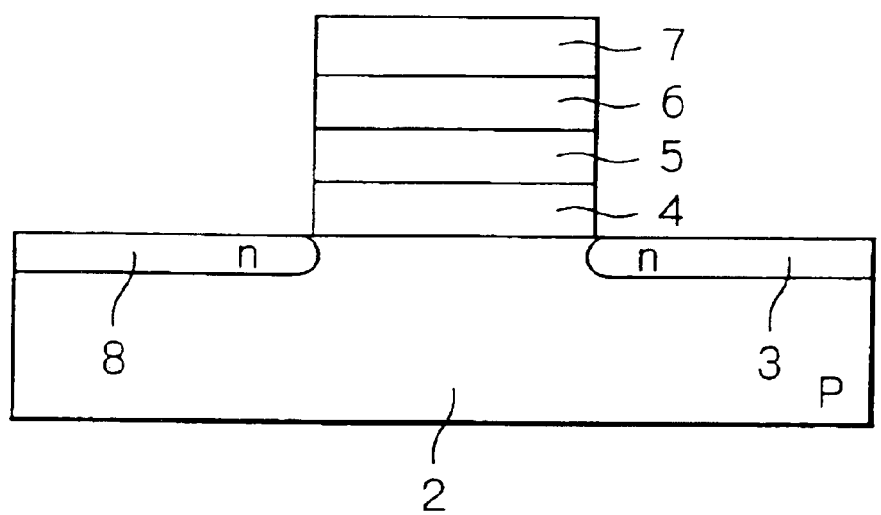
FIG. 26 is a section showing a prior art, multiple-bit cell transistor.
Figure 27A:
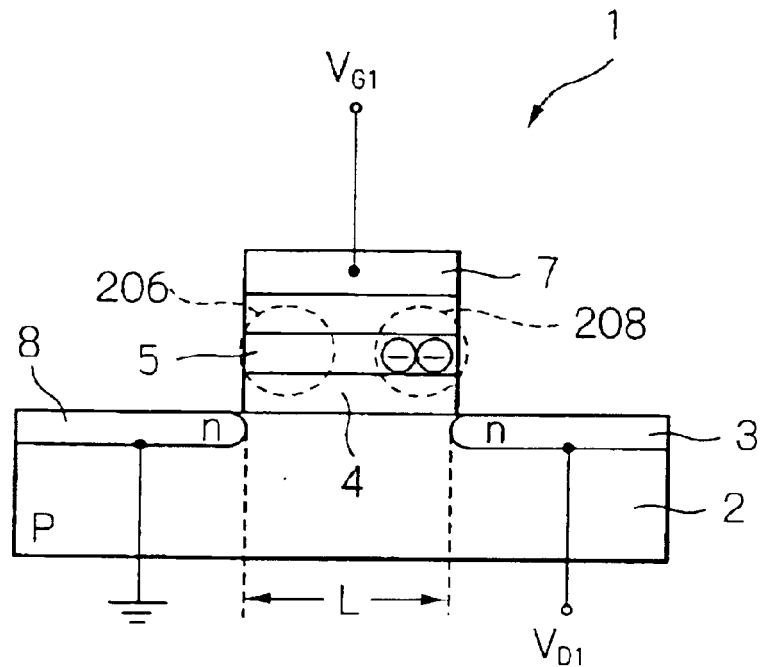
FIGS. 27A and 27B are sections showing a procedure for writing data in the prior art multiple-bit cell transistor.
Figure 27B:
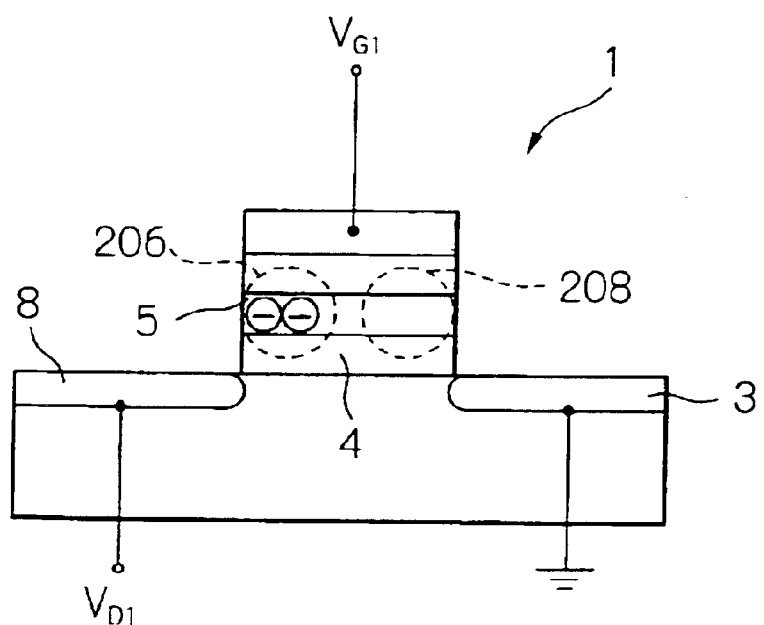
Figure 28A:
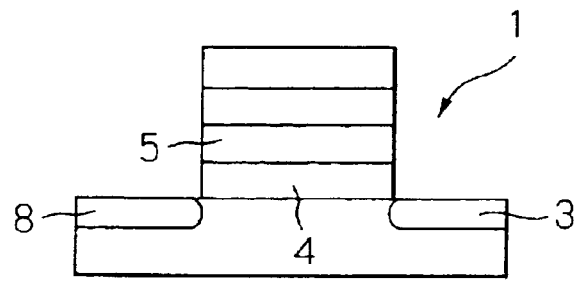
FIGS. 28A through 28D are sections representative of four different states particular to the prior art multiple-bit cell transistor.
Figure 28B:
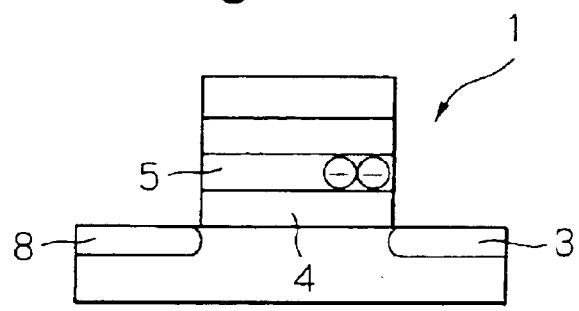
Figure 28C:
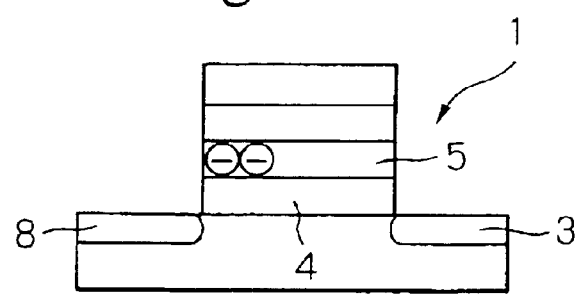
Figure 28D:
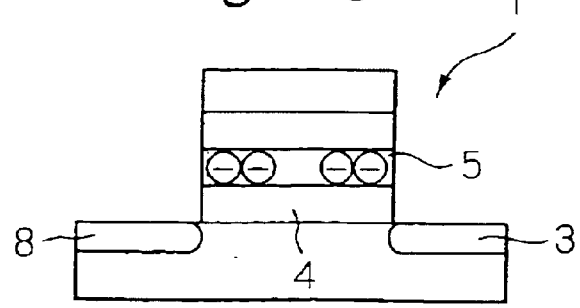
Figure 29:
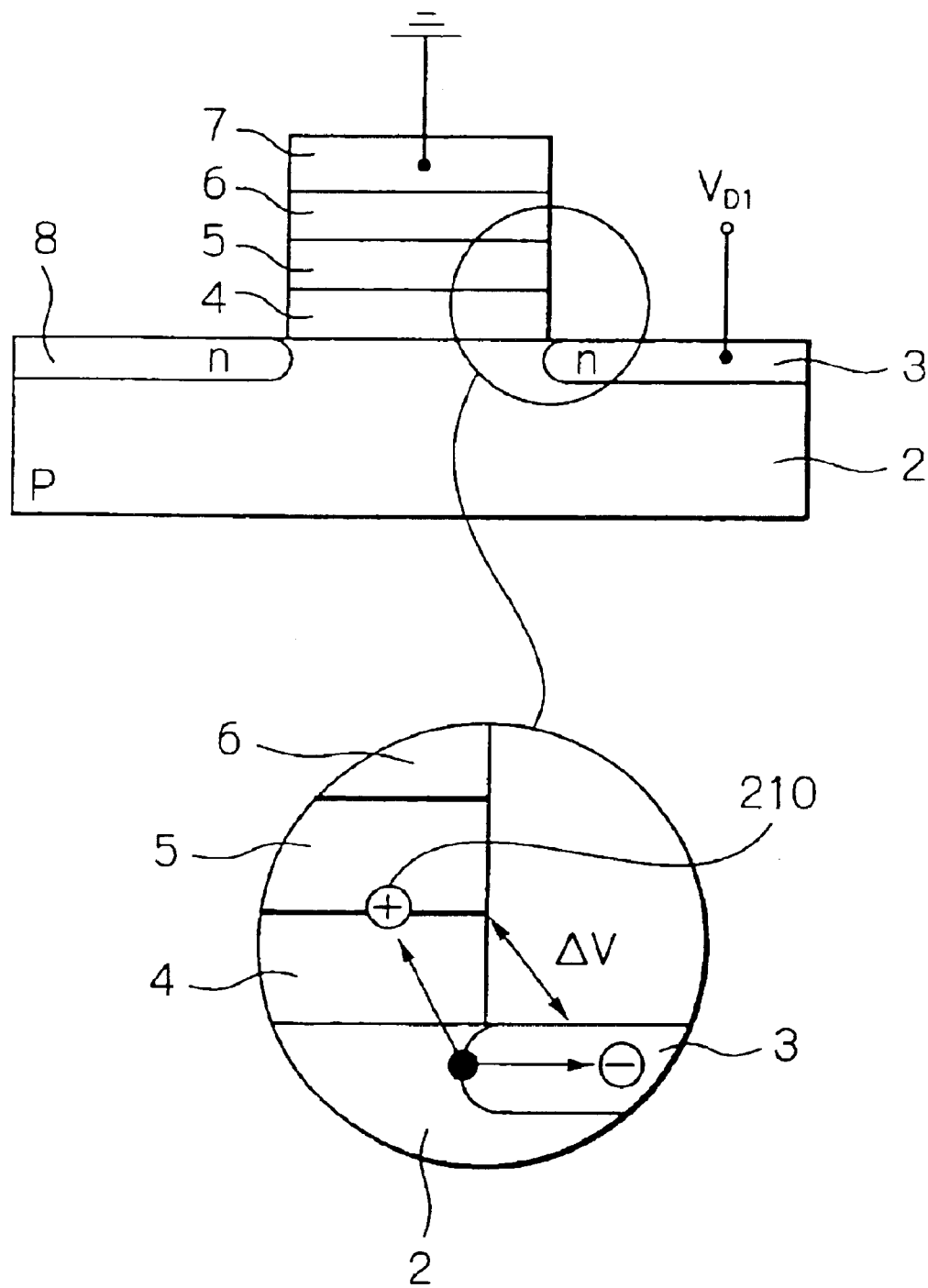
FIG. 29 is a section demonstrating why the prior art multiple-bit cell transistor is short of resistance to inter-band tunneling.

The area over which the floating gate FG1 (FG2) and source/drain region BL1 (BL2) face each other is open to choice. While the advantages described above are easier to achieve as the above area becomes larger, they are achievable even if the area is small. FIG. 25 shows another specific configuration in which the source/drain region BL1 (BL2) is set back from the projection 13a, causing part of the source/drain region BL1 (BL2) to face the floating gate FG1 (FG2). The advantages are achievable with such a configuration as well for the reason described above.

Figure 30:
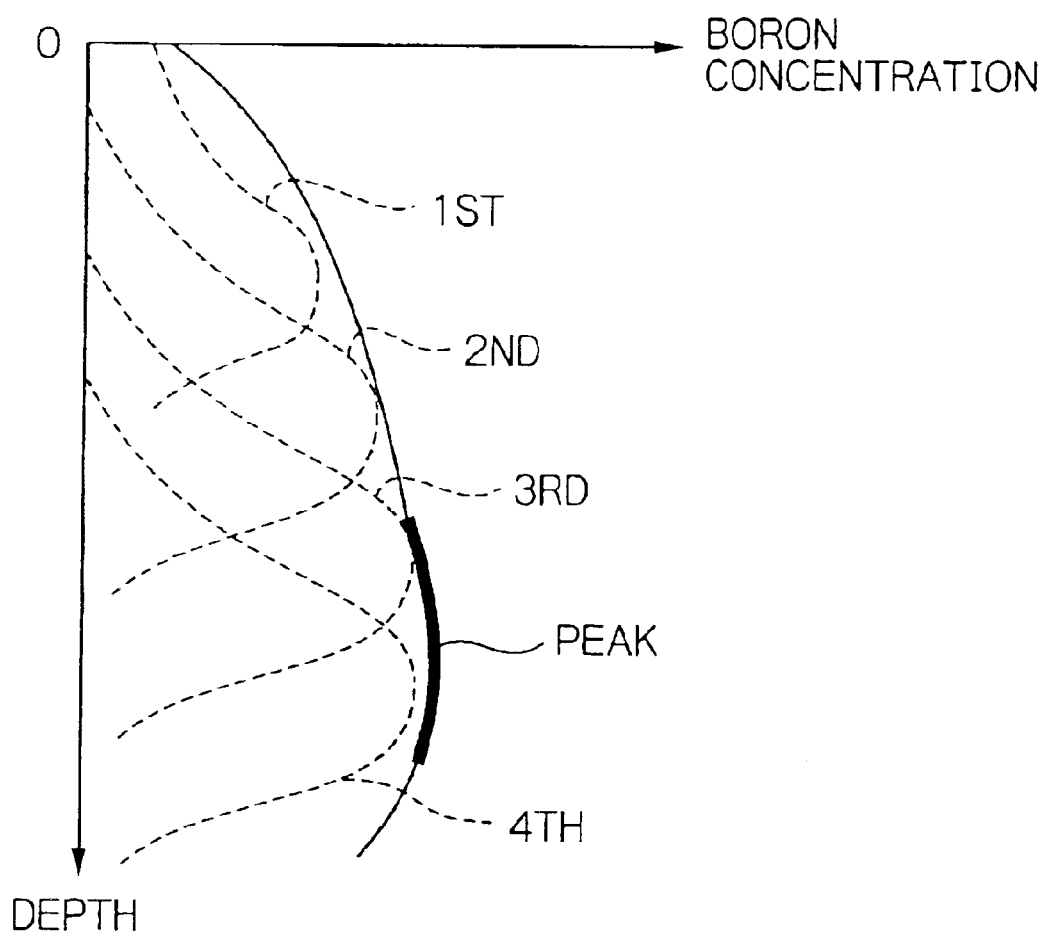
FIG. 30 is a section showing boron concentration increased at the root portion of the projection in the cell transistor included in the semiconductor memory in accordance with the illustrative embodiment.

(3) Measure Against Punch-Through and Stabilization of Threshold Voltage $V_{th}$ When punch-through between the source/drain regions BL1 and BL2 is likely to occur on write-in or read-out, it is preferable to use a specific structure shown in FIG. 30. A graph shown in FIG. 30 together with the specific structure plots the concentration of boron (p-type impurity) with respect to depth in the projection 13a. As shown, the boron concentration of the projection 13a sequentially increases in the direction of depth up to the root portion of the projection 13a. The boron concentration is therefore high on the portions of the side walls 13b adjoining the source/drain regions BL1 and BL2.

In the structure shown in FIG. 30, the concentration of the p-type impurity is high on the channel region adjoining the n-type source/drain regions BL1 and BL2. The channel region is therefore formed at a position spaced from a region linearly connecting the n-type source/drain regions BL1 and BL2 (close to the regions BL1 and BL2), i.e., formed on the surfaces of the side walls 13b and top 13c of the projection 13. This means that the high impurity concentration in the channel region adjoining the source/drain regions BL1 and BL2 serves to obstruct the punch-through of the source/drain regions BL1 and BL2 also. Such cell transistors can therefore be densely integrated to construct a semiconductor memory.

The threshold voltage $V_{th}$ of the cell transistor TC is critically effected by the impurity concentration in each side wall 13b of the root portion. It follows that an increase in boron concentration in the root portion directly translate into an increase in the threshold voltage $V_{th}$ of the cell transistor TC.

However, in the illustrative embodiment, the n-type impurity of the n-type region 17, which is provided on the side wall 13b, and the p-type impurity of the side wall cancel each other, lowering the substantial acceptor concentration at the side wall 13b. Therefore, despite that the boron concentration is increased at the root portion of the projection 13a, the n-type region 17 prevents the threshold voltage $V_{th}$ of the transistor TC from increasing.

Further, because the threshold voltage $V_{th}$ is susceptible to the impurity concentration of the root portion, as stated above, the impurity concentration should preferably be prevented from noticeably varying at the root portion in order to stabilize the threshold voltage $V_{th}$. For this purpose, it is desirable not only to simply increase the boron concentration of the projection 13a, but also to make the peak indicated by a bold like as flat as possible and match the flat peak to the root portion of the projection 13a. In the flat portion where the boron concentration varies little, the relation between the boron concentration and the arsenic concentration of the n-type region 17 remains substantially constant and therefore stabilizes the threshold voltage $V_{th}$.

(4) Measure against Leak Current between Control Gate and Bit Lines

Figure 11:
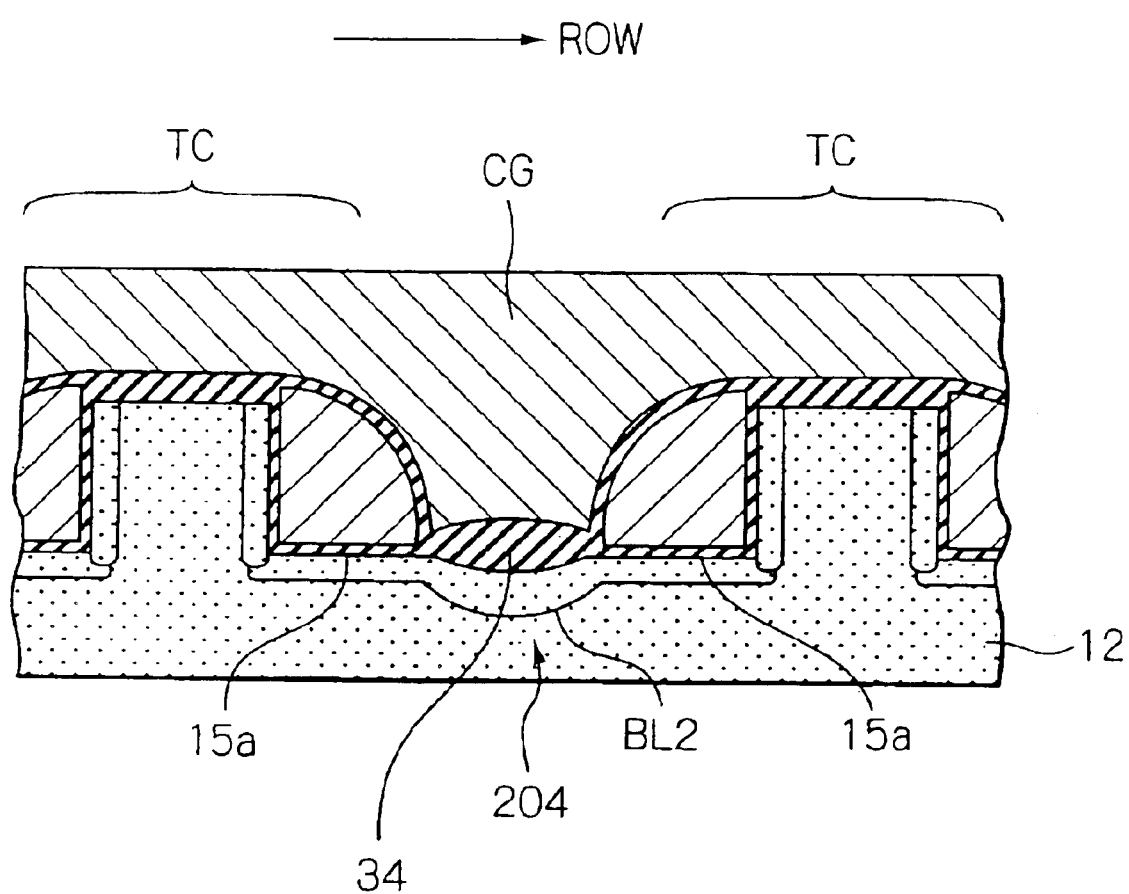
FIG. 11 is a section showing a selective oxide layer connecting tunnel insulation layers included in the cell transistor included in the semiconductor memory embodying the present invention.

As shown in FIG. 11, in the illustrative embodiment, the control gate CG and bit line BL2 face each other at a portion A between the cell transistors TC adjoining each other in the direction of row. In this configuration, a leak current may flow between the control gate CG and the bit line BL2 in any one of the operation modes stated earlier.

In light of the above, it is preferable to form a selective oxide layer 34 contiguous with the tunnel insulation layers 15a and to make the selective oxide layer 34 thicker than the tunnel insulation layers 15a. The selective oxide layer 34 with such thickness obviates the above leak current. The structure of FIG. 11 obviates leak current between the control gate CG and the bit lines BL1 and BL2 with a fourth insulation film formed by selective oxidation, as stated above. Alternatively, a hole may be formed between the adjoining floating gates and filled with an oxide, in which case the control gate CG will be formed over the oxide.

When an insulator intervenes between the control gate CG and the bit lines BL1 and BL2, as stated above, the floating gates FG1 and FG2 face the control gate CG only via the inter-polycrystalline layers 15b.

(5) General Circuit Construction

Figure 12:
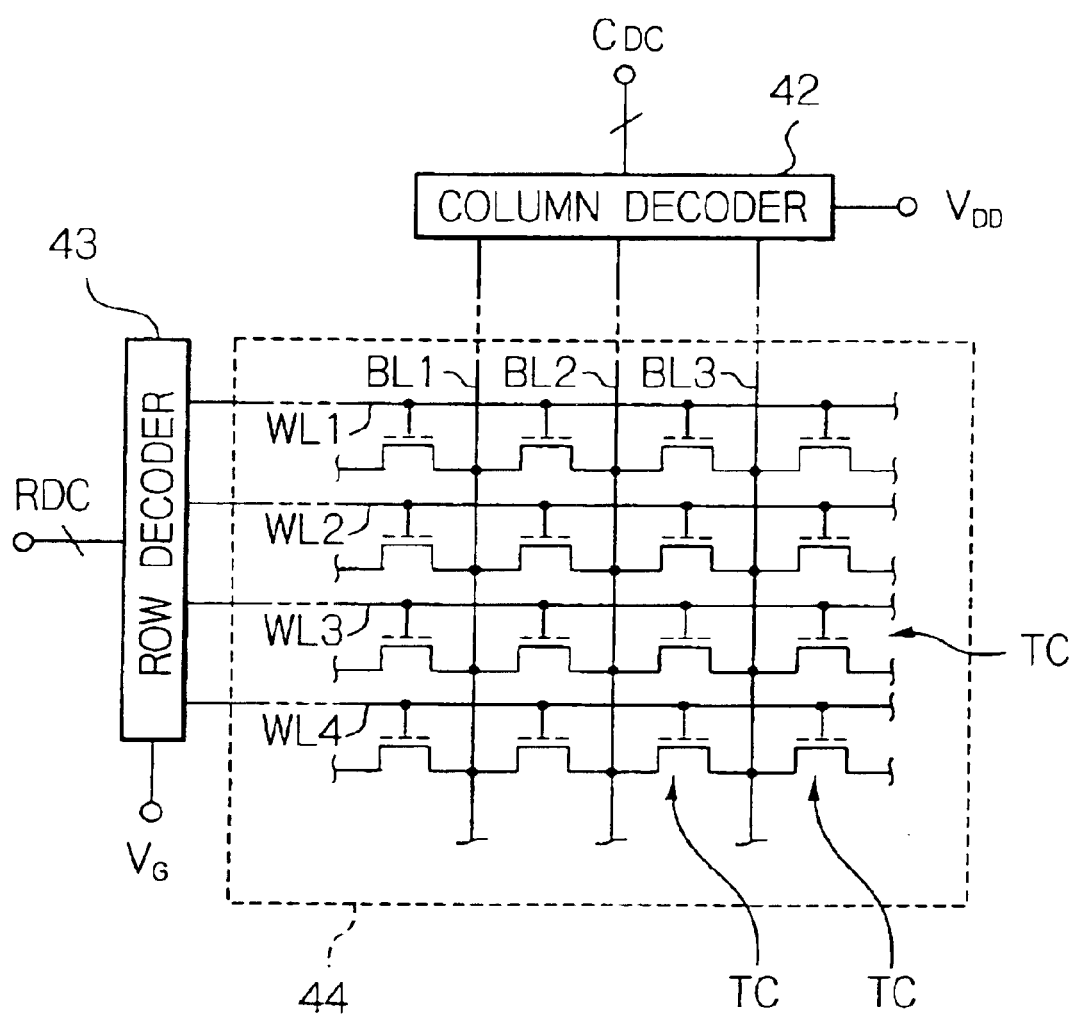
FIG. 12 is a block diagram schematically showing the general configuration of the semiconductor memory of the illustrative embodiment.

Reference will be made to FIG. 12 for describing the general circuit arrangement of the illustrative embodiment. As shown, a memory cell array 44 includes cell transistors TC arranged in rows and columns. Control gates (word lines) WL1 through WL4 each being shared by a particular row of cell transistors TC are connected to the output of a row decoder 43. The row decoder 43 decodes a low decode signal RDC having a preselected number of bits to thereby select one of the word lines WL1 through WL4 corresponding to the signal RDC.

A gate voltage $V_G$ is applied to one of the word lines WL1 through WL4 selected. The gate voltage $V_G$ is switched in accordance with the operation mode, which is a write mode, a readmode or a delete mode. More specifically, the gate voltage $V_G$ is 2.2 V in the write mode, 2.2 V in the read mode or 12 V in the delete mode, as stated earlier. On the other hand, the word lines WL1 through WL4 each may be brought into a floating state when in the unselected condition.

On the other hand, the bit lines BL1 through BL3 associated with the cell transistors TC are connected to the output of a column decoder 42. The column decoder 42 decodes a column decode signal CDC having a preselected number of bits to thereby select one of the bit lines BL1 through BL3 corresponding to the signal CDC.

A voltage $V_{DD}$ is fed to one of the bit lines BL1 through BL3 selected. The voltage $V_{DD}$ is switched in accordance with the operation mode, which is the write mode, the read mode or the delete mode. More specifically, the voltage $V_{DD}$ is the ground or reference voltage or 6 V in the write mode, the ground voltage of 1.6 V in the read mode or the ground voltage in the delete mode, as stated earlier. The bit lines BL1 through BL3 each may be brought into a floating state in the unselected condition. The cell transistors TC each are selected by a bit line BLi selected and a word line WLj selected in any one of the write mode, read mode, and delete mode.

(7) Production Process

Figure 13A:
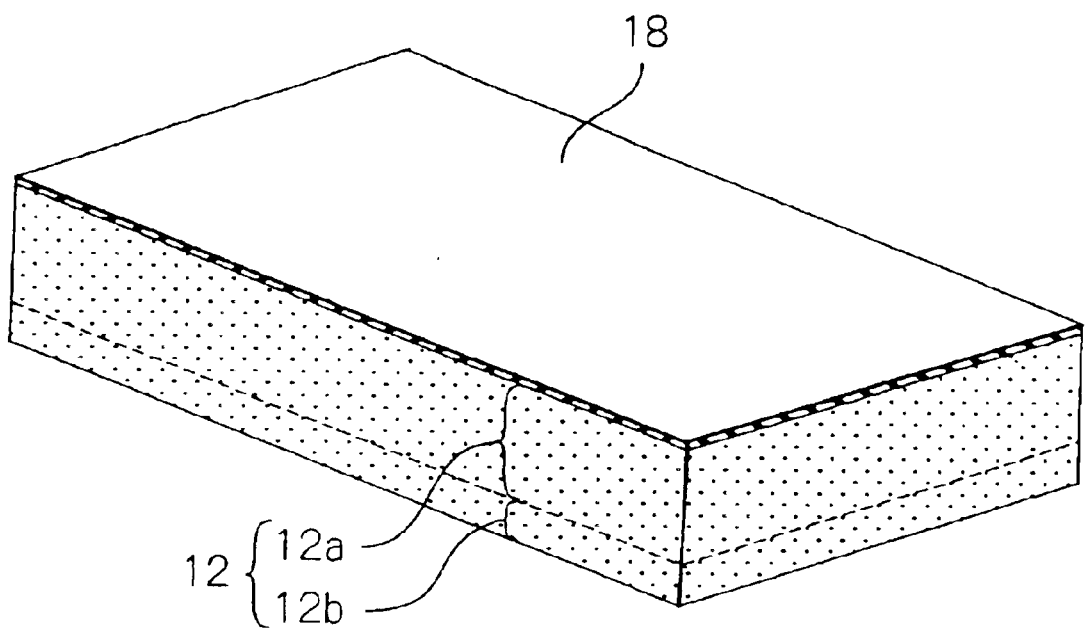
FIGS. 13A through 24 are fragmentary perspective views demonstrating a series of steps for producing the semiconductor memory of the illustrative embodiment.

A specific method of producing the semiconductor memory of the illustrative embodiment will be described with reference to FIGS. 13 through 24. First, as shown in FIG. 13A, the planar substrate 12 of p-type silicon or one-conductivity type semiconductor substrate is prepared. The semiconductor substrate 12 is made up of the p+ substrate 12b (boron concentration of $4.0 \times 10^{18}$ cm$^{-2}$) and p-type epitaxial layer 12a (boron concentration of $1.0 \times 10^{15}$ cm$^{-2}$) formed on the substrate 12b. A silicon thermal oxide layer 18 is formed on the semiconductor substrate 12 beforehand.

Figure 13B:
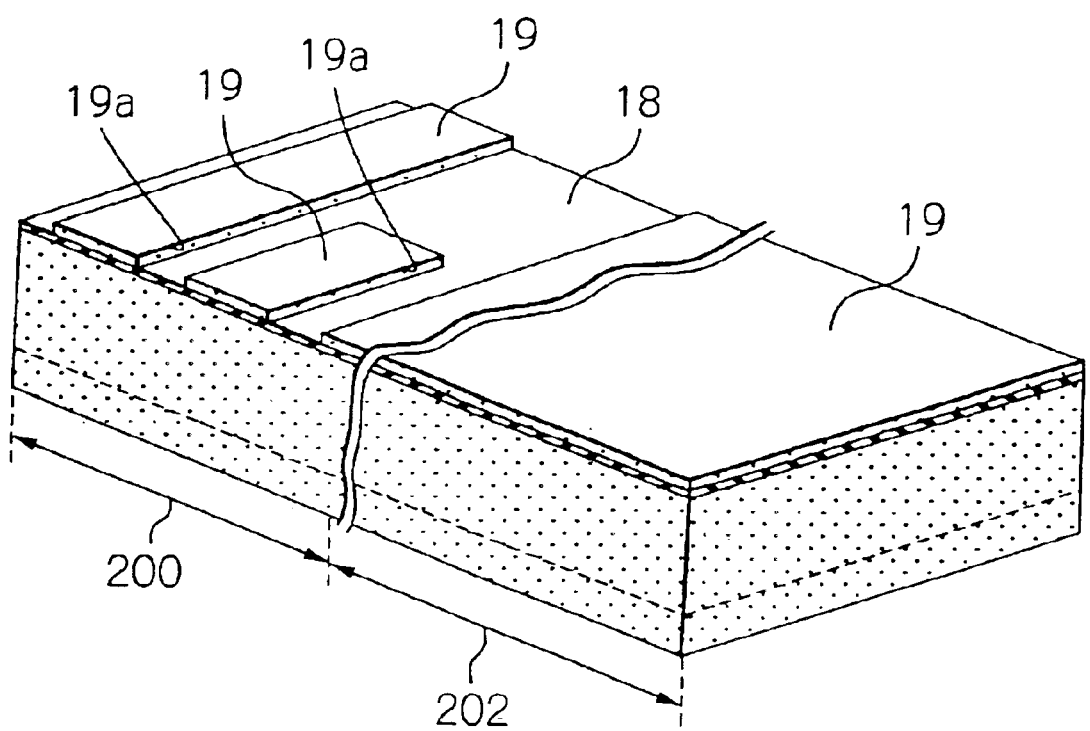

Subsequently, as shown in FIG. 13B, the silicon nitride layer 19 is formed on the silicon thermal oxide layer 18 and then patterned to form an aperture 19a.

In the illustrative embodiment, the production of the cell transistors can be executed in parallel with the production of a CMOS transistors. A procedure for producing CMOS transistors will be described hereinafter together with the procedure for producing the cell transistors. In the figures, a CMOS transistor portion 200 refers to a portion allocated to a CMOS transistor to be formed later while a cell transistor portion 202 refers to a portion allocated to the cell transistor. The aperture 19a is included a preselected portion of the CMOS transistor portion 200.

Figure 14A:
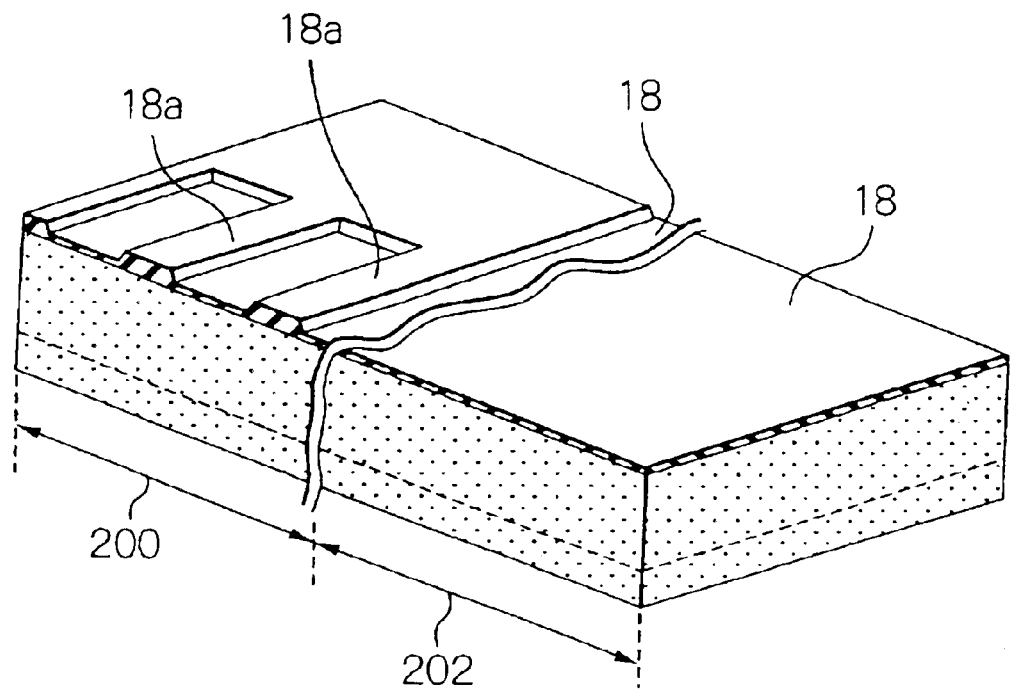

Subsequently, as shown in FIG. 14A, a field oxide layer 18 is formed. More specifically, the field oxide layer 18a is caused to grow with the silicon nitride layer 19 (see FIG. 13B) serving as a mask. After the growth of the field oxide layer 18a, the silicon nitride layer 19 is removed by etching.

Figure 14B:
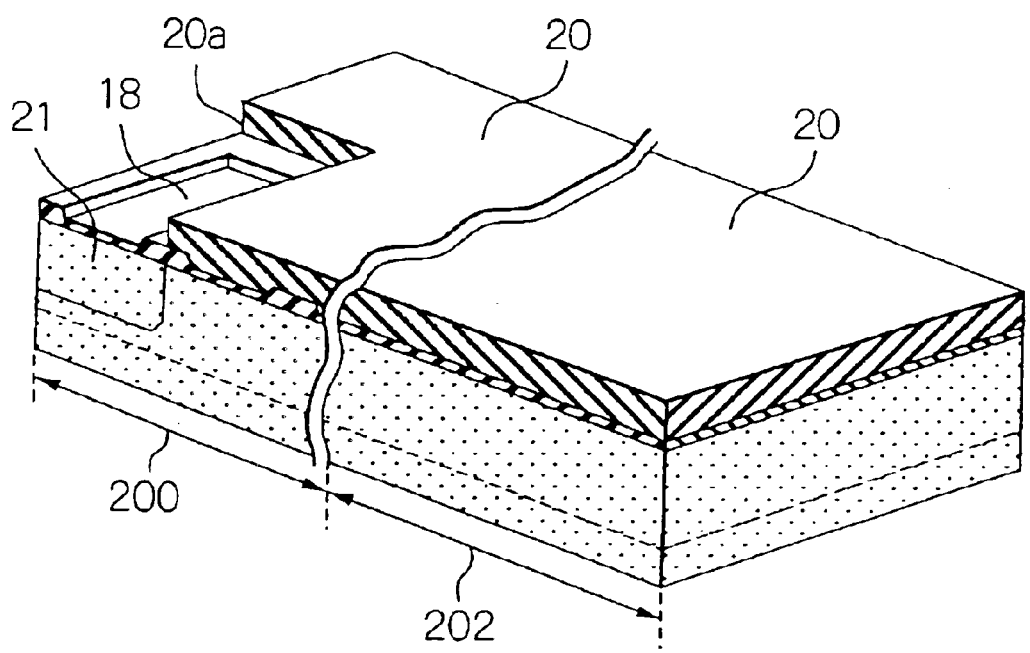

After the step of FIG. 14A, as shown in FIG. 14B, a photoresist 20 is coated on the entire surface of the laminate and then exposed and developed to form an aperture 20a. Subsequently, arsenic ions are implanted over the photoresist or mask 20 to thereby form an n-type well 21 beneath the aperture 20a. Thereafter, the photoresist 20 is removed.

Figure 15A:
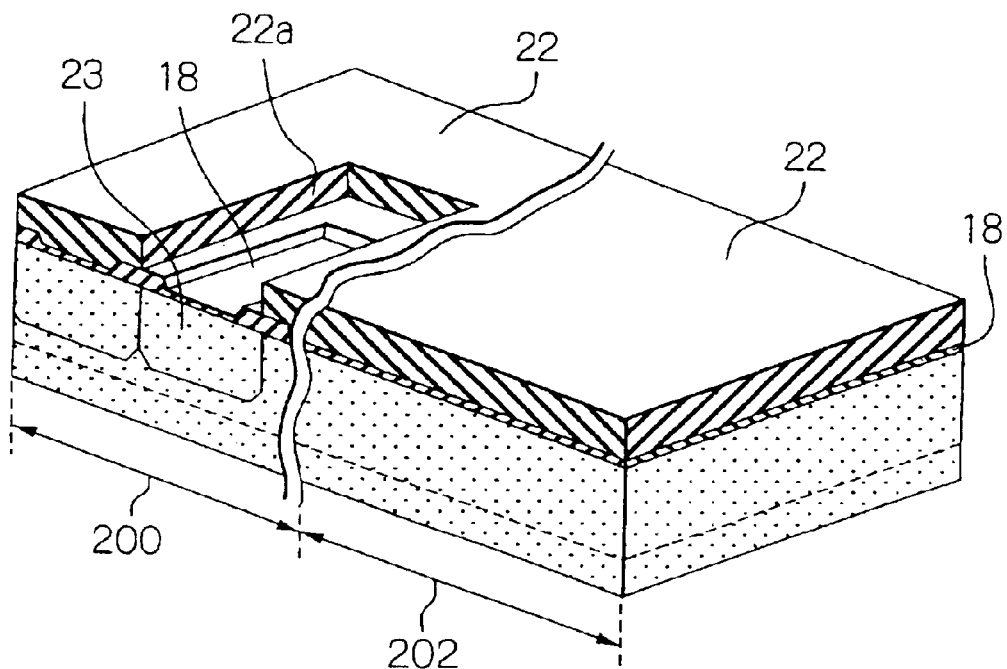
Figure 15B:
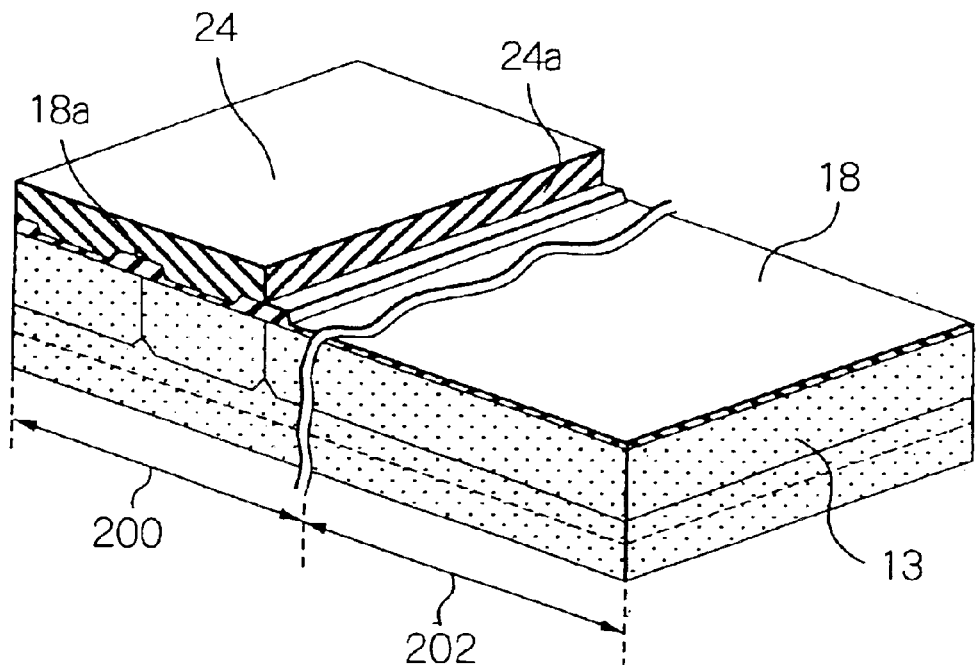

As shown in FIG. 15A, after the formation of the N well 21, a photoresist layer 22 is newly coated on the entire surface of the laminate and then exposed and developed to form an aperture 22a. Subsequently, boron ions are implanted via the photoresist or mask 22 to thereby form a p-type well 23 beneath the aperture 22a. Thereafter, the photoresist 22 is removed.

After the step of FIG. 15 A, a photoresist 24 is coated on the entire surface of the laminate and then exposed and developed to form an aperture 24 a, which is positioned at the top of the cell transistor portion 202. Ions are implanted via the photoresist or mask 24 to thereby form the p-type well 13. More specifically, ions are implanted four consecutive times under the following conditions:

| | |
|---|---|
| first time | ion seed: $BF_2$ |
| | acceleration energy: 15 (keV) |
| | dose: $5.0 \times 10^{11}$ (cm$^{-2}$) |
| second time | ion seed: $BF_2$ |
| | acceleration energy: 45 (KeV) |
| | dose: $5.0 \times 10^{11}$ (cm$^{-2}$) |
| third time | ion seed: B (boron) |
| | acceleration energy: 20 (KeV) |
| | dose: $6.0 \times 10^{12}$ (cm$^{-2}$) |
| fourth time | ion seed: B (boron) |
| | acceleration energy: 40 (Kev) |
| | dose: $5.0 \times 10^{12}$ (cm$^{-2}$) |

Figure 31:
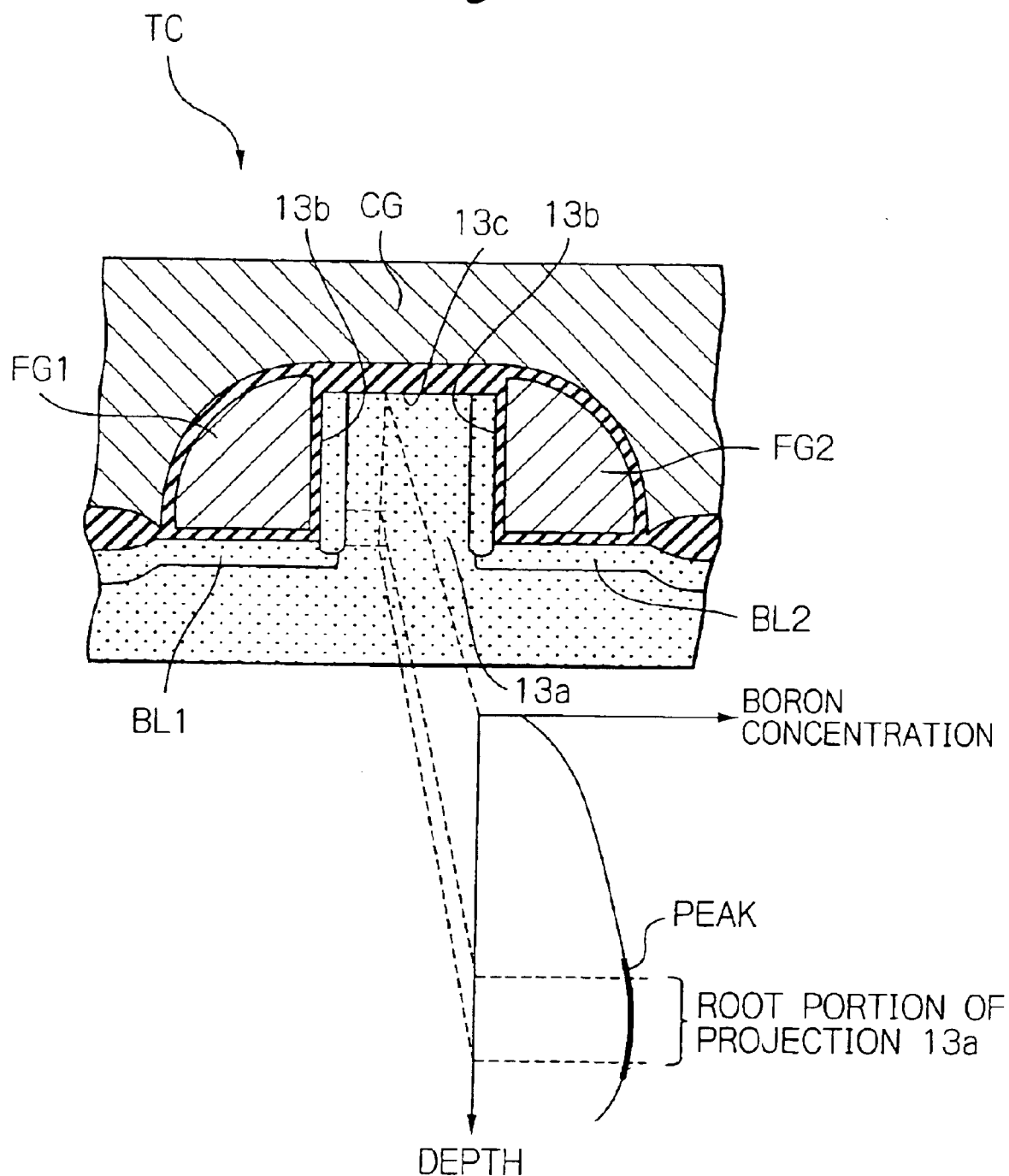
FIG. 31 is a graph showing a relation between the depth of a P well, as measured from a surface, and boron concentration in a method for producing the semiconductor memory embodying the present invention.

The p-type well 13 subjected to the four times of ion implantation has a boron concentration distribution shown in FIG. 31. Specifically, FIG. 31 shows a relation between the depth of the p well 13, as measured from the surface, and the boron concentration.

In FIG. 31, net boron concentration is represented by an envelope (solid curve) enveloping the boron concentrations of the consecutive times of ion implantation (dotted lines). As shown, the boron concentration distribution has a peak (bold portion of the curve). It is preferable to make the peak flat by suitably adjusting the implantation conditions and to cause the flat portion to extend in the direction of depth as far as possible, as will be understood from FIG. 16B to be described later.

Subsequently, as shown in 16A, the silicon thermal oxide layer 18 (see FIG. 15B) is etched out with the field oxide layer 18a being left on the laminate. Subsequently, the surface of the substrate 12 is again subjected to thermal oxidation for thereby forming the gate insulation layer 15c, which is about 10 nm thick.

The silicon nitride layer 25 (e.g. about 10 nm thick), silicon oxide layer 26 (e.g. about 4 nm thick) and silicon nitride layer 27 (e.g. about 50 nm) are sequentially formed on the gate insulation layer 15c. The functions of such layers, which are formed by a conventional CVD (Chemical Vapor Deposition) method, will be understood from the description of steps to follow.

Figure 16A:
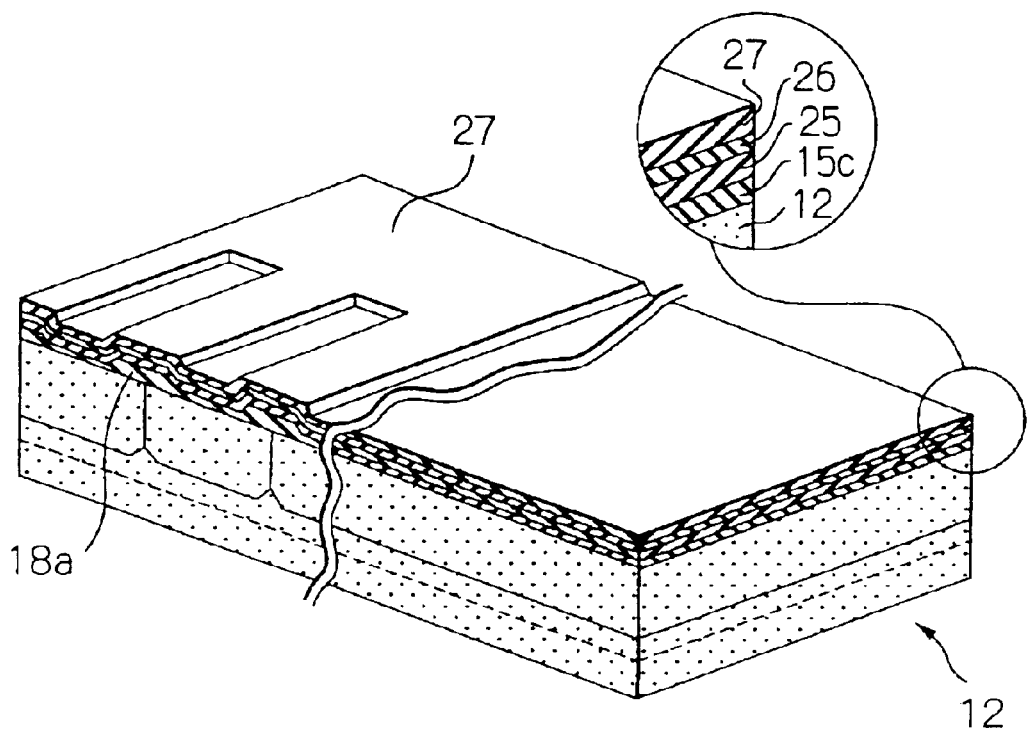
Figure 16B:
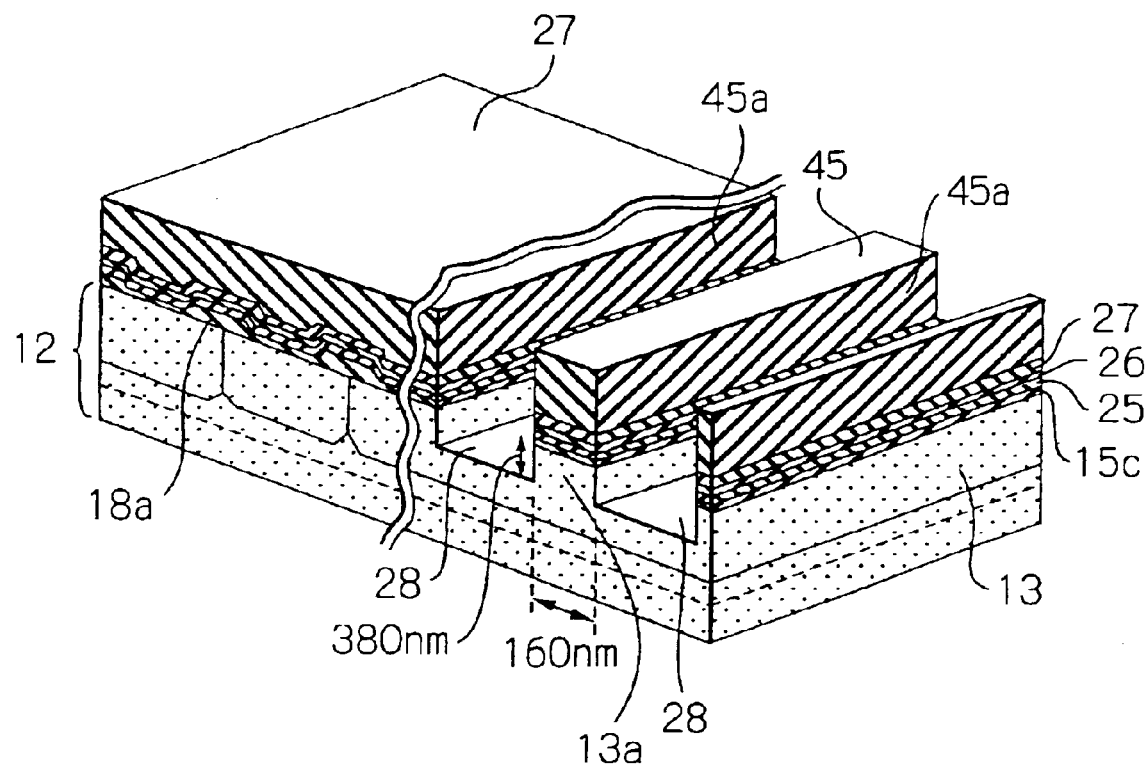

As shown in FIG. 16B, a photoresist 45 is coated on the silicon nitride layer 27 positioned on the top of the above laminate. The photoresist 45 is then exposed and developed to form stripe-like apertures 45a. Subsequently, etching is effected over the photoresist or mask 45 to thereby open the silicon nitride layers 25 and 27, silicon oxide layer 26, and gate insulation layer 15c. Thereafter, the p-type silicon substrate 12 is etched via the openings of the above layers so as to form trenches 28.

More specifically, the trenches 28 are formed such that their bottoms coincide with the peak of the boron concentration (FIG. 31). The peak of the boron concentration is made flat and extends as deep as possible in the step of FIG. 15b, as stated earlier. Therefore, the bottom of each trench 28 can surely coincide with the peak of the boron concentration even if the depth of the trench 28 is inaccurate for process reasons.

By the procedure described so far, there are formed the projections 13a each having high boron concentration at its root portion (see FIG. 30). Although impurity concentration at the root portion has great influence on the threshold voltage $V_{th}$, the threshold voltage $V_{th}$ is prevented from varying because the bottom of each trench 28 surely coincides with the peak of the boron concentration.

Referring again to FIG. 16b, While the size of each trench 28 is open to choice, the trench 28 is about 380 nm in the illustrative embodiment. Also, the distance between nearby trenches 28, i.e., the width of the projection 13a is about 160 nm. After the formation of the trenches 28, the photoresist 45 is removed.

Figure 17A:
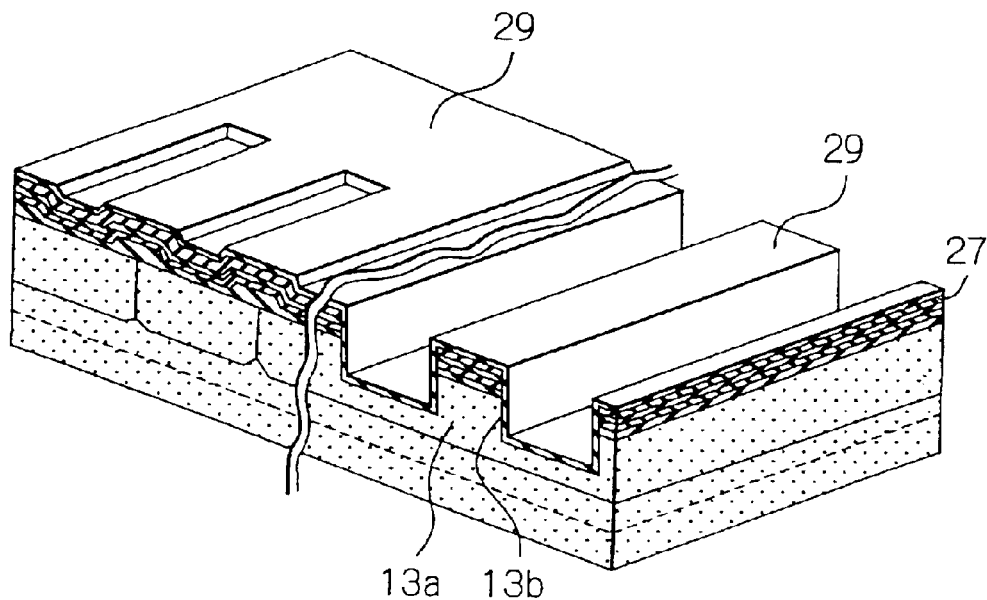
Figure 17B:
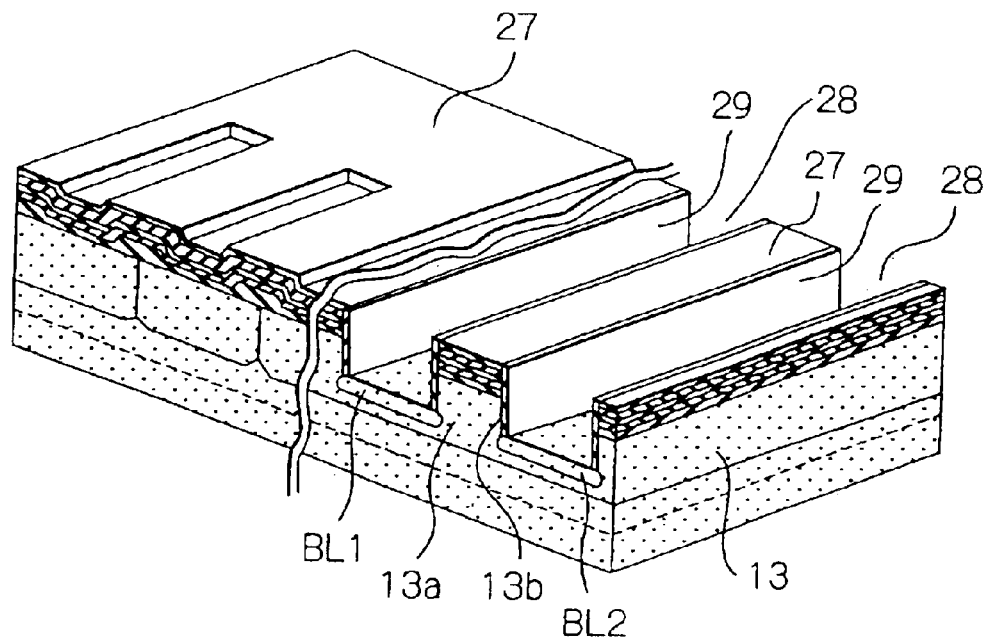

Subsequently, as shown in FIG. 17A, the silicon oxide layer 29 (about 20 nm thick) is formed on the entire exposed surface of the laminate by the CVD method. Thereafter, as shown in FIG. 17B, the silicon oxide layer 29 is subjected to anisotropic etching in the direction of thickness by RIE (Reactive Ion Etching). As a result, the silicon oxide layer 29 is removed except for part thereof present on the side walls 13b of the projection 13a.

After the removal of the silicon oxide layer 29, arsenic ions are implanted to form the bit lines BL1 and BL2 in the bottoms of the trenches 28. At this instant, the silicon oxide layer 29 left on the side walls 13b prevent arsenic ions from being implanted in the side walls 13b. Further, the projection 13a, which serves as a mask, allows the bit lines BL1 and BL2 to be formed in the bottoms of the trenches 28 by a self-alignment process. The arsenic ions are implanted under the following conditions:

ion seed: As (arsenic)

acceleration energy: 15 (KeV)

dose: $2.0 \times 10^{14}$ cm$^{-2}$

After the implantation of arsenic ions, the silicon oxide layer 29 present on the side walls 13a are etched by about 10 nm to be thinned thereby. Because the etched silicon oxide layer 29 is extremely thin, it is not shown in the figures to follow.

Figure 18A:
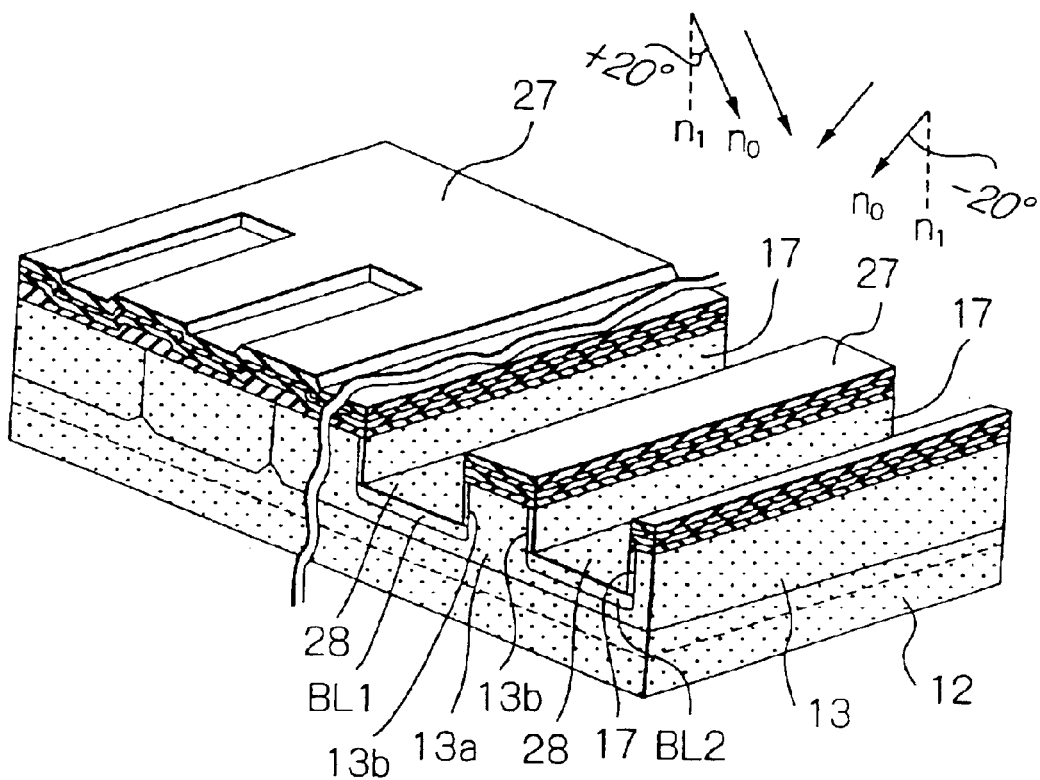

FIG. 18A shows a step to be executed after the step of FIG. 17B. As shown, arsenic ions are implanted in the side walls 13b of the projection 13a to thereby form the n-type regions 17 of counter-conductivity type on the side walls 13b. This implantation can be done if the substrate 12 is tilted relative to the direction of implantation. In the illustrative embodiment, a line $n_1$ normal to the p-type silicon substrate 12 is inclined by about +/−20° relative to the direction $n_0$ of implantation. At this time, arsenic ions are implanted under the following conditions;

ion seed: As (arsenic)

acceleration energy: 10 (KeV)

dose: $5.0 \times 10^{11}$ (cm$^{-2}$)

It is noteworthy that the thin silicon oxide layer 29 present on the side walls 13b (see FIG. 17B) prevents the arsenic ions from being excessively implanted in the side walls 13b.

The surface layers of the trenches 28 are expected to implement the channel of the device, so that the property of the surface layers has critical influence on the device characteristics. It is therefore necessary to protect the surfaces of the trenches 28 from contamination in the steps to follow.

Figure 18B:
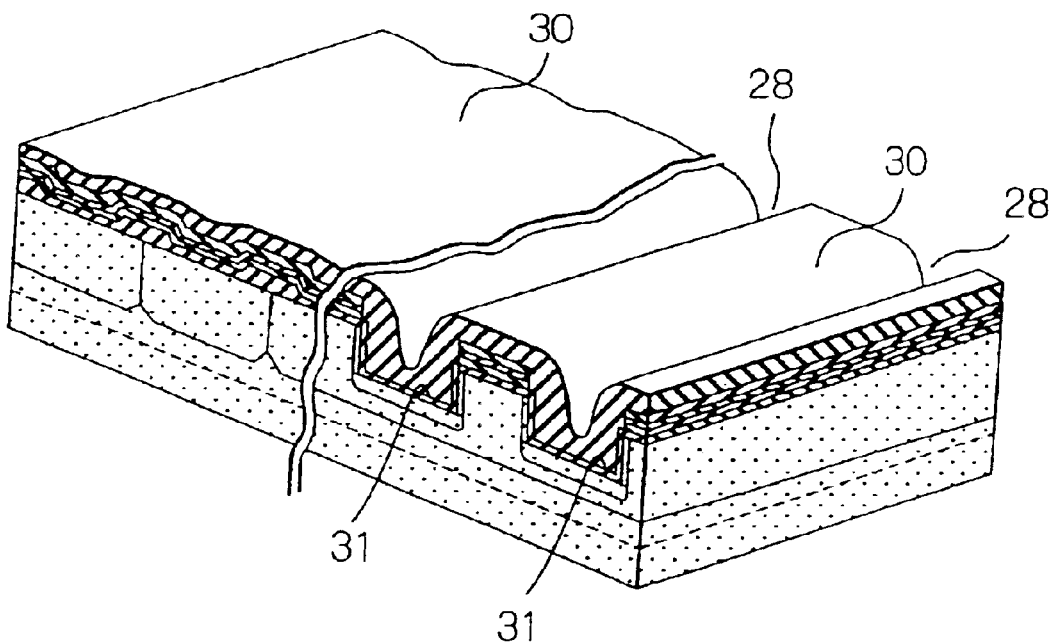

To meet the above demand, as shown in FIG. 18B, the illustrative embodiment forms an about 4 nm thick, sacrifice silicon oxide layer 31 on the sides and bottoms of the trenches 28 by thermal oxidation.

The sacrifice silicon oxide layer 31 successfully protects the surfaces of the trenches 28 from contamination. Moreover, this layer 31 serves to remove a lattice defect particular to the surface layers of the trenches 28, thereby preventing the device characteristics from being degraded. Subsequently, an about 60 nm thick, silicon oxide layer (i.e. mask) 30 is formed on the entire exposed surface of the laminate inclusive of the inside of the trenches 28 by CVD.

Figure 19A:
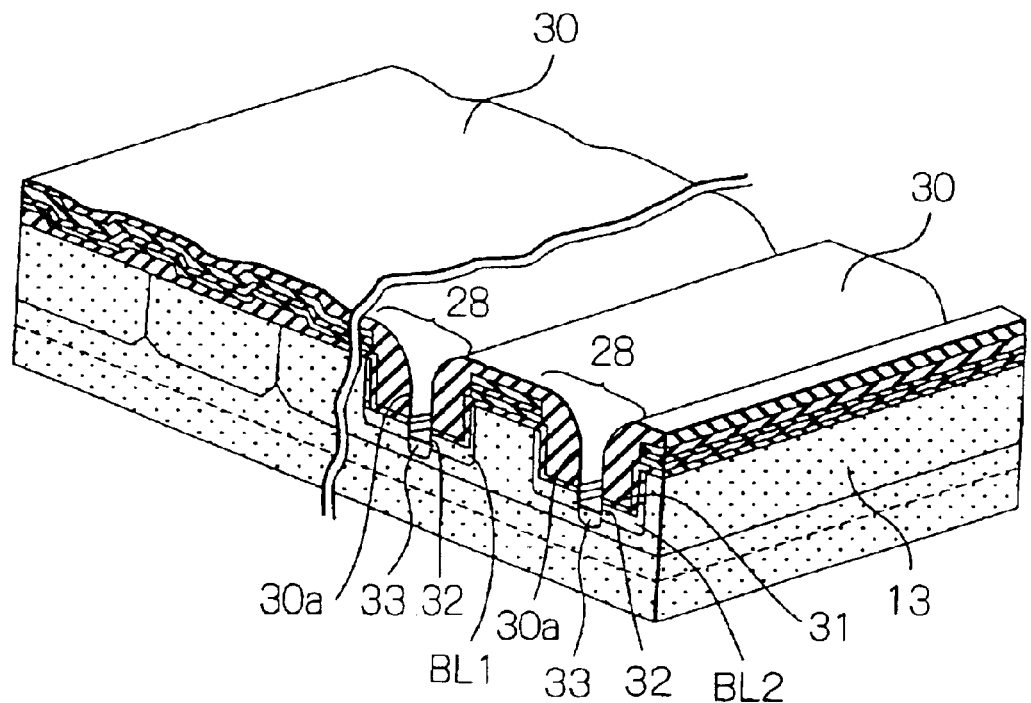

As shown in FIG. 19A, after the step of FIG. 18B, the silicon nitride layer 30 is subjected to anisotropic etching in the direction of thickness in order to form elongate grooves 30a. Subsequently, the sacrifice silicon oxide layer 31 and part of the bit lines BL1 and BL2 are selectively etched with the silicon nitride layer 30 serving as a mask. As a result, recesses 32 are formed in the bit lines BL1 and BL2 to a depth of about 10 nm each.

Figure 19B:
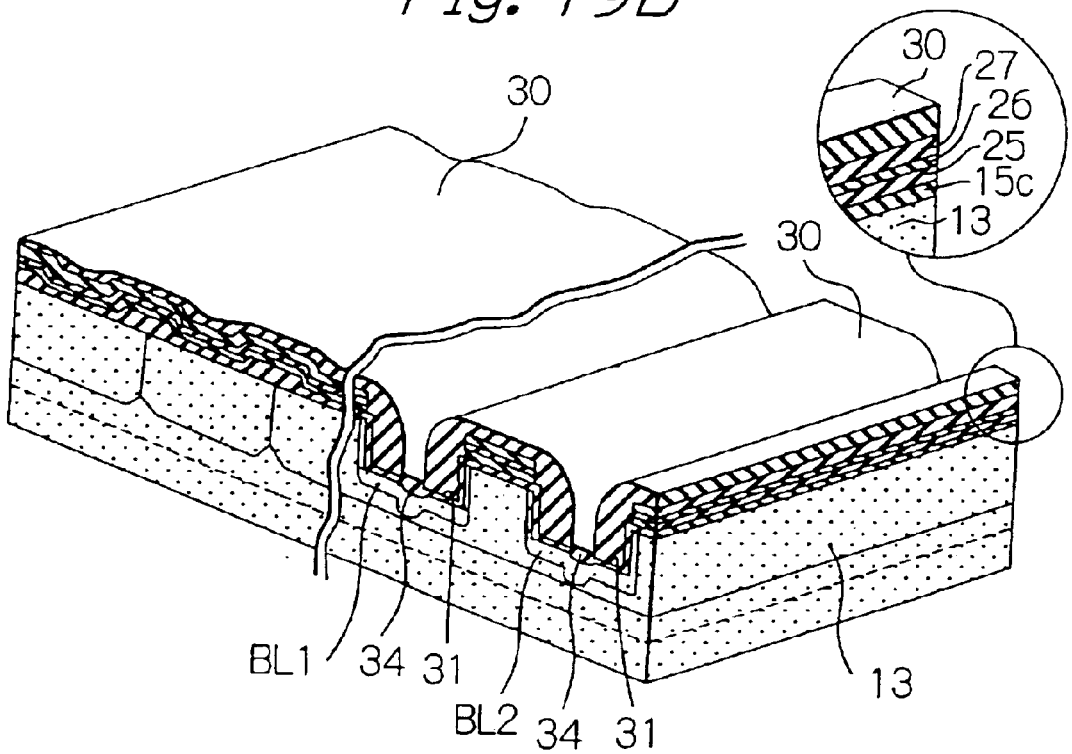

After the recesses 32 have been formed, arsenic ions are implanted in the bit lines BL1 and BL2 via the grooves 30a in order to lower the resistance of the bit lines BL1 and BL2. In FIG. 19A, the portions where the arsenic ions are implanted ($N^+$ regions) are designated by the reference numeral 33. At this time, the arsenic ions are implanted under the following conditions:

ion seed: As (arsenic)
acceleration energy: 30 (KeV)
dose: $3.0 \times 10^{15}$ cm$^{-2}$ Subsequently, as shown in FIG. 19B, the recesses 32 are selectively oxidized with the silicon nitride layer 30 serving as a mask, thereby forming the selective oxide layers 34. After this step, the silicon nitride layers 27 and 30 are removed by etching. At this instant, the silicon oxide layer 26 and sacrifice silicon oxide layer 31 play the role of an etching stopper. Subsequently, the silicon oxide layer 26 is removed by etching with the silicon nitride layer 25 serving as an etching stopper. This etching is effected to such a degree that the silicon oxide layer 26 is fully removed, but the selective oxide layers 34 remain.

Figure 20A:
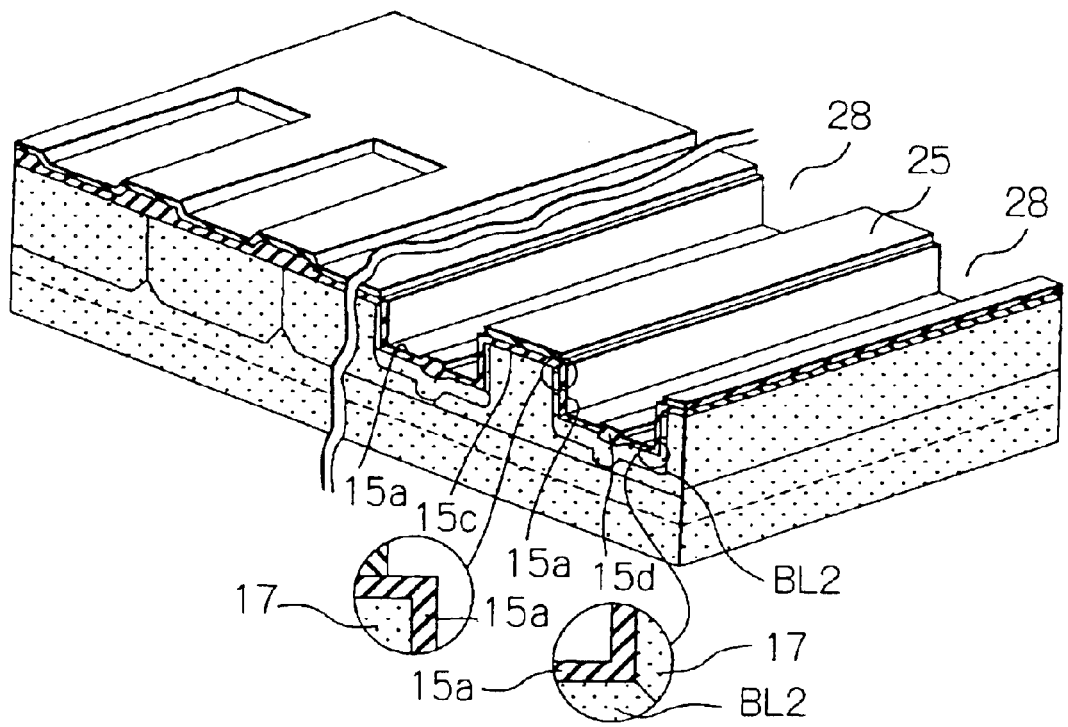

FIG. 20A shows a step to follow the step of FIG. 19B. As shown, the bottoms and sides of the trenches 28 are again oxidized to form tunnel insulation layers 15a (about 6 nm thick). The tunnel insulation layers 15a should preferably be provided with desirable property because their property has critical influence on the device operation.

For this purpose, the illustrative embodiment forms the tunnel insulation layers 19a by using plasma oxidation, which is implemented by a microwave excited, high density plasma device using a radial line slot antenna, and introducing a krypton (Kr) and oxygen ($O_2$) mixture gas in the plasma device.

In the plasma device mentioned above, Kr excited by a microwave hits against oxygen ($O_2$) for thereby generating a great amount of atomic state oxygen O*. The atomic state oxygen O* easily enters the surface layers of the trenches 28 and oxidizes the bottoms and sides of the trenches 28 at substantially the same rate without regard to the plane direction. Consequently, the tunnel insulation layers 15a having uniform thickness are formed in the corner portions of the trenches 28, as indicated in an enlarged view in circles. For details of plasma oxidation, reference may be made to, e.g., Paper No. 29p-YC-4, The 48 th Joint Meeting of Engineers of Applied Physics and Japanese patent laid-open publication No. 2001-160555.

Figure 20B:
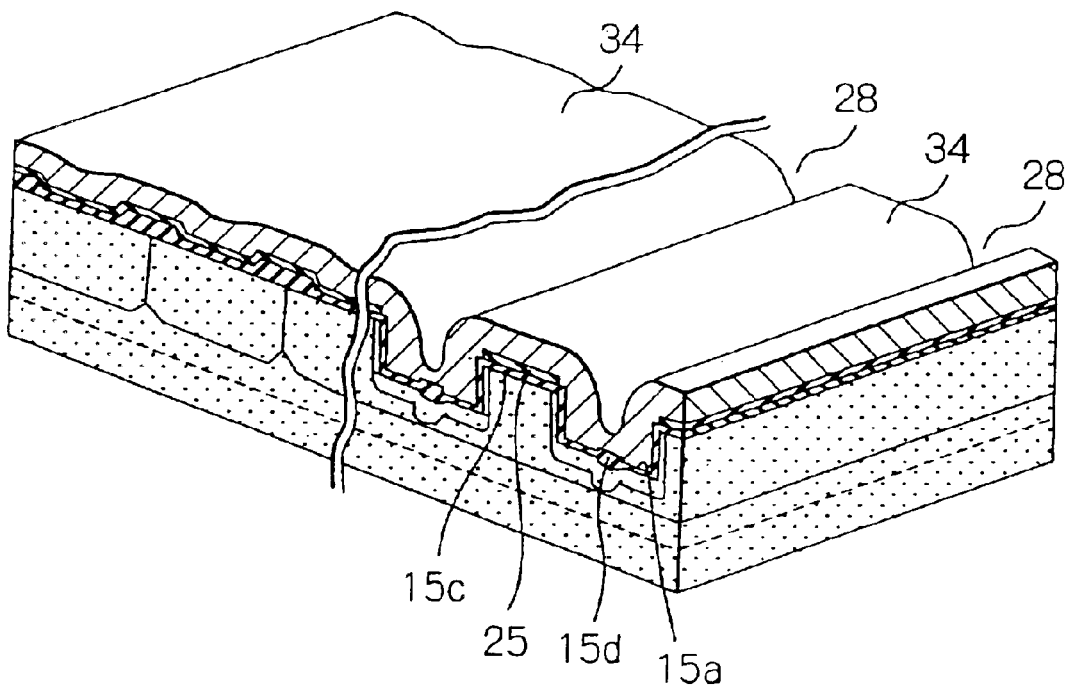

FIG. 20B shows a step to follow the step of FIG. 19B. As shown, the polycrystalline silicon layer 34, which is about 50 nm thick, is formed on the tunnel insulation layers 15a and silicon nitride layer 25. The polycrystalline silicon layer 34 is doped with phosphor (P) by an in-situ process beforehand.

Figure 21A:
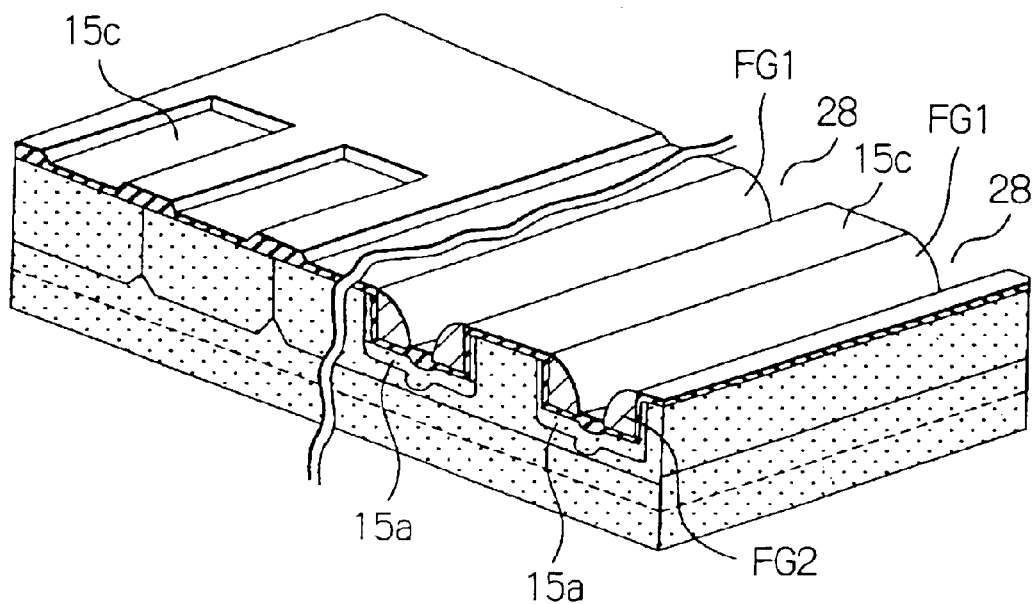

Subsequently, as shown in FIG. 21A, the polycrystalline silicon layer 34 is anisotropically etched in the direction of thickness. As a result, the polycrystalline silicon layer 34 on the tunnel insulation layers 15a is removed, but is left on the tunnel insulation layers 15a on the sides of the trenches 28. The polycrystalline silicon layer 34 on the sides of the trenches 28 constitute the floating gates FG1 and FG2. Thereafter, the silicon nitride layer 25 is removed by etching.

Figure 21B:
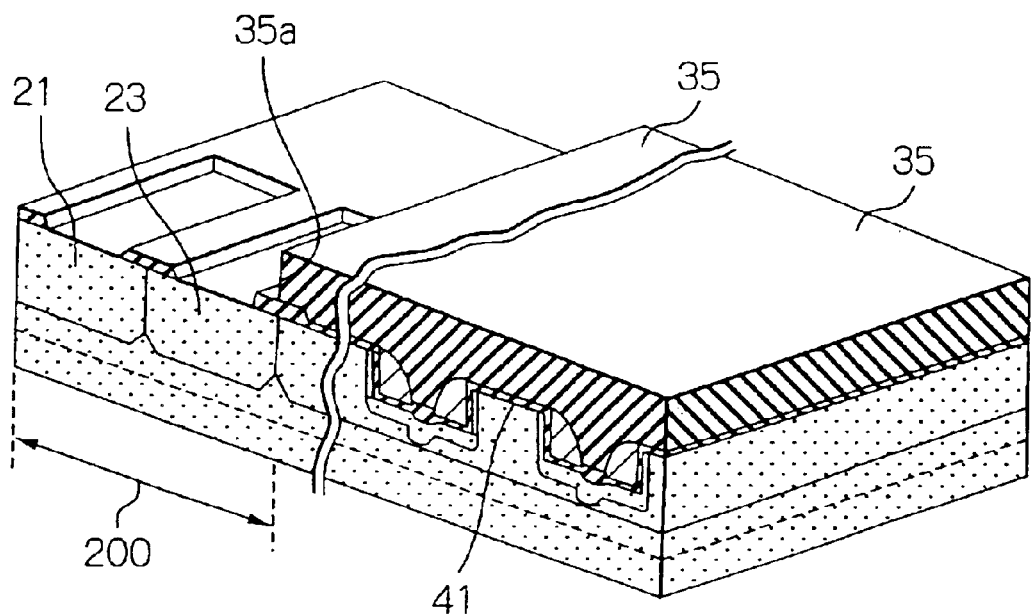

Subsequently, as shown in FIG. 21B, a photoresist 35 is coated on the entire surface of the laminate and then exposed and developed to form an aperture 35a in the CMOS transistor portion 200. Thereafter, the gate insulation layer 15c in the CMOS transistor portion 200 is etched with the photoresist 35 serving as a mask, thereby causing the surfaces of the n-type well 21 and p-type well 23 to be exposed to the outside.

Figure 22A:
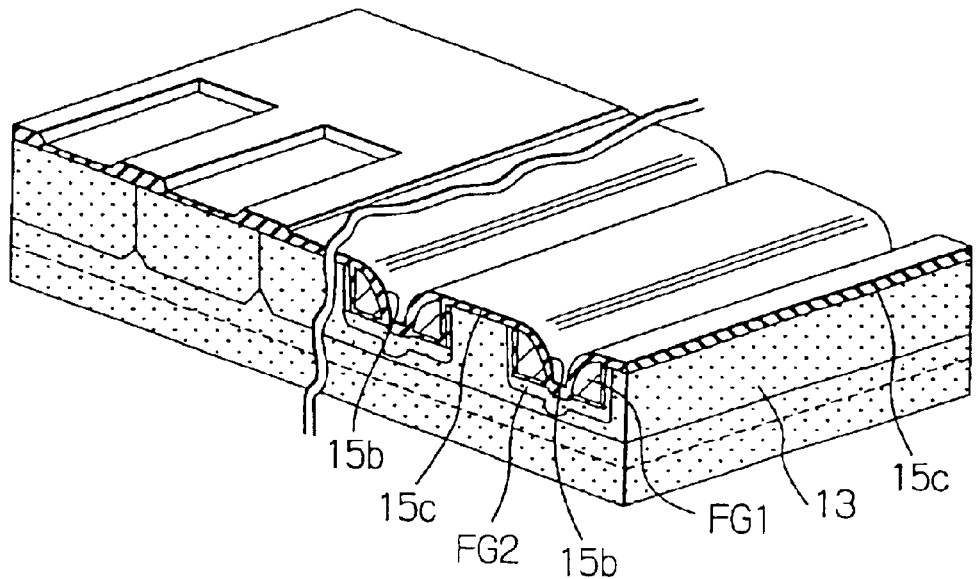

As shown in FIG. 22A, after the photoresist layer 35 has been removed, the entire exposed surface of the laminate is oxidized by plasma oxidation stated previously. This oxidizes silicon beneath the gate insulation layer 15c and thereby increases the thickness of the layer 15c. At the same time, the surfaces of the floating gates FG1 and FG2 are oxidized to form the inter-polycrystalline insulation layers 15b, which are about 8 nm thick each.

The floating gates FG1 and FG2 are formed of polycrystalline silicon, so that numerous crystal particles different in plane direction are formed on the surface of the floating gates FG1 and FG2. However, plasma oxidation allows a silicon oxide layer to be uniformly formed without regard to the plane direction. This obviates an occurrence that the inter-polycrystalline insulation layer 15b is locally thinned and has its insulation characteristic deteriorated at thinner portions. This advantage is achievable even when polycrystalline silicon is doped with phosphor (P).

Figure 22B:
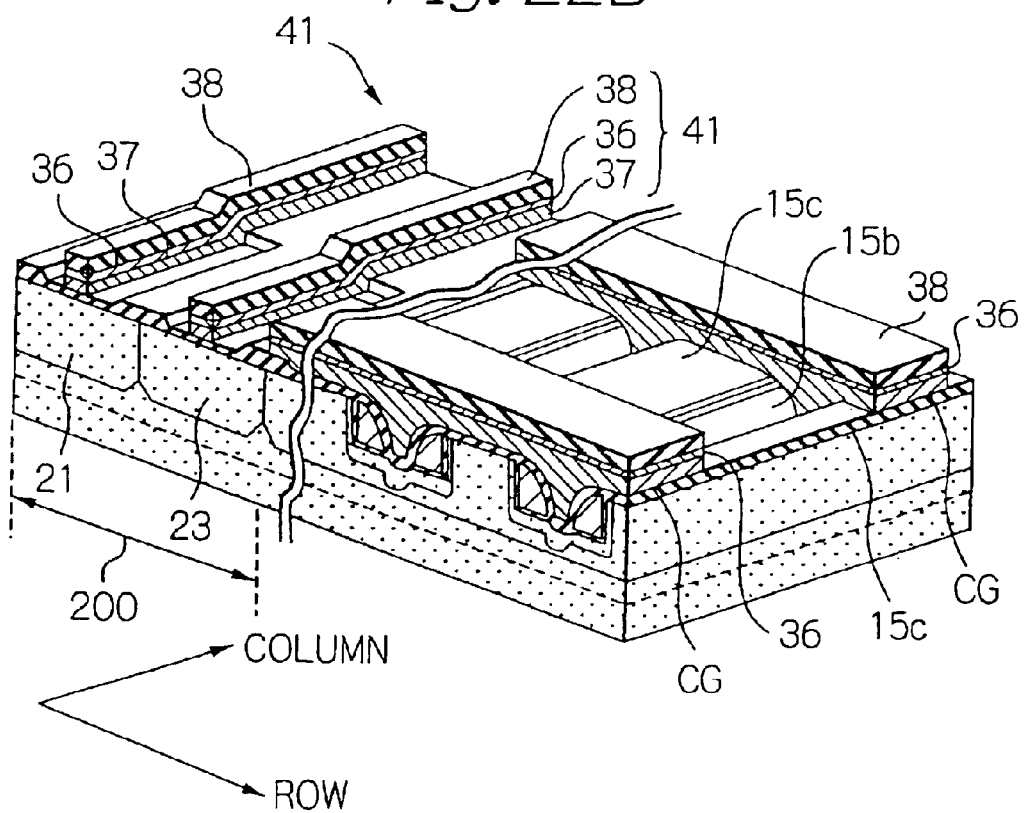

FIG. 22B shows a step to be executed after the step of FIG. 22A. As shown, a polycrystalline silicon layer, which is expected to constitute the control gate CG, is formed on the entire exposed surface of the laminate. The polycrystalline silicon layer is doped with phosphor (P) by an in-situ process beforehand. Subsequently, a WSi layer 36 is formed on the polycrystalline silicon layer. Further, a cap layer 38 implemented as a silicon oxide layer is formed on the WSi layer 36. Thereafter, such layers lying one above the other are patterned to produce the structure shown in FIG. 22B.

By the step of FIG. 22B, a plurality of control gates CG are formed integrally with each other in the direction of row. At the same time, gate electrodes 41 are formed above the p-type well 23 and n-type well 21, respectively. The gate electrodes 41 each are mainly implemented by the polycrystalline silicon layer 37 and have resistance thereof lowered by the WSi layer 36. The WSi layer 36 also present in each control gate CG lowers the resistance of the control gate as well CG.

Figure 23A:
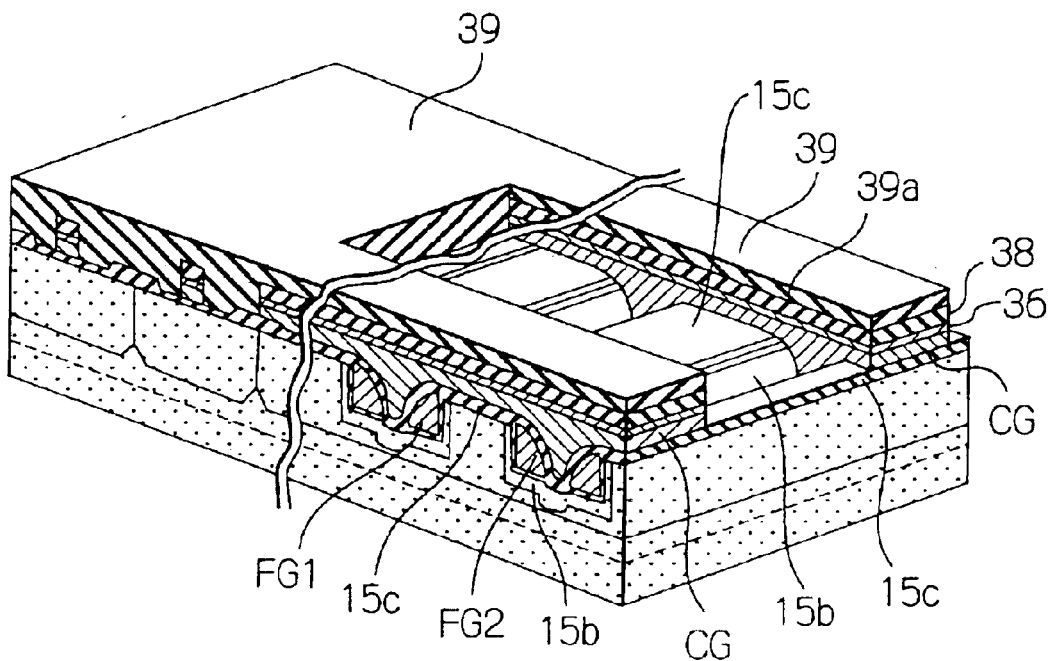

As shown in FIG. 23A, after the step of FIG. 22B, a photoresist 39 is coated on the entire surface of the laminate and then exposed and developed to form an aperture 39a between the adjoining control CG gates.

Figure 23B:
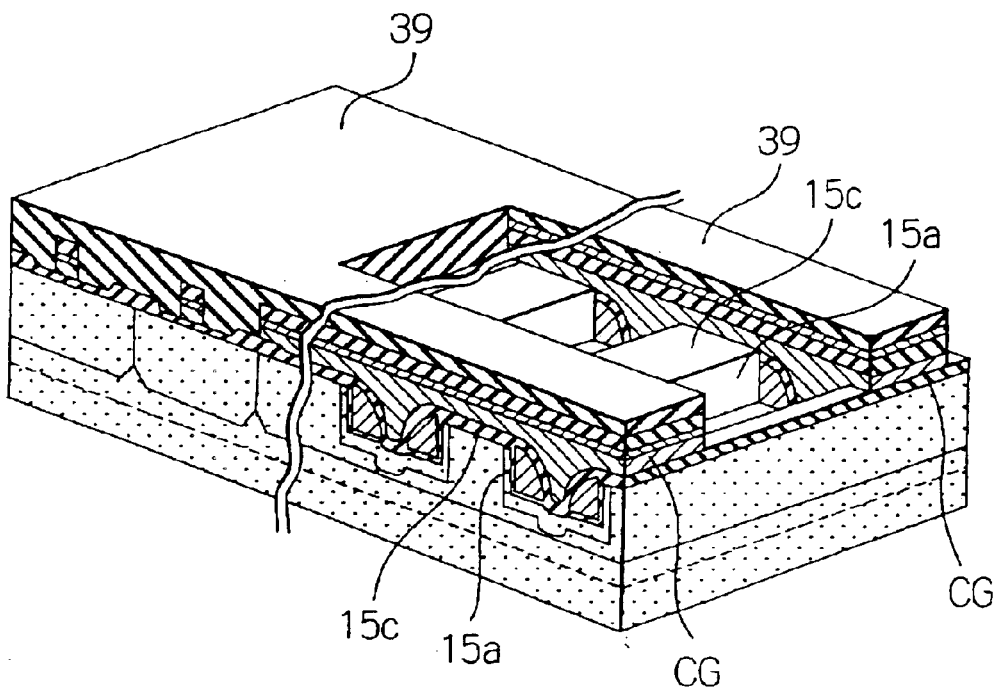

Subsequently, as shown in FIG. 23B, the portions of the inter-polycrystalline insulation layers 15b not covered with the control gates CG are removed by etching with the photoresist layer 39 serving as a mask. At this instant, the gate insulation layers 15c between the control gates CG are slightly etched. Thereafter, the portions of the floating gates FG1 and FG2 not covered with the control gates CG are removed by etching using a different etchant. As a result, the tunnel insulation layers 15a are exposed to the outside between the adjoining control gates CG.

Figure 24:
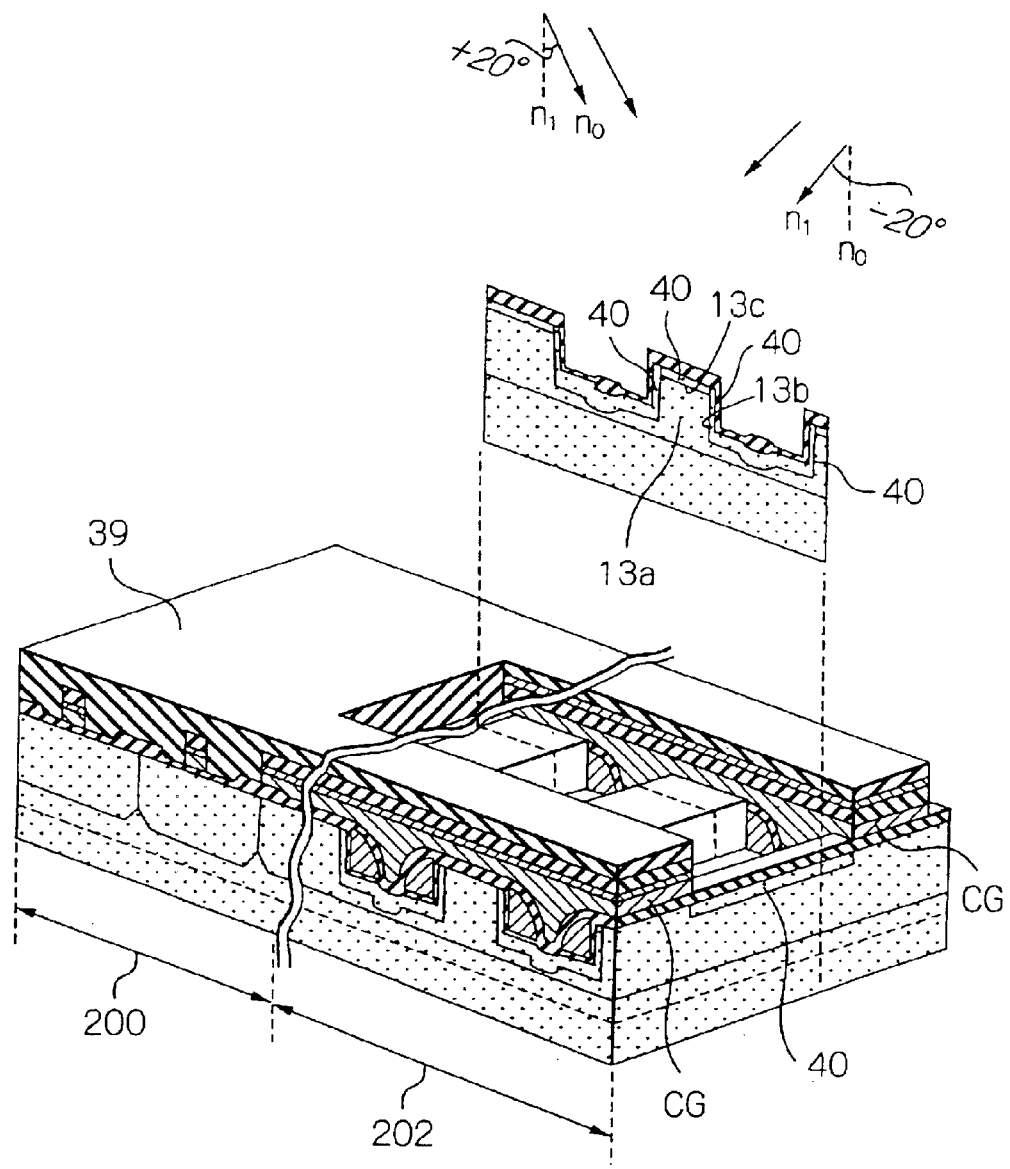

Finally, as shown in FIG. 24, isolation regions 40 are formed on the side walls 13b and top 13c of each projection 13a not covered with the control gates CG. While the side walls 13b and top 13c form a channel below the associated control gate CG, the isolation region 40 electrically isolates such channels below nearby control gates CG.

To form the isolation regions 40, boron ions are implanted via the photoresist layer or mask 39. At this instant, the substrate 12 is tilted relative to the direction of implantation such that the isolation regions 40 are formed on the side walls 13b of the projections 13a. In the illustrative embodiment, the line $n_1$ normal to the p-type silicon substrate 12 is tilted by about +/−20° relative to the direction of implantation $n_0$, as stated earlier. The ions are implanted under the following conditions:

seed: $BF_2$
acceleration energy: 20 (KeV)
dose: $1.0 \times 10^{13}$ $cm^{-2}$

Subsequently, the photoresist layer 39 is removed to complete the semiconductor memory 10 shown in FIG. 1. The CMOS portion 200 is completed with source/drain regions formed at preselected positions.

An alternative embodiment of the present invention will be described hereinafter. One of characteristic features of the illustrative embodiment is the overdeletion of a memory cell. The illustrative embodiment pays attention to the fact that by overdeleting charges stored in a floating gate to substantially less than or equal to zero, it is possible to enhance efficient and therefore rapid writing.

The illustrative embodiment is concerned with a semiconductor memory in which a floating gate is positioned in only part of a channel region between two regions of opposite conductivity types. Therefore, by grounding a control gate, it is possible to interrupt a current with the portion of the channel region where the floating gate is absent and therefore to prevent a current from flowing to an unselected memory cell in, e.g., the read mode. This is because a current does not flow when the control gate of an unselected memory cell is grounded in, e.g., the read mode. In addition, the current window margin (i.e. potential difference between the time when charges are stored in the floating gate and the time when they are not stored) is widened.

In the embodiment, the overdeletion is implemented by effecting the deletion mentioned above for a period of time (for example, for 5 millisecond) when the memory cell to be deleted reaches an overdeleting state. On the elapse of such a period, the floating gate is overdeleted to such a degree that the deleting operation saturates. The floating gate establish a stable charge depletion state (electron depletion state or hole storage state). The size of the FN current is almost zero, and the positive charges are not stored in the floating gate anymore.

The semiconductor memory of the illustrative embodiment will be described more specifically hereinafter. The structural elements of the illustrative embodiment identical with those of the previous embodiment are designated by identical reference numerals and will not be described specifically in order to avoid redundancy.

Figure 32:
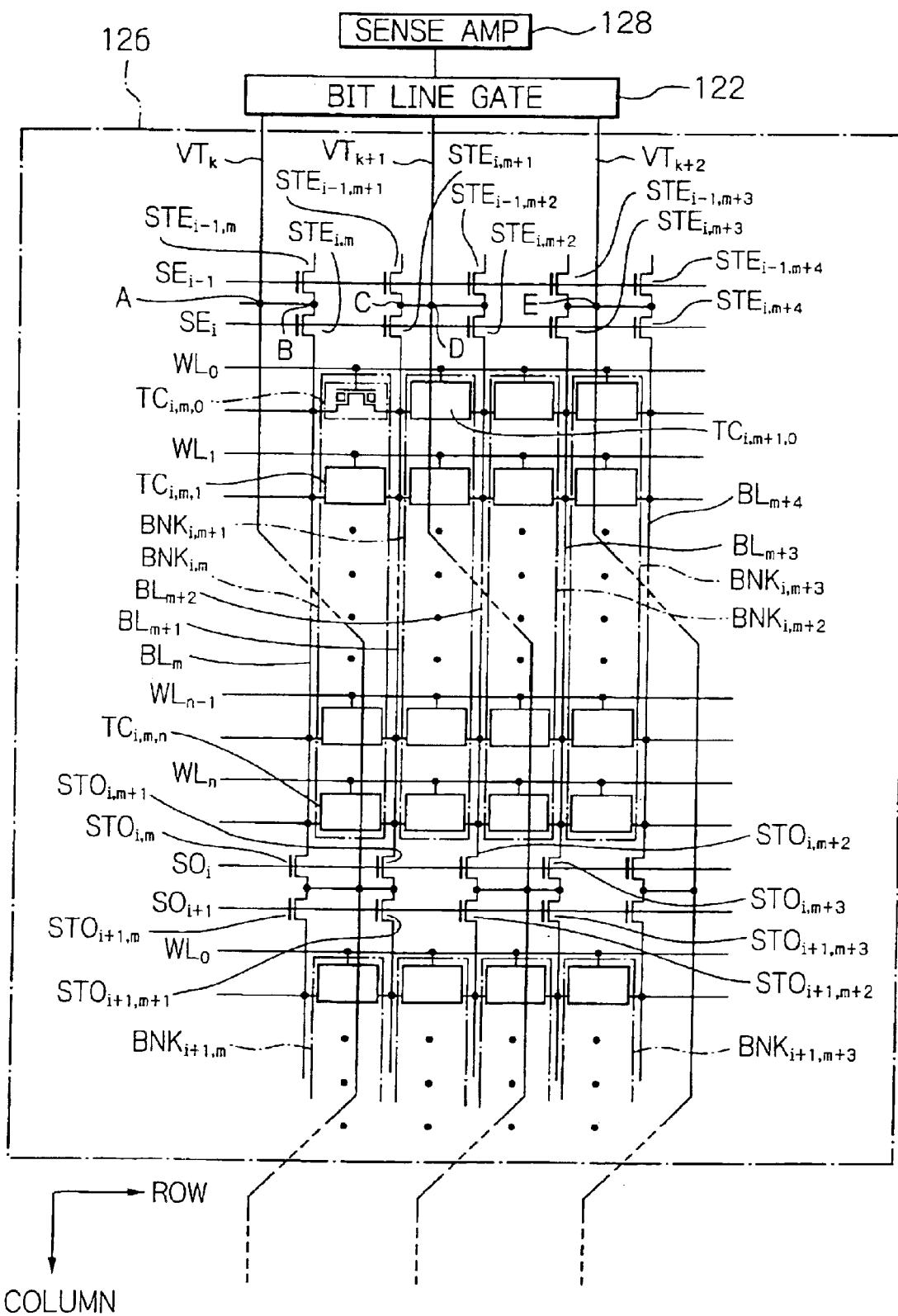
FIG. 32 is a schematic block diagram showing part of the alternative embodiment relating to cell transistors included in the semiconductor memory embodying the present invention.

Referring to FIG. 32, a semiconductor memory array 126 in accordance with the illustrative embodiment is shown and generally designated by the reference numeral 126. Labeled $TC_{i,m,p}$ in FIG. 32 is the p-th (p=0, 1, 2, ... ) cell transistor included in a bank $BNK_{i,m}$ (i=0, 1, 2, ..., m=0, 1, 2, ... ) positioned on the a row i and a column m. The transistor $TC_{i,m,p}$ is identical in configuration and operation with the transistor described with reference to FIG. 2.

The cell transistors $TC_{i,m,p}$ each belong to a particular bank $BNK_{i,m}$ and correspond to the transistor TC described with reference to FIG. 1. The banks $BNK_{i,m}$ each has n cell transistors $TC_{i,m,p}$ arranged in (1 column)×(n rows) where n is a suitable number open to choice. The suffixes i and m attached to each bank $BNK_{i,m}$ are representative of a row number and a column number common to the cell transistors $TC_{i,m,p}$ belonging to the bank $BNK_{i,m}$.

It is a common practice with a flash memory to select a cell transistor on the basis of the combination of a word line and a bit line. By contrast, in the circuitry shown in FIG. 32, either one of a group of even banks $BNK_{i,m}$ (m=0, 2, 4, ... ) and a group of odd banks $BNK_{i,m}$ (m =1, 3, 5, ... ) is selected by use of select lines $SE_i$ or $SO_i$, respectively. Subsequently, by use of a bit line $BL_m$ (m=0, 1, 2, ... ), more precisely a virtual ground line $VT_k$ connected to the bit line $BL_m$, one bank $BNK_{i,m}$ is selected from the group of even or odd banks $BNK_{i,m}$ selected. Thereafter, by use of a word line $WL_p$, one cell transistor is selected from the bank $BNK_{i,m}$ selected. Such a procedure will be described more specifically hereinafter.

One select transistor $STE_{i,m}$ and One select transistor $STO_{i,m}$ are included in each $BNK_{i,m}$ and used to select the bank $BNK_{i,m}$. More specifically, the select transistors $STE_{i,m}$ each are used to select, among the banks $BNK_{i,m}$ on the i-th row, the banks $BNK_{i,m}$ with even column numbers (m=0, 2, 4, ... ) and will sometimes be referred to as an even-bank select transistor. A select line $SE_i$ is used to designate the select transistor $STE_{i,m}$. The select transistors $STE_{i,m}$ (m=0, 1, 2, ... ) arranged on the i-th row all are connected to a single select line $SE_i$, so that the select transistors $STE_{i,m}$ (m=0, 1, 2, ... ) connected to the select line $SE_i$ all are selected via the select line $SE_i$.

Likewise, the select transistor $STO_{i,m}$ is used to select, among the banks $BNK_{i,m}$ on the i-th row, the banks $BNK_{i,m}$ with odd column numbers (m=1, 3, 5, ... ) and will sometimes be referred to as an odd-bank select transistor. A select line $SO_i$ is used to designate the select transistor $STO_{i,m}$. The select transistors $STO_{i,m}$ (m=0, 1, 2, ... ) arranged on the i-th row all are connected to a single select line $SO_i$, so that the select transistors $STE_{i,m}$ (m=0, 1, 2, ... ) connected to the select line $SO_i$ all are selected via the select line $SO_i$.

The even-bank select transistors $STE_{i,m}$ on every other column have one of their source/drain regions interconnected, as illustrated. Virtual ground lines $VT_k$ (K=0, 1, 2, ... ) are respectively connected to nodes A, D and E where the above source/drain regions are interconnected.

This is also true with the odd-band select transistors $STO_{i,m}$ except that nodes where they are interconnected are shifted from the nodes of the even-bank select transistors $STE_{i,m}$ by one column each.

Labeled $STE_{i-1,m}$ (m=0, 2, ... ) is an even-bank select transistor included in the (i−1)-th bank, as counted in the direction of column, for selecting an even bank. Also, labeled $STO_{i+1,m}$ (m=1, 3, ... ) is an odd-bank select transistor included in the (i+1)-th bank, as counted in the direction of column, for selecting an odd bank.

The virtual ground lines $VT_k$ (k=0, 1, 2, ... ) are formed of aluminum or similar metal so as to have their electric resistance lowered. On the other hand, the bit lines $BL_m$ (m=0, 1, 2, ... ) are implemented as a diffusion layer and far higher in electric resistance than the virtual ground lines $VT_k$.

The operation of the semiconductor memory shown in FIG. 32 will be described hereinafter. Assume that the cell transistor $TC_{i,m,0}$ should be selected at the time of read-out, and that m is an even number by way of example. Then, the cell transistor $TC_{i,m,0}$ belongs to an even bank $BNK_{i,m}$. Therefore, to select the even bank group $BNK_{i,m}$ (m=0, 2, 4, ... ), the even bank select line $SE_i$ is caused to go high for thereby turning on the even-bank select transistors $STE_{i,m}$ (m=0, 1, 2, ... ). The other select lines $SE_r$ (r=0, 1, 2, ..., i−1, i+1, ... ) and $SO_r$ (r=0, 1, 2, ... ) are caused to go low for thereby turning off all of the transistors whose gates are connected to the select lines $SE_r$ and $SO_r$.

In the voltage distribution stated above, the even-bank select transistors $STE_{i,m}$ and $STE_{i,m+1}$ turned on electrically connect the bit lines $BL_m$ and $BL_{m+1}$ to the virtual ground lines $VT_k$ and $VT_{k+1}$, respectively. Likewise, the bit lines connected to the other even banks $BNK_{i,m-2}$, $BNK_{i,m+4}$ and so forth are brought into electrical connection with the virtual ground lines.

Subsequently, to select the cell transistor $TC_{i,m,0}$, the virtual ground line $VT_k$ connected to the cell transistor $TC_{i,m,0}$ via the bit line $BL_m$ is brought to the ground level. At the same time, a low voltage $V_{DD}$ (=1.6 V) is applied to the virtual ground line $VT_{k+1}$, which is connected to the cell transistor $TC_{i,m,0}$ via the bit line $BL_{m+1}$. The other virtual ground lines VT are held in an open state. In this manner, the even bank group $BNK_{i,m}$ (m=0, 2, 4, . . . ) is selected first. More specifically, a bit line gate 122 is connected to the virtual ground lines VT in order to establish the above states of the virtual ground lines VT. The bit line gate 122 will be described in detail later. Subsequently, a read voltage $V_G$ (=2.2 V) is applied to the word line $WL_0$. Further, the bit line gate 122 connected to the virtual ground lines VT connects only the virtual ground line $VT_{k+1}$ to a sense amplifier 128, so that the sense amplifier 128 senses a current flowing through the virtual ground line $VT_{k+1}$.

The voltages applied to the source/drain regions, as stated above, cause a first drain current $Id_1$ to flow through the cell transistor $TC_{i,m,0}$, as described previously with reference to FIG. 8A. The first drain current $Id_1$ sequentially flows from the sense amplifier 128 through the bit line gate 122, virtual ground line $VT_{K+1}$, node D, node C, even-bank select transistor $STE_{i,m+1}$, bit line $BL_m$, cell transistor $TC_{i,m,0}$, bit line $BL_m$, even-bank select transistor $STE_{i,m}$, node B, node A, virtual ground line $VT_k$, and bit line gate 122 in this order.

Thereafter, the bit line gate 122 inverts the potential difference between the bit lines $BL_m$ and $BL_{m+1}$ while maintaining the other voltages the same. As a result, a second drain current $Id_2$ flows through the cell transistor $TC_{i,m,0}$, as stated with reference to FIG. 8B. The second drain current Id2 flows through a route opposite to the route of the first drain current Id1.

The procedure described above allows the sense amplifier 128 to measure the first and second drain currents $Id_1$ and Id2 flown through the cell transistor $TC_{i,m,0}$ and thereby determine which of the four states "(0,0)" through "(1, 1)" is stored in the cell transistor $TC_{i,m,0}$.

In the circuitry shown in FIG. 32 , the first drain current $Id_1$ does not constantly flow through the high-resistance bit lines $BL_m$ and $BL_{m+1}$ implemented as a diffusion layer, but flows through the low-resistance virtual ground line $VT_{k+1}$ up to the subject bank $BNK_{i,m}$ and then flows through the bit line $BL_{m+i}$. Subsequently, the drain current $Id_1$ flown through the cell transistor $TC_{i,m,0}$ flows through the virtual ground line $VT_K$ via the bit line $BL_m$.

The resistance is therefore lower when the first drain current $Id_1$ flows through the above route than when it constantly flows through the bit lines $BL_m$ and $BL_{m+1}$. The illustrative embodiment can therefore read out the first drain current $Id_1$ as well as the second drain current $Id_2$ at high speed.

In the specific procedure described above, the cell transistor $TC_{i,m,0}$ belonging to the even bank $BNK_{i,m}$ is selected. On the other hand, to select the transistor $TC_{i,m,p}$ belonging to the odd bank group $BNK_{i,m}$ (m=1, 3, 5, . . . ), the odd-bank select line $SO_i$ is caused to go high for thereby turning on the odd-bank select transistors $STO_{i,m}$ (m=0, 1, 2, . . . ). The other select lines $SE_r$ (r=0, 1, 2, . . . ) and $SO_r$ (r=0, 1, 2, . . . , i−1, i+1, . . . ) all are caused to go low, so that the transistors whose gates are connected to the select lines $SE_R$ and $SO_r$ all are turned off. The rest of the procedure is identical with the procedure described in relation to the selection of the even bank and will not be described specifically in order to avoid redundancy. The method of selecting a cell transistor described above is sometimes referred to as a virtual ground system.

Figure 33:
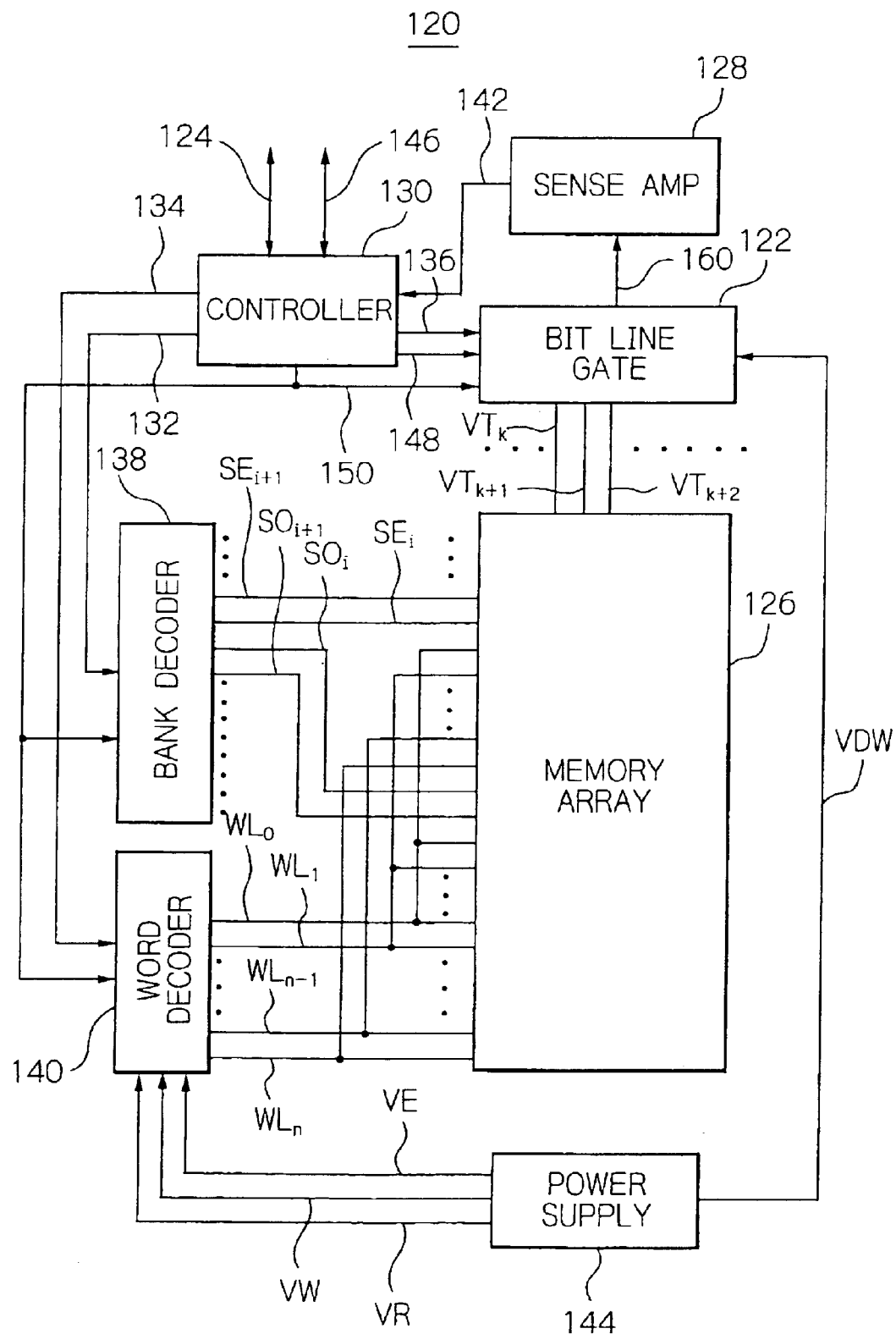
FIG. 33 is a schematic block diagram showing a semiconductor memory embodying the present invention.

FIG. 33 is a schematic block diagram showing one embodiment of the semiconductor memory in accordance with the present invention and implemented as a flash memory 120.

As shown, the flash memory 120 receives an address signal 124 via an address signal line 124. Also, the flash memory 120 receives data 146 to be written (write data hereinafter) or outputs data 146 read out (read data hereinafter) via a data line 146. The address signal 124 designates, among memory cells arranged in a memory array 126, a subject memory cell from which data should be read out or to which data should be written.

Usually, data stored in each sixty-four kilobytes of cells, for example, are deleted at a time. More specifically, among data stored in sixty-four kilobytes of cells, data stored in all of the cells connected to a single row are deleted at a time. Such deletion is repeated with the successive rows to thereby collectively delete data stored in sixty-four kilobytes of cells in total.

The write data 146 and read data 146 have, e.g., eight bits each. However, in the following description, it is assumed that the write data 146 and read data 146 have 2 bits (corresponding to one memory cell) each, and that deletion is collectively effected with all of the memory cells at a time for the sake of simplicity of illustration.

A controller 130 stores the input address signal 124, generates bank data 132, word data 134 and bit line data 136 on the basis of the address signal 124, and delivers the data 132, 134 and 136 to a bank decoder 138, a word decoder 140 and the bit line gate 122, respectively. Further, the controller 130 delivers information indicative of any one of the write mode, read mode and delete mode (mode information hereinafter) to the bank decoder 138, word decoder 140 and bit line gate 122 via a signal line 150. More specifically, the controller 130 receives mode information from the outside via a signal line, not shown, and then feeds the above mode information to the bank decoder 138, word decoder 140, and bit line gate 122.

In the write mode, the controller 130 delivers the write data 146 to the bit line gate 122 via a signal line 148 as write data 148. The bit line gate 122 applies 6.0 V to the virtual ground line VT (drain side) designated by the bit line data 136 or ground it (source side) in accordance with the write data 148. However, when the write data is "(1, 1)", which does not need writing, the controller 130 does not instruct any one of the various sections to perform writing.

In the read mode, the controller 130 generates read data 146 on the basis of data 142 received from the sense amplifier 128 via a signal line 142. More specifically, the bit line gate 122 reads data out of a single memory cell two times by replacing the drain and source. On receiving two signals 142 (derived from Id1 and Id2 stated earlier) from the sense amplifier 128 via the signal line 142, the controller 130 determines the state of ($Id_1$, $Id_2$), i.e., (large, large), (large, small), (small, large) or (small, small) to thereby generate the read data 146.

While the reading operation described above identifies the logical state of a memory cell, i.e., any one of "(0, 0)" through "(1, 1)" and then reads out data, the following alternative reading operation is also available with the present invention. In the reading operation unique to the present invention, the drain current Id, in the end, varies in accordance with whether or not a charge is stored in the floating gate facing the source/drain region to which the read voltage is not applied (ground side). Therefore, by simply sensing a drain current to flow when a drain voltage is applied to one of the source/drain regions, it is possible to determine whether not a charge is stored in the other floating gate to which the drain voltage is not applied. This is the alternative reading operation available with the present invention.

On receiving the bank data 132 from the controller 130, the bank decoder 138 selects one of the select lines SE and SO of the memory array 126 (read mode or write mode) or selects all of the select lines SE and SO (delete mode), thereby selecting the bank select transistors connected to the select line or select lines. For the selection, a voltage higher than or equal to the gate threshold voltage of the select transistors STE and STO is applied to the select line SE or SO selected. A voltage lower than the above gate threshold voltage is applied to the select line SE or SO not selected, disconnecting the bit line BL and virtual ground line VT.

The word decoder 140, received the word data 134 from the controller 130, selects one of the word lines WL of the memory array 126 (read mode or write mode) or selects all of the word lines WL (delete mode). The word decoder 140 then applies one of voltages VE, VW and VR input from a power supply 144 to the word line WL selected. The voltages VE (e.g. 12 V), VW (e.g. 2.2 V) and VR (e.g. 2.2 V) are applied to the control gate of the cell transistor TC in the delete mode, write mode and read mode, respectively. In the delete mode, the word decoder 140 applies the voltage VE to the word line WL for 5 milliseconds in order to effect overdeletion.

To write data in the floating gate, use should preferably be made of a write voltage VW close to the minimum one of write voltage values available because the maximum writing efficiency is achievable with such the minimum write voltage value VW. It is to be noted that writing efficiency refers to the ratio of a current Ifg injected into the floating gate to the source current Is, i.e., Ifg/Is.

A voltage lower than the gate threshold voltage of the cell transistors TC is applied to the word lines WL not selected, preventing a current from flowing through the cell transistors TC not selected. Usually, to implement such a low voltage, the word lines WL are grounded.

In the read mode or the write mode, the bit line gate 122, received the bit line data 136 from the controller 130, applies a preselected voltage to the virtual ground line VT connected to the bank $BNK_{i,m}$ (i=0, 1, 2, . . . ) lying in one column of the memory array 126, thereby selecting the cell transistors $TC_{i,m,p}$ (i=0, 1, 2, . . . ) included in the bank $BNK_{i,m}$. In the delete mode, the bit line gate 122 selects all of the banks, i.e., all of the cell transistors and grounds the drain and sources of the transistors. The virtual ground lines VT connected to the other banks not selected are held in an open state. This will be described more specifically with reference to FIG. 34.

Figure 34:
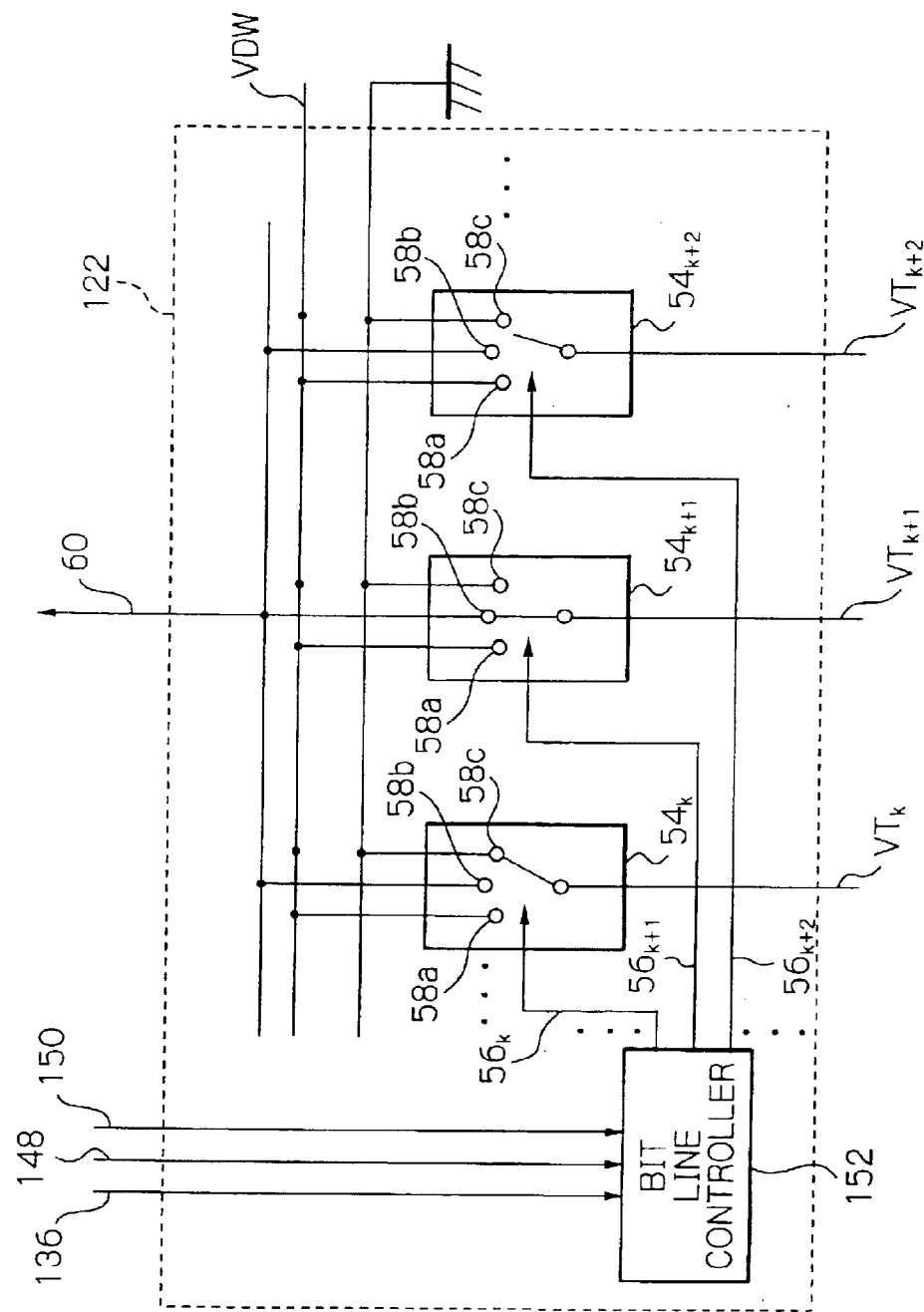
FIG. 34 is a schematic block diagram showing a specific configuration of a bit line decoder.

FIG. 34 is a schematic block diagram showing a specific configuration of the bit line gate 122. As shown, the bit line gate 122 includes a bit line controller 152 to which the bit line data 136, write data 148 (only in the write mode) and mode information 150 are input from the controller 130. The bit line data 136 is, in practice, representative of a column number m assigned to the subject bank $BNK_{i,m}$ to be dealt with in the write mode or the read mode.

On receiving the bit line data 136, the bit line controller 152 applies via switches $54_k$ (k=0, 1, 2, . . . ) a preselected voltage to two virtual ground lines VT included in the subject bank $BNK_{i,m}$ and connected to the bit lines BL at the drain side and source side, respectively. The other virtual ground lines VT are held in an open state via switches $54_k$. For this purpose, the bit line controller 152 feeds voltage command signals $56_k$ (k=0, 1, 2, . . . ) to the switches $54_k$.

More specifically, the switches $54_k$ each are assigned to a particular virtual ground line $VT_k$ and applies a preselected voltage to the associated virtual ground line $VT_k$ or connects the virtual ground line $VT_k$ and sense amplifier 128 in accordance with the voltage command signal $56_k$.

The switches $54_k$ are identical in configuration with each other and include terminals 58a, 58b and 58c each. The terminal 58a receives a voltage VDW from the power supply 144. The terminal 58a is connected to the sense amplifier 128 via a signal line 60 while the terminal 58b is grounded. In the write mode, the virtual ground line VT at the drain side is connected to the terminal 58 and applied with the voltage VDW while the virtual ground line VT at the source side is connected to the terminal 58c and therefore to ground. The other virtual ground lines VT are held in an open state without being connected to any one of the terminals 58a through 58c.

When the write data is (0, 0), after a charge has been stored in the drain by the procedure described above, the drain side and source side are replaced with each other, i.e., the virtual ground lines VT connected to the terminals 58a and 58c, respectively, are connected to the terminals 58c and 58a, respectively, to thereby store a charge in the replaced drain.

In the read mode, the virtual ground line VT at the drain side is connected to the terminal 58b and therefore to the sense amplifier 128 while the virtual ground line VT at the source side is connected to the terminal 58c and therefore ground. The other virtual ground lines VT are held in an open state without being connected to any one of the terminals 58a through 58c. In this condition, the sense amplifier 128 senses a current flowing through the cell transistor TC. In the read mode, the low voltage of 1.6 V is applied to the drain side via the sense amplifier 128.

Subsequently, the drain side and source side are replaced with each other, i.e., the virtual ground lines VT connected to the terminals 58b and 58c, respectively, are connected to 58c and 58b, respectively, while the connection of the other virtual ground lines VT is not changed. In this condition, the sense amplifier 128 again senses a current flowing through the cell transistor TC.

FIG. 34 shows the virtual ground lines VT held in the connection for the read mode. As shown, the virtual ground lines $VT_{k+1}$ and $VT_k$ are connected to the drain side (terminal 58b) and source side (terminal 58c), respectively, while the virtual ground line $VT_{k+2}$ is open. In this case, only the bank $BNK_{i,m}$ (i=0, 1, 2, . . . ) constituting the m-th column in FIG. 32 is selected as a subject of read-out. After reading effected in the condition shown in FIG. 34, the virtual ground lines $VT_{k+1}$ and $VT_k$ are connected to the source side (terminal 58c) and drain side (terminal 58b), respectively, with the virtual ground line $VT_{k+2}$ being held open. In this manner, data are read out of a single cell transistor two times.

Figure 35:
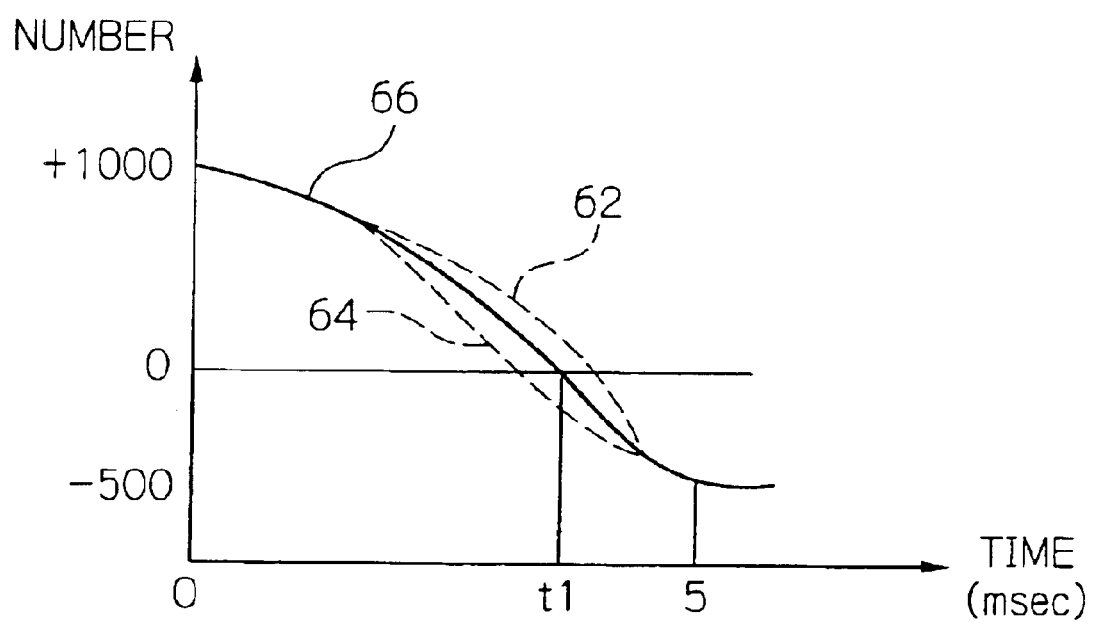
FIG. 35 is a graph showing how charges stored in a floating gate decease during deletion.

In the illustrative embodiment, in the delete mode, the virtual ground lines VT all are connected to the terminals 58c, which are connected to ground, for 5 milliseconds. The period of time of 5 milliseconds is selected for the following reason. Charges (electrons in this case) stored in the floating gate is deleted by an FN current. FIG. 35 demonstrates how the number of electrons stored in the floating gate decreases with the elapse of time in the delete mode.

FIG. 35 shows a curve 66 indicative of the number of electrons present in a single floating gate as a function of a period of time elapsed since the start of deletion. The ordinate indicates the number of electrons; the number is assumed to be 1,000 at the beginning of deletion. At a time t1, the number of electrons decreases to zero, and after the time t1 positive charges (holes) are stored. On the elapse of 5 milliseconds, 500 positive charges are stored in the floating gate while the FN current is reduced to substantially zero. Thereafter, the number of positive charges stored in the floating gate does not change.

In practice, the number of electrons decreases in an irregular manner during deletion. FIG. 35 additionally shows a curve 64 indicative of a case wherein the number of electrons decreases at a higher rate and a curve 62 indicative of a case wherein it decreases at a lower rate. By comparing the curves 66, 62 and 64, it will be seen that the number of electrons varies with some width, i.e., irregularity and that the time when it reaches zero is not constant. On the other hand, the number of electrons is the same when the FN current is finally reduced to zero.

Under the above circumstances, to stop deletion when the number of electrons is around zero (time t1) as conventional, some measure taking account of the irregularity has been required. For example, it has been necessary to effect deletion little by little in order to avoid overdeletion while verifying non-overdeletion each time. By contrast, when overdeletion is effected to the time when the FN current is around zero, as in the illustrative embodiment, the condition wherein electrons are depleted is scarcely irregular. More specifically, the number of positive charges saturates and insures a stable gate threshold voltage. Therefore, the illustrative embodiment makes it needless to verify verification.

While the illustrative embodiment effects overdeletion until the FN current decreases to zero, the present invention may alternatively delete the charges stored in the floating gate until the FN current decreases below a preselected value or until the number of positive charges stored in the floating gate increases above a preselected value, e.g., 500.

It will be seen from the above that in the illustrative embodiment the bank decoder 138, word decoder 140 and bit line gate 122 constitute selecting means while the word decoder 140, bit line gate 122 and power supply 144 constitute overdeleting means. Further, the word decoder 140, bit line gate 122 and power supply 144 constitute writing means.

Referring again to FIG. 33, in the read mode, the sense amplifier 128 is connected to the drain side of the subject cell transistor TC via the bit line gate 122 so as to sense the size of a current flowing through the cell transistor TC. The sensed size is sent to the controller 130 via the signal line 142. The read data 142 is, e.g., a high voltage corresponding to a "large" current or a low voltage corresponding to a "small" current. The power supply 144 applies the voltages VE, VW and VR to the word decoder 140 and applies the voltage VDW to the bit line gate 122.

The operation of the flash memory 120 with the above configuration will be described hereinafter. First, in the write mode, the controller 130 receives a write command, an address signal 124 designating a subject cell transistor TC and write data 146 from the outside. The controller 130 generates bank data 132, word data 134 and bit line data 136 on the basis of the address signal 124 and delivers the data 132, 134 and 136 to the bank decoder 138, word decoder 140 and bit line gate 122, respectively. At the same time, the controller 130 delivers mode information indicative of the write mode to the bank decoder 138, word decoder 140, and bit line decoder 122. Further, the controller 130 feeds the write data 146 to the bit line gate 122 via the signal line 148 as write data 148.

In response to the mode information input from the controller 130, the bank decoder 138 performs a writing operation. More specifically, the bank decoder 138 applies the voltage higher than the gate threshold voltage of the bank select transistors STO and STE to one of the select lines SE and SO arranged in the memory array 126 while grounding the other bank select lines SE and SO in accordance with the bank data 132. As a result, only the bank select transistor connected to the above select line is selected.

The word decoder 140 performs a writing operation in accordance with the mode information input from the controller 130. More specifically, the word decoder 140 selects one of the word lines WL arranged in the memory array 126 in accordance with the word data 134 and applies the voltage VW input from the power supply 144 only to the word line WL selected. At this instant, the word decoder 140 grounds the word lines WL other than the word line WL selected.

The bit line gate 122 performs a writing operation in accordance with the mode information input from the controller 130. More specifically, the bit line gate 122 applies the voltage VDW to one of two designated bit lines, or virtual ground lines located at the drain side while grounding the other bit line at the source side. When the write data is (0, 0), the bit line gate 122, stored charges in the drain in the above condition, replaces the drain side and source side and then stores charges in the new drain also.

In the read mode, the controller 130 receives a read command and an address signal 124 designating a subject cell from the outside. The controller 130 generates bank data 132, word data 134 and bit line data 136 on the basis of the address signal 124 and delivers the data 132, 134 and 136 to the bank decoder 138, word decoder 140 and bit line gate 122, respectively. At the same time, the controller 130 delivers mode information indicative of the read mode to the bank decoder 138, word decoder 140, and bit line decoder 122.

In response to the mode information input from the controller 130, the bank decoder 138 performs a reading operation. More specifically, the bank decoder 138 applies the voltage higher than the gate threshold voltage of the bank select transistors STO and STE to one of the select lines SE and SO arranged in the memory array 126 while grounding the other bank select lines SE and SO in accordance with the bank data 132. As a result, only the bank select transistor connected to the above select line is selected.

The word decoder 140 performs a reading operation in accordance with the mode information input from the controller 130. More specifically, the word decoder 140 selects one of the word lines WL arranged in the memory array 126 in accordance with the word data 134 and applies the voltage VR input from the power supply 144 only to the word line WL selected. At this instant, the word decoder 140 grounds the word lines WL other than the word line WL selected.

The bit line gate 122 performs a reading operation in accordance with the mode information input from the controller 130. More specifically, the bit line gate 122 connects one of two designated bit lines, or virtual ground lines, located at the drain side to the sense amplifier 128 while grounding the other bit line located at the source side. After the sense amplifier 128 has sensed a current flowing through the cell transistor TC, the bit line gate 122 replaces the drain side and source side and again causes the sense amplifier 128 to sense a current flowing through the above cell transistor TC.

The sense amplifier 128 outputs the result of the sensing to the controller 130 two times as the read data 142, and the controller 130 generates the read data 146 of two bit on the basis of the read data 142 to output to the external.

In the delete mode, the controller 130 receives a delete command from the outside. In response, the controller 130 delivers mode information indicative of the delete mode to the bank decoder 138, word decoder 140, and bit line gate 122.

In response to the mode signal input from the controller 130, the bank decoder 138 performs a deleting operation. More specifically, the bank decoder 138 applies the voltage higher than the gate threshold voltage of the bank select transistors STO and STE to all of the select lines SE and SO of the memory array 126, thereby selecting all of the bank select transistors.

The word decoder 140 performs a deleting operation in accordance with the mode signal input from the controller 130. More specifically, the word decoder 140 selects all of the word lines WL of the memory array 126 and then feeds the voltage VE input from the power supply 144 to all of the word lines WL.

The bit line gate 122 performs a deleting operation in accordance with the mode signal input from the controller 130, i.e., grounds all of the virtual ground lines VT for 5 milliseconds.

As stated above, in the illustrative embodiment, the floating gate is overdeleted, i.e., deleted to an electron depletion state. As a result, the number of charges saturates in all of the cells, so that all of the cells are evenly deleted. Further, when data is to be written to the deleted cell, charges stored in the floating gate do not obstruct the flow of a source/drain current, but serves as negative resistance for the source/drain current, i.e., increases the current for thereby improving writing efficiency and therefore writing speed.

An increase in write current mentioned above, coupled with a ballistic current writing system practicable with the cell configuration of FIG. 2, reduces power consumption during writing to the extremity. In the ballistic current writing system, major part of a channel current flows in a direction perpendicular to the gate insulation film of the floating gate FG.

A decrease in power consumption, in turn, makes it possible to write data in a plurality of cells in parallel by using a relatively small amount of power and therefore to substantially increase the writing speed. It follows that there can be implemented even a service for, e.g., dubbing audio media or video media in a short period of time is achievable. Further, overdeletion effected by the illustrative embodiment makes it unnecessary to verify non-overdeletion like the conventional system, thereby promoting rapid, easy processing. In addition, overdeletion improves the current window in the read mode. More specifically, when electrons are injected into only one of two overdeleted cells in the read mode, a potential difference between the one cell and the other cell into which electrons are not injected is further increased, further widening the current window in the read mode.

Another alternative embodiment of the present invention will be described hereinafter. The embodiment to be described performs, before the application of the delete voltage to the control gate, a charge injecting operation, particularly, a preset charge injecting operation, for injecting charges into one of two floating gates of the subject cell not storing any data (non-written floating gate hereinafter). The illustrative embodiment is also practicable with the cell transistor structure described with reference to FIG. 2.

The charge injection unique to the illustrative embodiment may be effected not before the application of the delete voltage to the control gate, but during the application of the delete voltage by interrupting it.

Further, the charge injection may even be effected after the application of the delete voltage to the control gate. In this case, the charge injecting operation may not be performed every time deletion is effected, but may be performed only after overdeletion has been repeated.

As for the frequency of charge injection, the illustrative embodiment performs the charge injecting operation every time deletion is effected. Alternatively, the charge injecting operation may be effected only after any one of a plurality of consecutive times of deletion.

More specifically, in the illustrative embodiment, the preset injecting operation is effected before the application of the delete voltage to the control gate by applying a preset voltage to the subject cell to be deleted. By the preset injecting operation, charges are injected into only non-written one of two floating gates of the subject cell.

At this instant, the preset voltage and the duration thereof are selected such that charges are injected into the non-written floating gate, but not injected into the other floating gate that stores data (written floating gate hereinafter).

While a voltage and duration thereof that causes charges to be further injected into the written floating gate during preset injection, they would undesirably extend a period of time necessary for deletion.

The illustrative embodiment uses the voltage that causes a charge to be injected into only the non-written floating gate in the event of preset injection. It is therefore not necessary to determine, before deletion, whether or not the floating gates of the subject cell are non-written or written.

Another possible method of executing preset injection is selecting only the non-written floating gate of the subject cell and then injecting charges into the non-written floating gate.

For example, there may be executed the steps of reading data before deletion in order to identify a non-written floating gate and then injecting charges into the non-written floating gate by the usual writing operation. This procedure, however, needs the additional step of reading data before deletion for the identification of anon-written floating gate. In addition, such a procedure is not practicable without resorting to an extra storage area for temporarily storing information indicative of whether or not a floating gate is non-written.

The illustrative embodiment will be described more specifically hereinafter. In the following description, structural elements identical with the structural elements of the previous embodiments are designated by identical reference numerals and will not be described specifically in order to avoid redundancy. Because the illustrative embodiment operate in exactly the same manner as the previous embodiments in the write mode and read mode, the following description will concentrate on the delete mode.

To delete all of the subject cells, e.g., sixty-four kilobytes of memory cells at a time, the illustrative embodiment deletes all of the memory cells connected to a single word line WL, i.e., memory cells on a single row at a time and then repeats such deletion with the successive rows.

Figure 36:
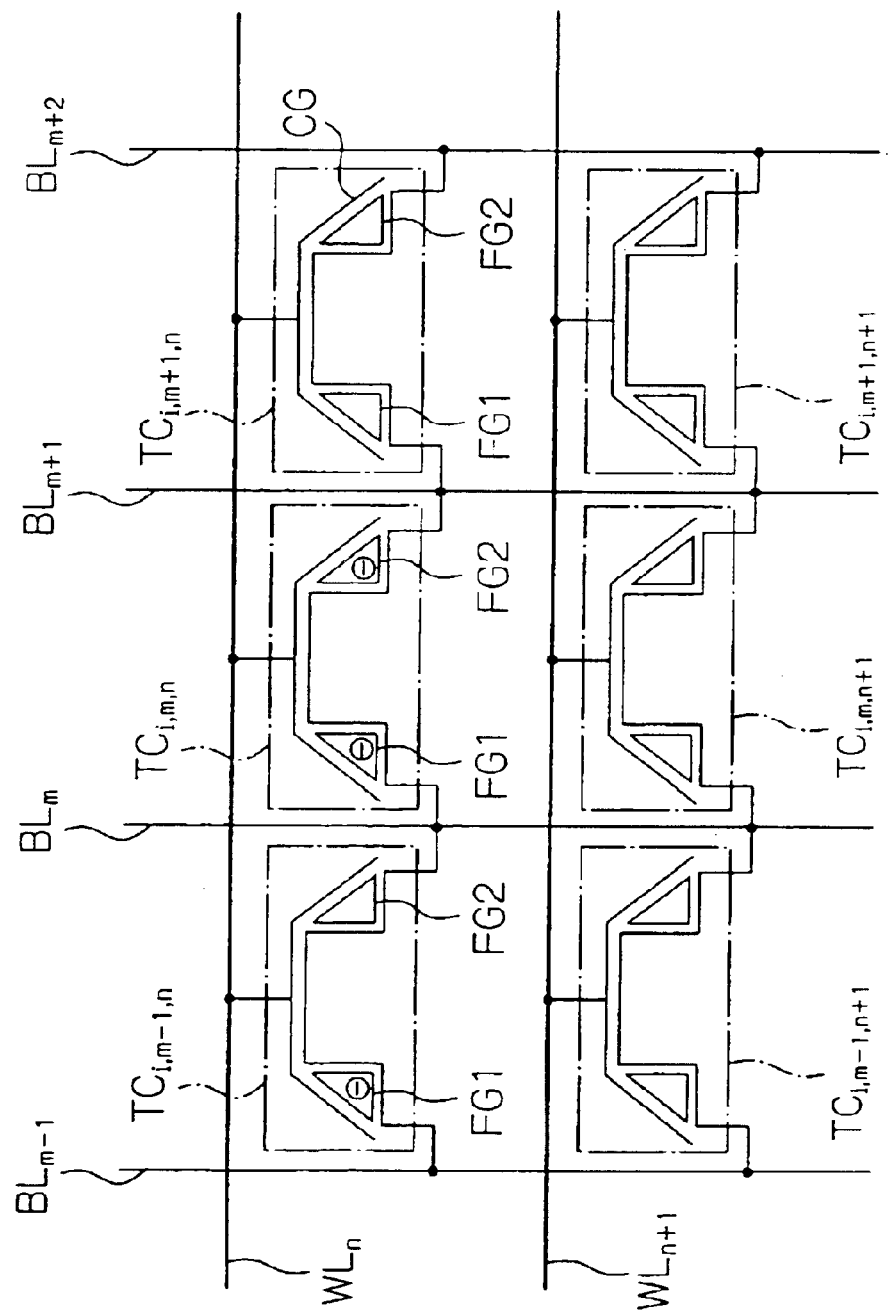
FIG. 36 is a circuit diagram showing part of the arrangement shown in FIG. 32.

In FIG. 36 showing part of the circuitry of FIG. 32, assume that cell transistors $TC_{i,m-1,n}$, $TC_{i,m,n}$, $TC_{i,m+1,n}$ and so forth connected to a single word line $WL_n$ are the subject of deletion, and that cell transistors $TC_{i,m-1,n+1}$, $TC_{i,m,n+1}$, $TC_{i,m+1,n+1}$ and so forth connected to a word line $WL_{n+1}$ are not the subject of deletion. In FIG. 32, the floating gate $FG_1$ of the cell transistor $TC_{i,m-1,n}$ and the floating gates $FG_1$ and $FG_2$ of the cell transistor $TC_{i,m,n}$ are the written floating gates while the floating gate $FG_2$ of the cell transistor $TC_{i,m-1,n}$ and the floating gates of the cell transistor $TC_{i,m+1,n}$ are the non-written floating gates.

Figure 37:
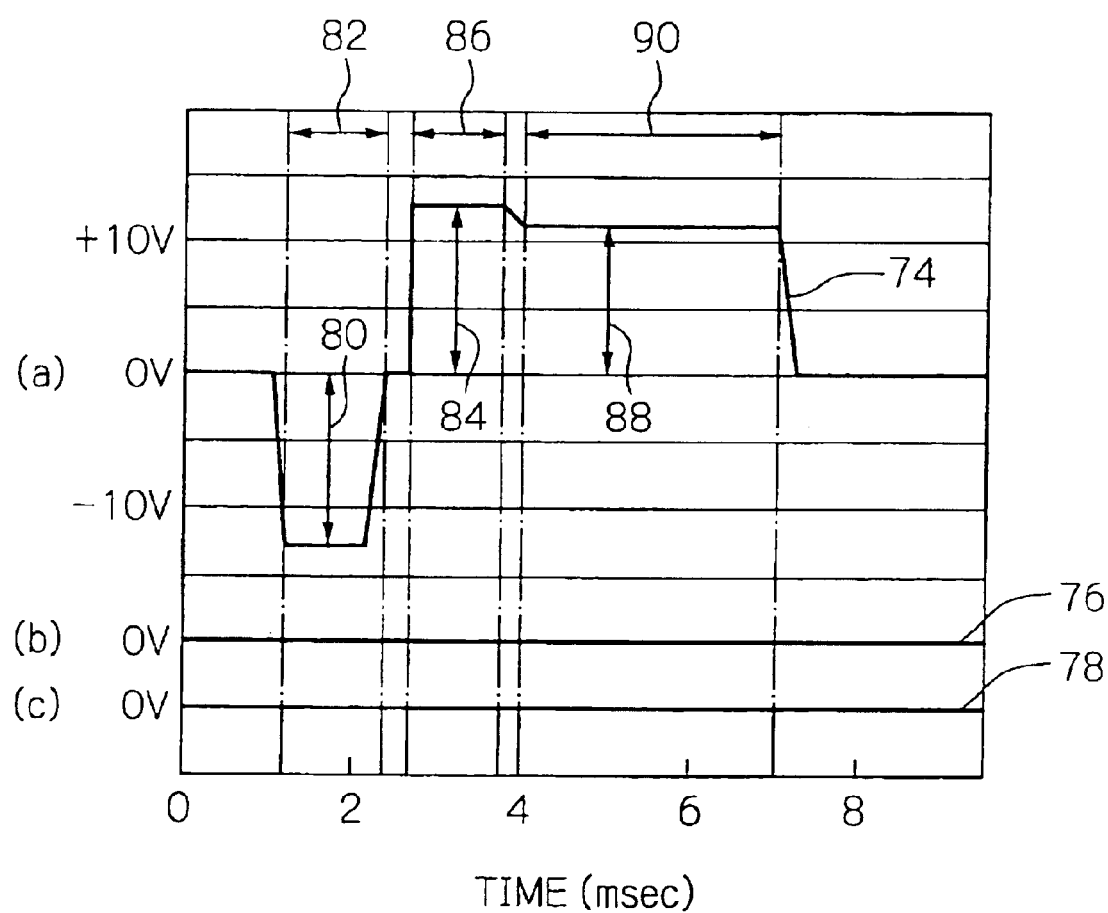
FIG. 37 shows a voltage profile appearing during over-deletion particular to another alternative embodiment of the semiconductor memory of the present invention.

In the delete mode, a voltage curve 74 shown in FIG. 37 is applied to the word line $WL_n$, i.e., the control gate CG. The abscissa and ordinate indicate time in milliseconds and voltage in volts, respectively in FIG. 37. FIG. 37 additionally shows voltage curves 76 and 78 respectively applied to the word line $WL_{n+1}$ and the sources and drains of the subject transistors $TC_{i,m-1,n}$ through $TC_{i,m+1,n}$ at the same time as the voltage curve 74. As shown, the voltage curves 76 and 78 both are held at 0 V throughout deleting operation. The voltage curve 76 of 0 V prevents deletion from occurring while the voltage curve 78 of 0 V establishes a preselected potential difference between the control gate CG and the floating gates FG.

In the illustrative embodiment, as the voltage curve 74 indicates, −13 V (arrow 80, FIG. 37), for example, is applied to the control gate CG for 1 millisecond (arrow 82, FIG. 37; preset period hereinafter) during preset injecting operation, thereby injecting electrons into the non-written floating gates. As a result, the number of positive charges, i.e., holes is reduced in each non-written floating gate.

Subsequently, 13 V (arrow 84, FIG. 37) is applied to the control gate CG for 1 millisecond (arrow 86, FIG. 37; first deletion period hereinafter), and then 11.5 V (arrow 88) is applied for 3 milliseconds (arrow 90, FIG. 37; second deletion period hereinafter). The sum of 1 millisecond and 3 milliseconds, i.e., 4 milliseconds is the substantial deletion period during which the electrons injected into the non-written floating gates during the preset period are deleted. Consequently, the non-written floating gates restore the same state as before the preset injection on the elapse of the substantial deletion period.

Figure 38:
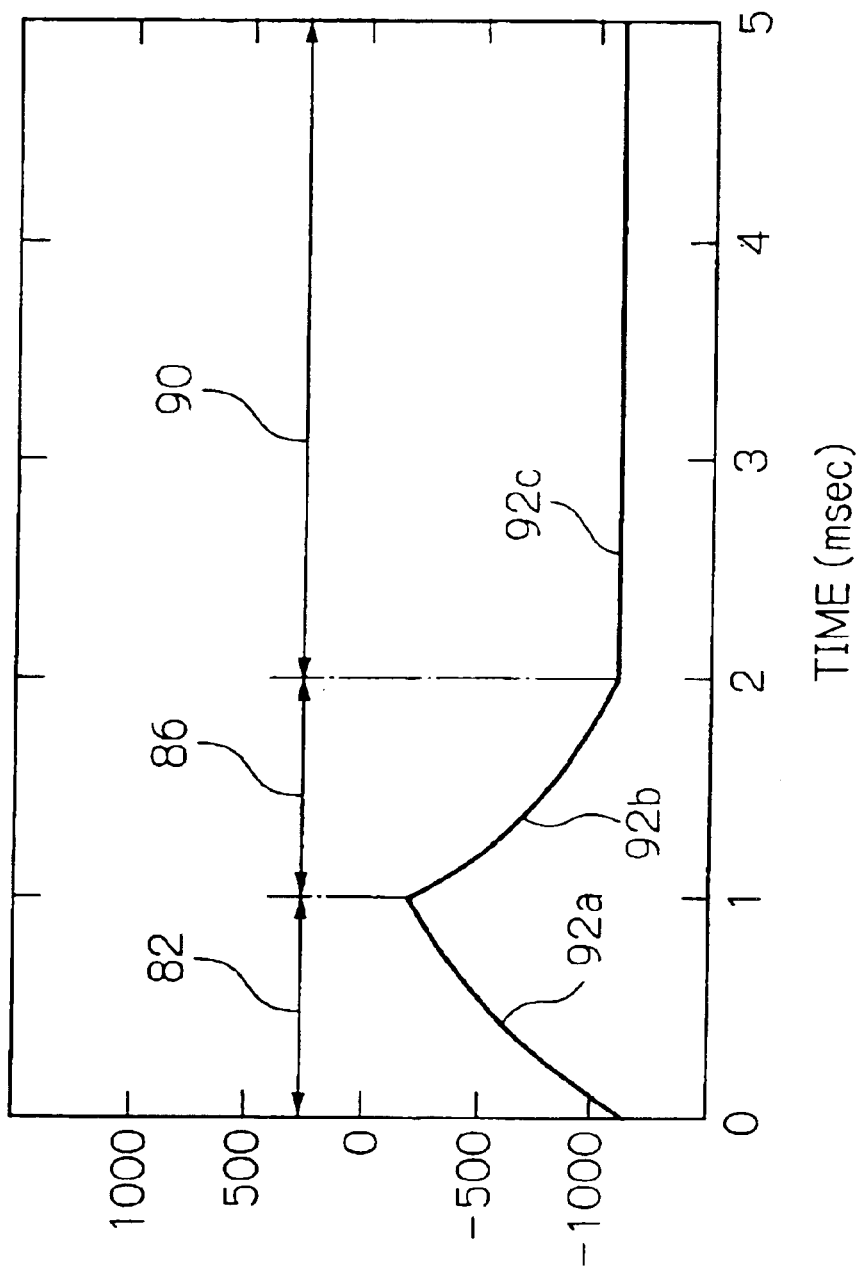
FIG. 38 shows how the number of charges stored in a non-written flowing gate varies when the voltage of FIG. 37 is applied to the floating gate.

FIG. 38 demonstrates how the number of charges in each non-written floating gate FG varies when the voltage curve 74 is applied to the control gate CG. In FIG. 38, the ordinate indicates the number of electrons stored in the floating gate; the sign "−" shows that holes are stored. The abscissa indicates time in milliseconds.

In FIG. 38, a curve 92 is representative of the variation of the number of charges determined by computer simulations. The curve 92 is made up of curves 92a, 92b and 92c pertaining to the preset period 82, first deletion period 86, and second deletion period 90, respectively. As shown, the number of holes decreases from 1,200 to about 300 during the preset period, increases to about 1,100 during the first deletion period, and again increases to 1,200 at the end of the second deletion period.

In accordance with the present invention, it is important that charges are injected into each non-written floating gate FG during the preset period, but the number of charges at the end of deletion is the same as the number of charges at the start of deletion.

Figure 39:
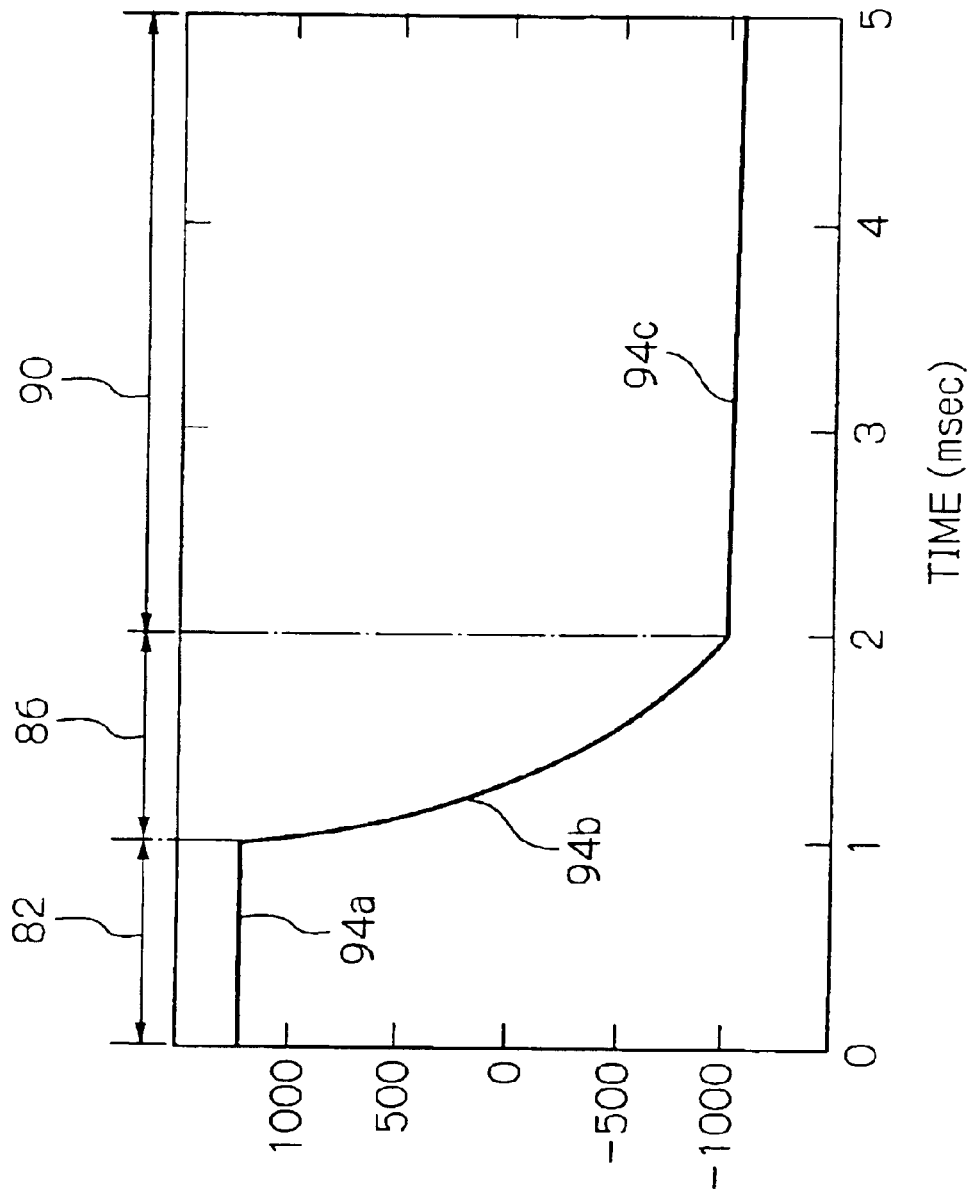
FIG. 39 shows the variation of the number of charges stored in a written floating gate, which stores data, when the voltage of FIG. 37 is applied to the floating gate.

FIG. 39 shows how the number of charges in each written floating gate FG varies when the voltage curve 74 is applied to the control gate CG. In FIG. 39, the ordinate indicates the number of electrons stored in the floating gate; the sign "−" shows that holes are stored. The abscissa indicates time in milliseconds.

In FIG. 39, a curve 94 is representative of the variation of the number of charges determined by computer simulation. The curve 94 is made up of curves 94a, 94b and 94c pertaining to the preset period 82, first deletion period 86, and second deletion period 90, respectively. As shown, the number of electrons remains stable at 1,200 during the preset period. During the first deletion period, the number of electrons decreases to zero while the number of holes increases to about 1,100. Further, at the end of the second deletion period, the number of holes increases to about 1,200.

As stated above, charges are not injected into the written floating gate FG held in the logical state "0" despite the preset injection, but are once injected into the non-written floating gate held in the logical state "1". Subsequently, the written and non-written floating gates FG both are subjected to deletion. It is noteworthy that in the end the written and non-written floating gates FG both become stable in the saturation state by being charged with about −1,200 electrons, i.e., 1,200 holes.

The number of electrons to be injected during the preset period may have any lower limit so long as the number of holes is smaller, if a little, than in the saturation state (i.e. the condition wherein 1,200 holes are present).

The upper limit of the number of electrons to be injected is open to choice. For example, electrons may be injected such that the number of electrons present in the non-written floating gate FG at the end of the preset period is greater than the number of electrons originally existed in the written floating gate FG (+1,200). However, the number of electrons should preferably be smaller than +1,200 in order to reduce deleting time.

Figure 40:
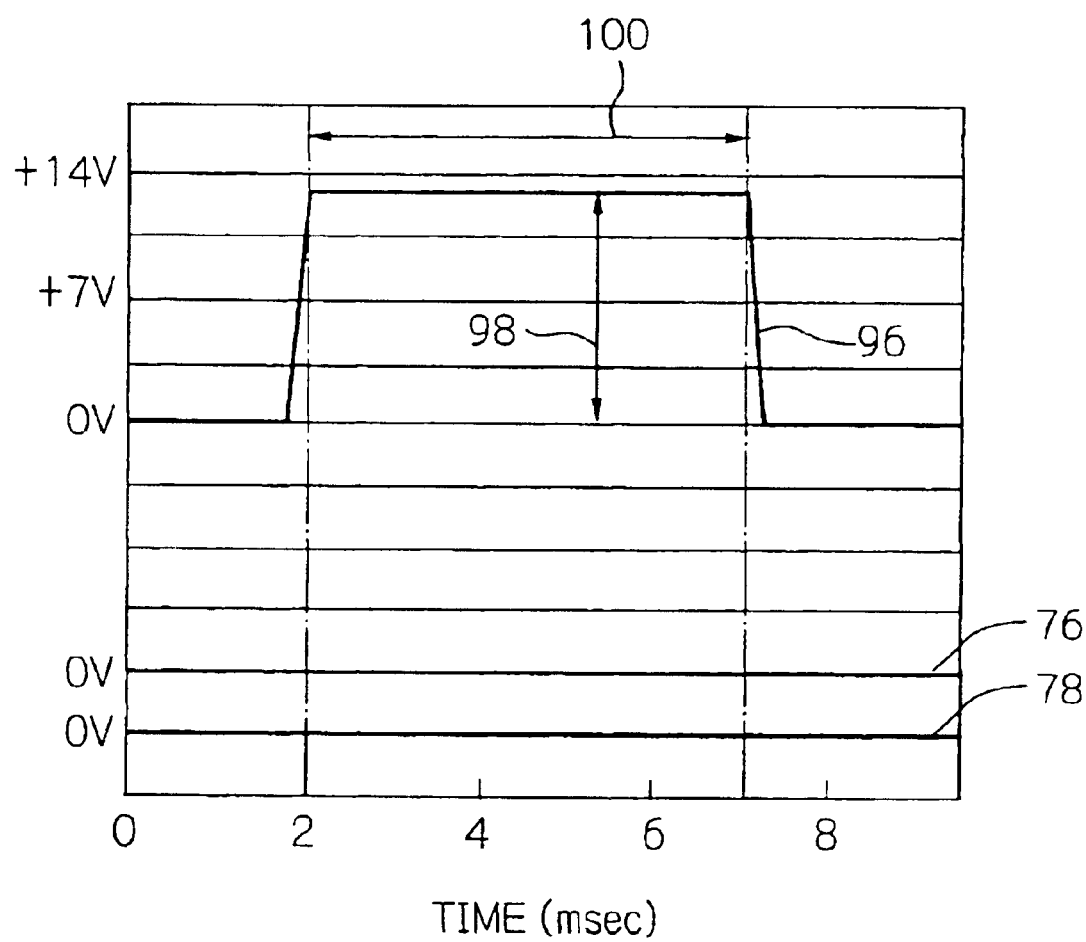
FIG. 40 shows for reference a voltage profile appearing when overdeletion is effected without charge injection.

For reference, assume an alternative deleting operation different from the deleting operation of the illustrative embodiment in that it does not include the charge injection period. FIG. 40 shows a voltage curve 96 applied to the word line $WL_n$ to be deleted by the alternative deleting operation. In FIG. 40, the abscissa indicates time in terms of milliseconds while the ordinate indicates voltage in volts (V).

FIG. 40 additionally shows the voltage curve 76 applied to the word line $WL_{n+1}$ and voltage curve 78 applied to the sources and drains of the cell transistors $TC_{i,m-1,n}$, $TC_{i,m,n}$ and $TC_{i,m+1,n}$ to be deleted. As shown, the voltage curves 76 and 78 both remain at 0 V throughout the deleting operation as in FIG. 37. As the voltage curve 96 indicates, +13 V (arrow 98, FIG. 40), for example, is applied to the control gate CG for 5 milliseconds (arrow 100, FIG. 40) for thereby effecting deletion.

Referring again to FIG. 37, to apply the voltage represented by the voltage curve 74 to the word line $WL_n$, the voltage output from the power supply 144 and represented by the voltage curve 74 is input to the word decoder 140. In response, the word decoder 140 selects the word line $WL_n$ and applies the above voltage to the word line $WL_n$. At this instant, to apply the voltage curve 76 to the word line $WL_{n+1}$ at the same time, the word decoder 140 should only select the word line $WL_{n+1}$ and then ground it.

To apply 0 volt to the sources and drains of the cell transistors to be deleted, the bit line gate 122 of FIG. 33 selects and ground the virtual ground lines VT connected to bit lines $BL_{m-1}$, $BL_m$, $BL_{m+1}$, $BL_{m+2}$.

The cell transistors $TC_{i,m-1,n}$, $TC_{i,m,n}$ and $TC_{i,m+1,n}$ to be deleted and the cell transistors $TC_{i,m-1,n+1}$, $TC_{i,m,n+1}$ and $TC_{i,m+1,n+1}$ both belong to the banks $BNK_{i,m-1}$, $BNK_{i,m}$ and $BNK_{i,m+1}$, respectively. The banks $BNK_{i,m-1}$, $BNK_{i,m}$ and $BNK_{i,m+1}$ each are selected by the procedure stated earlier.

As stated above, the illustrative embodiment is capable of repeating overdeletion with the non-written floating gates.

In summary, the present invention achieves the following various unprecedented advantages.

In accordance with the present invention, in a write mode, a potential difference for the write mode is set up between the source/drain regions of a cell transistor while a write voltage is applied to a control gate. As a result, a channel is formed on the surfaces of opposite side walls and top of a projection and allows a carrier flowing on the top of the projection to be injected into a floating gate straightforward without being steered at all. This successfully lowers a required write voltage.

On the other hand, in a read mode, a potential difference for the read mode is set up between the source/drain regions of the transistor while a read voltage is applied to the control gate to thereby cause a first drain current $I_{d1}$ to flow. Subsequently, the potential difference for the read mode is inverted to cause a second drain current $I_{d2}$ to flow. The potential of the floating gate is attracted toward the potential of the source/drain regions and control gate due to a capacitance between the source/drain regions and the floating gate, or that between the control gate and the floating gate. It is therefore possible to increase or decrease the drain currents $I_{d1}$ and $I_{d2}$ to desired values and therefore to widen a current window.

Further, a deletion voltage for deleting charges stored in the floating gate is applied between the control gate and the source/drain regions, so that the stored charges can be drawn out to the control gate or the source/drain regions and deleted.

Moreover, in accordance with the present invention, overdeletion provides a semiconductor device with a simple structure and high writing efficiency and therefore high writing speed.

In accordance with the present invention, on a step to confirm whether in each of the cell transistor a data is written is not needed, and it is possible to omit a time for the step.

In addition, in accordance with the present invention, charges stored in the entire memory are overdeleted to substantially less than zero (a condition wherein charges of opposite polarity are charged) and further overdeleted to such a degree that the charges of opposite polarity substantially saturate. It is therefore possible to establish a stable charge depletion state (electron depletion state or hole storage state) and therefore to realize stable write-in, readout, and deletion.

While the present invention has been described in details, it is not to be restricted by the embodiments. The embodiments can be changed without departing from the scope and spirit of the present invention. For example, while the illustrative embodiments use p-type and n-type as one conductivity type and counter-conductivity type, respectively, n-type and p-type may be used as one conductivity type and counter-conductivity type, respectively.

The entire disclosure of Japanese patent application Nos. 2001-358308, 2002-169749 and 2002-322905 filed on Nov. 22, 2001, Jun. 11, 2002 and Nov. 6, 2002, respectively, including the specifications, claims, accompanying drawings and abstracts of the disclosure are incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A transistor comprising:

a one-conductivity type semiconductor substrate formed with a projection having a pair of side walls facing each other;

a first insulation layer formed on a top of said projection;

a pair of counter-conductivity type source/drain regions formed on a surface of said semiconductor substrate at opposite sides of said projection;

second insulation layers each covering one of the pair of side walls of said projection and one of said pair of source/drain regions;

a pair of floating gates respectively formed on the pair of side walls of said projection and facing said pair of side walls and said pair of source/drain regions via respective second insulation layers;

third insulation layers each being formed on one of said pair of floating gates; and a control gate facing said pair of floating gates via said third insulation layers and facing the top of said projection via said first insulation layer;

wherein said second insulation layers and said third insulation layers each are configured to have a larger capacitance than said first insulation layer, and a delete voltage for deleting charges stored in said floating gates is applied between said control gate and said source/drain regions to thereby cause a delete current to flow toward said control gate or said source/drain regions, the charges stored being deleted.

2. A semiconductor memory comprising a plurality of transistors in accordance with claim 1 arranged in a plurality of arrays in each of a direction of column and a direction of row.

3. The semiconductor memory in accordance with claim 2, wherein the transistors adjoining each other in the direction of column share the source/drain regions, and the transistors adjoining each other in the direction of row share the control gate and share the source/drain regions between said transistors.

4. A transistor comprising:

a one-conductivity type semiconductor substrate formed with a projection having a pair of side walls facing each other;

a first insulation layer formed on a top of said projection;

a pair of counter-conductivity type source/drain regions formed on a surface of said semiconductor substrate at opposite sides of said projection;

second insulation layers each covering one of the pair of side walls of said projection and one of said pair of source/drain regions;

a pair of floating gates respectively formed on the pair of side walls of said projection and facing said pair of side walls and said pair of source/drain regions via respective second insulation layers;

third insulation layers each being formed on one of said pair of floating gates; and a control gate facing said pair of floating gates via said third insulation layers and facing the top of said projection via said first insulation layer;

wherein said control gate, facing the top of said projection, controls an ON/OFF state of a channel region that faces said control gate, and a delete voltage for overdeleting charges stored in said floating gates is applied between said control gate and said source/drain regions to thereby overdelete said charges such that said charges decrease substantially to less than or equal to zero.

5. The transistor in accordance with claim 4, wherein after overdeletion a writing operation or a reading operation is executed with said floating gates.

6. The transistor in accordance with claim 4, wherein the delete voltage is continuously applied for the overdeletion to said control gate for a preselected period of time.

7. The transistor in accordance with claim 4, wherein the charges stored in said floating gates are deleted by a Fowler-Nordheim current, and said charges are overdeleted until a value of said Fowler-Nordheim current decreases below a preselected value.

8. The transistor in accordance with claim 4, wherein a charge injecting operation is effected for injecting charges into at least one of said floating gates to be deleted that does not store data.

9. The transistor in accordance with claim 4, wherein to write data in said floating gates, a second write voltage close to a minimum one of writable write voltage values is used.

10. A semiconductor memory comprising a plurality of transistors in accordance with claim 4 arranged in a plurality of arrays in each of a direction of row and a direction of column.

11. The semiconductor memory in accordance with claim 10, wherein the transistors adjoining each other in the direction of column share a single source/drain region, and
the transistors adjoining each other in the direction of row share a single control gate and the source/drain region between said transistors.

12. In a transistor comprising a pair of source/drain regions of a counter-conductivity type formed in a surface layer of a semiconductor substrate of one conductivity type, a floating gate and a control gate, said floating gate being capable of storing data when charges are stored therein and facing only part of a channel region that intervenes between said pair of source/drain regions,
a delete voltage for deleting the charges stored in said floating gate is applied between said control gate and said source/drain regions to thereby effect overdeletion such that said charges decrease to substantially less than or equal to zero.

13. The transistor in accordance with claim 12, wherein after overdeletion a writing operation or a reading operation is effected with said floating gate.

14. The transistor in accordance with claim 12, wherein the delete voltage is continuously applied for the overdeletion to said control gate for a preselected period of time.

15. The transistor in accordance with claim 12, wherein the charges stored in said floating gate are deleted by a Fowler-Nordheim current, and said charges are overdeleted until a value of said Fowler-Nordheim current decreases below a preselected value.

16. The transistor in accordance with claim 12, wherein a charge injecting operation is effected for injecting charges into at least one of said floating gate to be deleted that does not store data.

17. The transistor in accordance with claim 12, wherein to write data in said floating gate, a second write voltage close to a minimum one of writable write voltage values is used.

18. A semiconductor memory comprising a plurality of transistors in accordance with claim 12 arranged in a plurality of arrays in each of a direction of column and a direction of row.

19. The semiconductor memory in accordance with claim 18, wherein the transistors adjoining each other in the direction of column share a single source/drain region, and
the transistors adjoining each other in the direction of row share a single control gate and the source/drain region between said transistors.

20. A method of driving a transistor comprising:
a one-conductivity type semiconductor substrate formed with a projection having a pair of side walls facing each other;
a first insulation layer formed on a top of said projection;
a pair of counter-conductivity type source/drain regions formed on a surface of said semiconductor substrate at opposite sides of said projection;
second insulation layers each covering one of the pair of side walls of said projection and one of said pair of source/drain regions;
a pair of floating gates respectively formed on the pair of side walls of said projection and facing said pair of side walls and said pair of source/drain regions via respective second insulation layers;
third insulation layers each being formed on one of said pair of floating gates; and
a control gate facing said pair of floating gates via said third insulation layers and facing the top of said projection via said first insulation layer, said second insulation layers and said third insulation layers each being configured to have a larger capacitance than said first insulation layer;
said method comprising the step of applying a delete voltage for deleting charges stored in said floating gates between said control gate and said source/drain regions to thereby cause a delete current to flow toward said control gate or said source/drain regions, the charges stored being deleted.

21. A method of driving a transistor comprising:
a one-conductivity type semiconductor substrate formed with a projection having a pair of side walls facing each other;
a first insulation layer formed on a top of said projection;
a pair of counter-conductivity type source/drain regions formed on a surface of said semiconductor substrate at opposite sides of said projection;
second insulation layers each covering one of the pair of side walls of said projection and one of said pair of source/drain regions;
a pair of floating gates respectively formed on the pair of side walls of said projection and facing said pair of side walls and said pair of source/drain regions via respective second insulation layers;
third insulation layers each being formed on one of said pair of floating gates; and
a control gate facing said pair of floating gates via said third insulation layers and facing the top of said projection via said first insulation layer;
said method comprising the steps of:
causing said control gate, which faces the top of said projection, to control an ON/OFF state of a channel region facing said control gate; and
applying a delete voltage for overdeleting charges stored in said floating gates between said control gate and said source/drain regions to thereby overdelete said charges such that said charges decrease substantially to less than or equal to zero.

* * * * *